(12) United States Patent
McGrath et al.

(10) Patent No.: US 11,468,212 B2
(45) Date of Patent: Oct. 11, 2022

(54) TOOL AND SYSTEM FOR MEASUREMENT, DESIGN COMMUNICATION, ORDERING AND MANUFACTURE OF FLUID HANDLING SYSTEMS AND PARTS

(71) Applicant: DYME PERFORMANCE SYSTEMS, INC., West Covina, CA (US)

(72) Inventors: Brendan James McGrath, West Covina, CA (US); Timothy William Horwill, London (GB)

(73) Assignee: DYME PERFORMANCE SYSTEMS, INC., West Covina, CA (US)

( * ) Notice: Subject to any disclaimer, the term of this patent is extended or adjusted under 35 U.S.C. 154(b) by 442 days.

(21) Appl. No.: 16/777,716

(22) Filed: Jan. 30, 2020

(65) Prior Publication Data
US 2020/0250358 A1    Aug. 6, 2020

Related U.S. Application Data

(60) Provisional application No. 62/799,599, filed on Jan. 31, 2019.

(51) Int. Cl.
| | |
|---|---|
| *G01B 3/14* | (2006.01) |
| *G06F 30/17* | (2020.01) |
| *H04W 4/80* | (2018.01) |
| *G06F 3/0482* | (2013.01) |
| *F16L 11/18* | (2006.01) |

(52) U.S. Cl.
CPC .............. *G06F 30/17* (2020.01); *F16L 11/18* (2013.01); *G01B 3/14* (2013.01); *G06F 3/0482* (2013.01); *H04W 4/80* (2018.02)

(58) Field of Classification Search
CPC .................................. G01B 3/14; F16L 11/18
USPC ...................................................... 33/1 G, 562
See application file for complete search history.

(56) References Cited

U.S. PATENT DOCUMENTS

| | | | | |
|---|---|---|---|---|
| 4,593,476 A | * | 6/1986 | Clark ..................... | G01B 5/207 33/529 |
| 4,807,370 A | * | 2/1989 | Trimble .............. | F16L 27/0849 138/155 |
| 7,124,575 B1 | * | 10/2006 | Franco .................... | F01N 13/18 33/23.11 |
| 7,603,853 B1 | * | 10/2009 | Franco ................ | F01N 13/1844 166/85.1 |
| 7,856,732 B2 | * | 12/2010 | Townsend .............. | F16M 13/02 33/613 |

(Continued)

*Primary Examiner* — George B Bennett
(74) *Attorney, Agent, or Firm* — Josephine Brosas, Esq.; Lewis Brisbois Bisgaard & Smith LLP

(57) ABSTRACT

The invention relates generally to a system used to produce a prototype part and subsequently an accurate design specification for a fluid or gas handling system/hose and or tube assembly, followed by the subsequent communication of that specification into an ordering interface that processes the specification into a usable format as a means to accurately produce and re-create the original specification in a remote location by a specific manufacturing process, in order to supply the originator of the design an accurate, working part, produced in the specified materials in a rapid, convenient and cost effective manner. The process has global applications in various industries, markets and vehicle or machinery types, particularly where it is inconvenient or prohibitively expensive to have the work performed on-site by a technician.

22 Claims, 62 Drawing Sheets

(56) References Cited

U.S. PATENT DOCUMENTS

| | | | | |
|---|---|---|---|---|
| 7,992,316 B1 * | 8/2011 | Dickson | ................ | B05B 12/24 33/562 |
| 8,176,648 B2 * | 5/2012 | Bradley | ............. | E04G 21/1883 33/562 |
| 8,533,927 B2 * | 9/2013 | Atherton | ............... | G09B 25/04 33/562 |
| 8,904,652 B2 * | 12/2014 | Derkach | ............... | G01C 15/04 33/1 G |
| 9,234,727 B2 * | 1/2016 | Mitchell | ............ | F42C 19/0807 |
| 2012/0186188 A1 * | 7/2012 | Edinger | ............... | E04H 1/1272 33/562 |
| 2012/0216734 A1 * | 8/2012 | Platt | ........................ | A41H 3/01 112/475.08 |

* cited by examiner

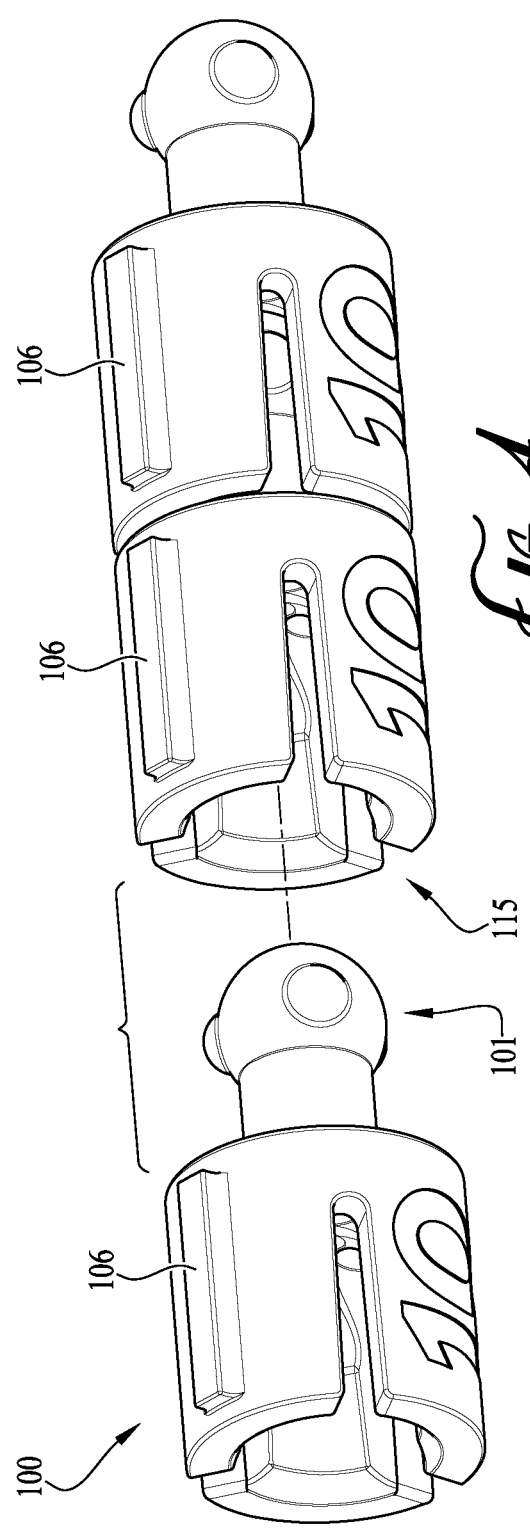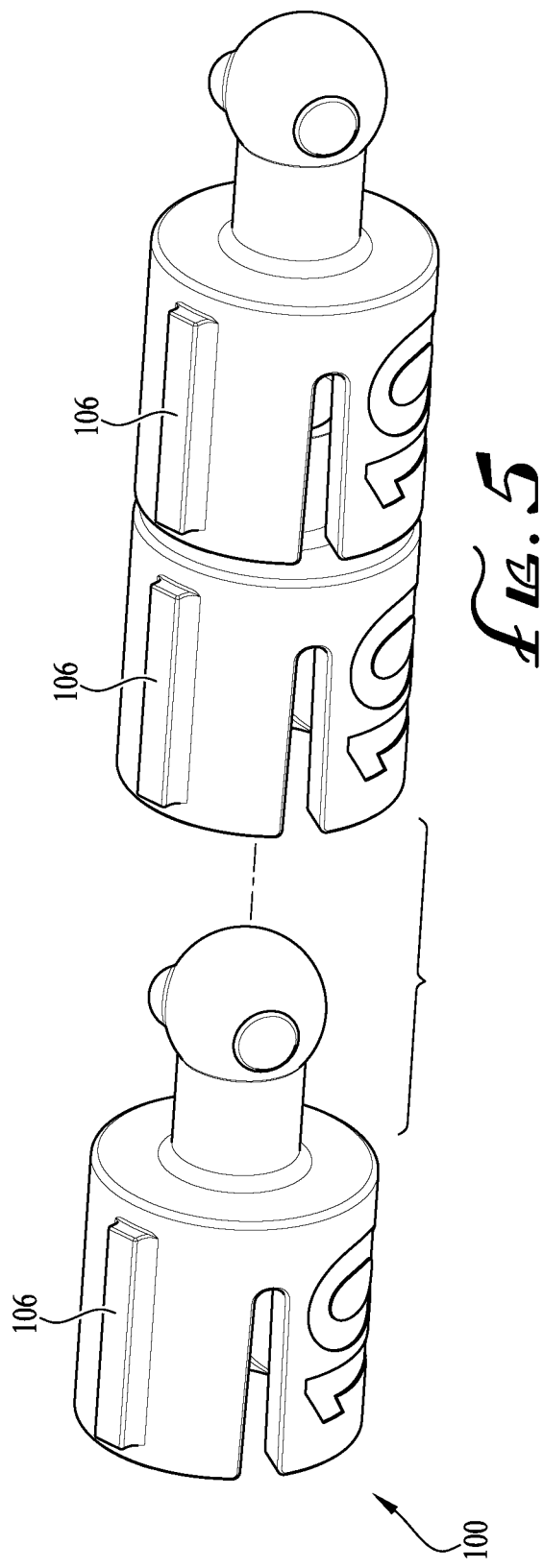

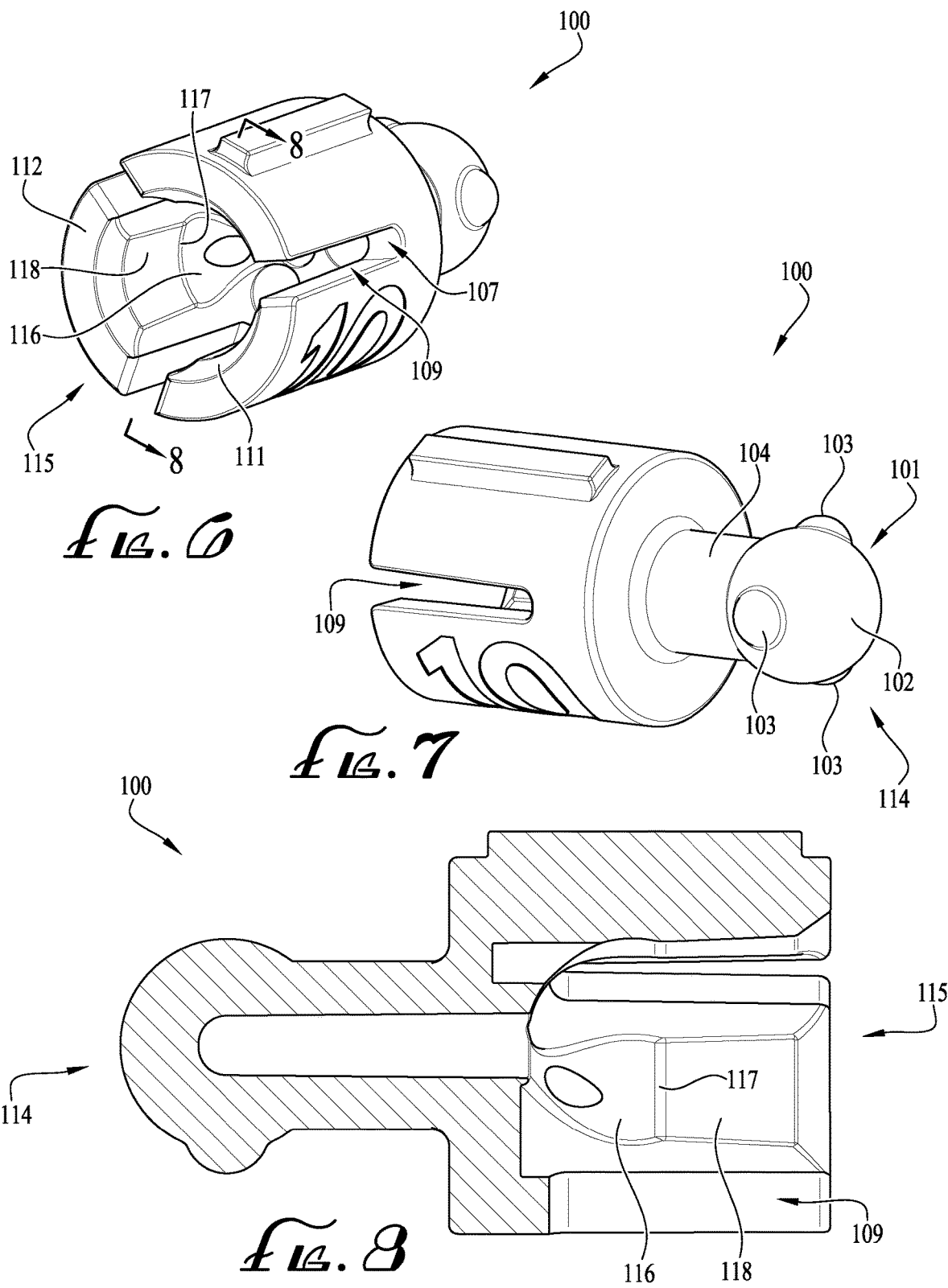

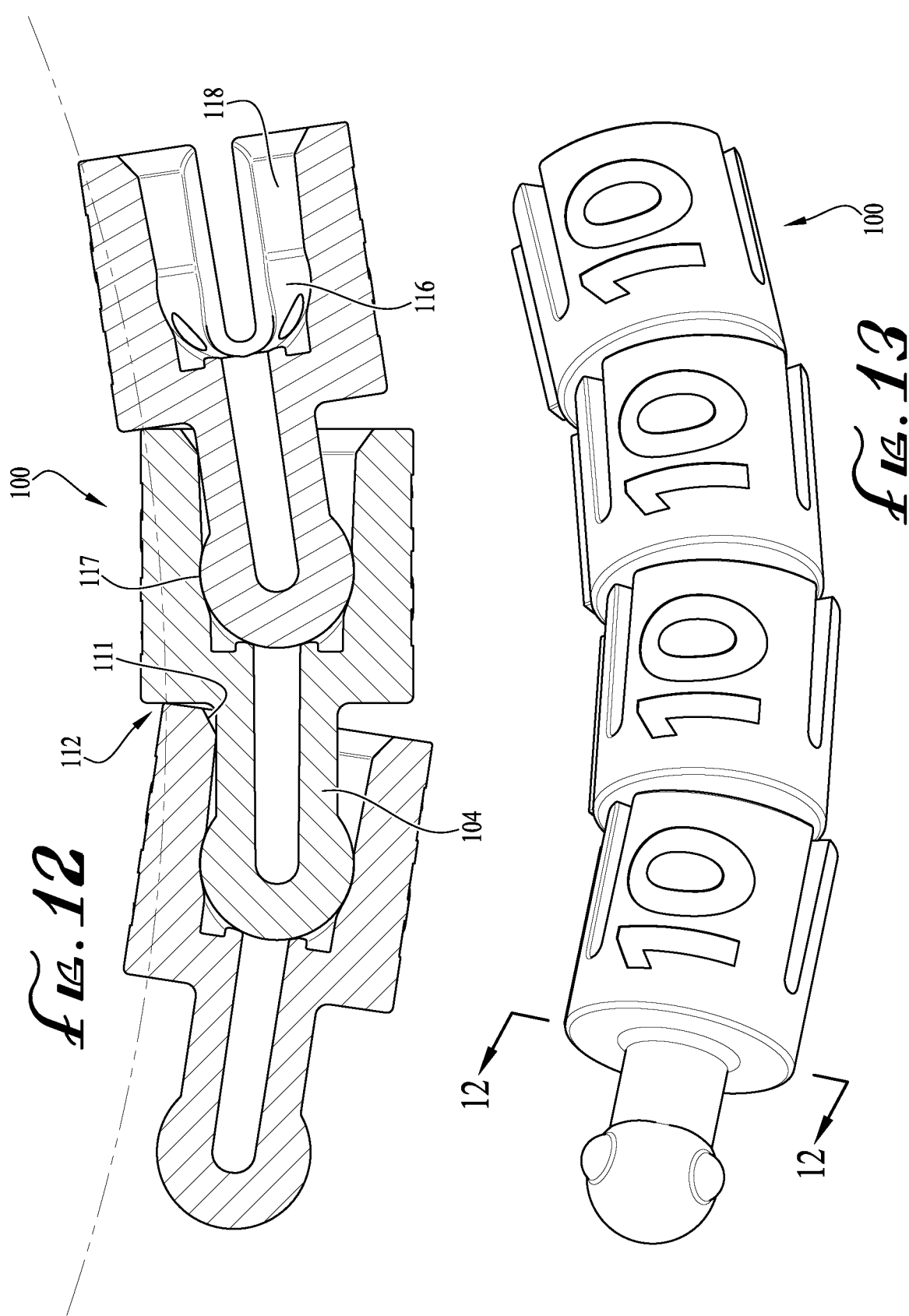

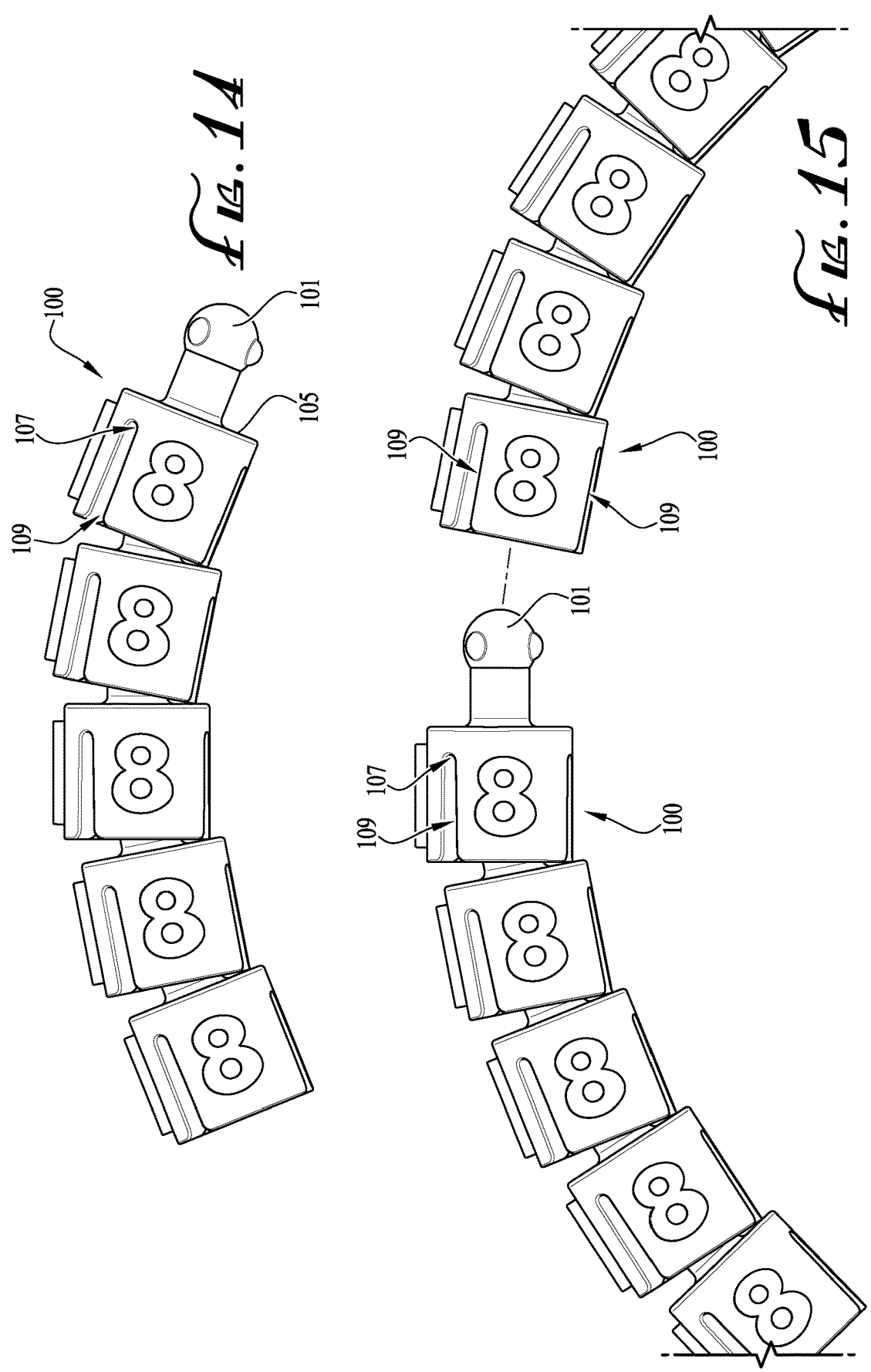

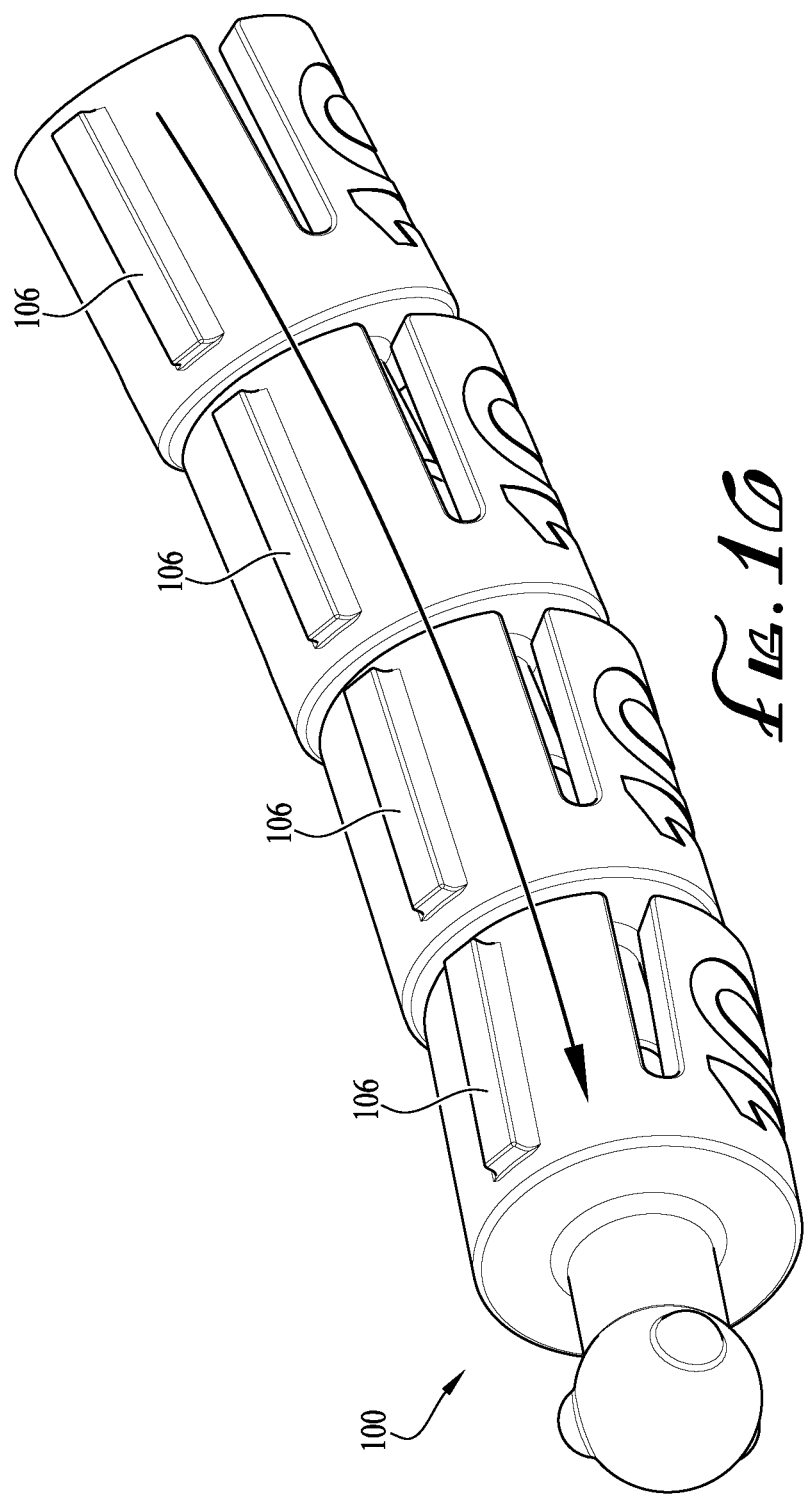

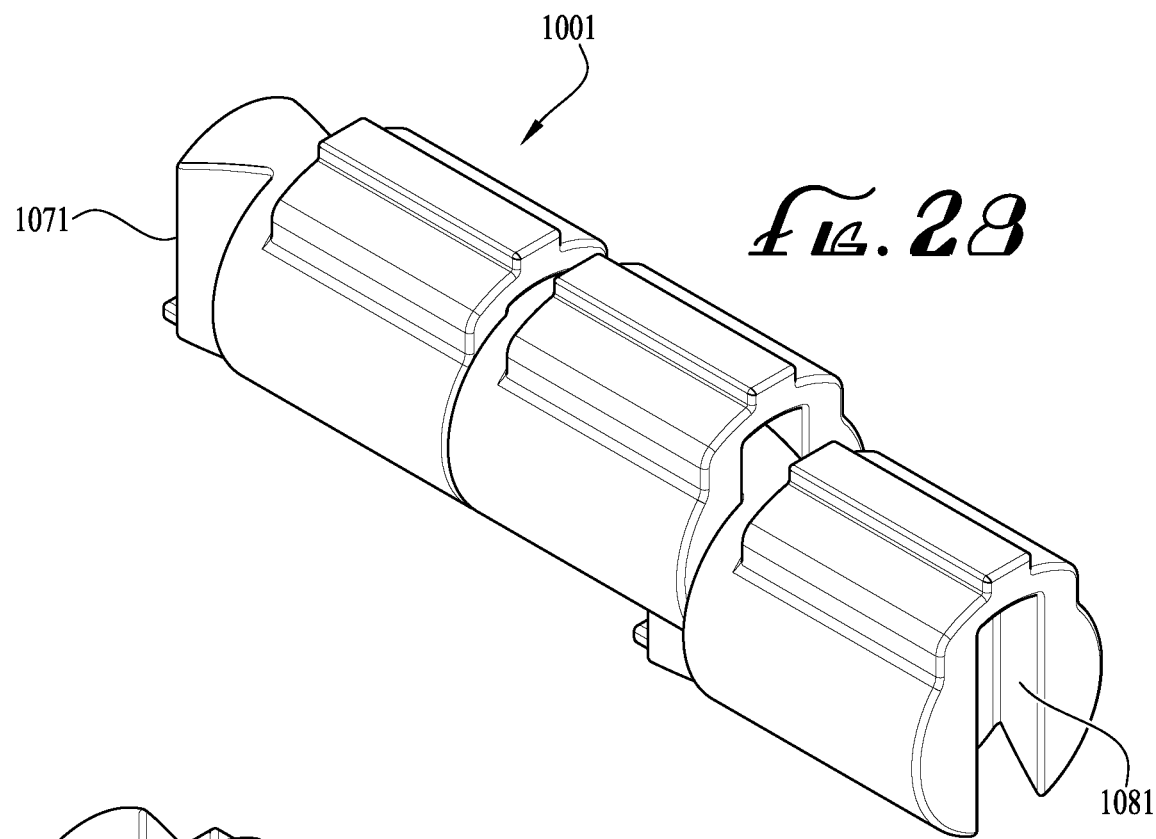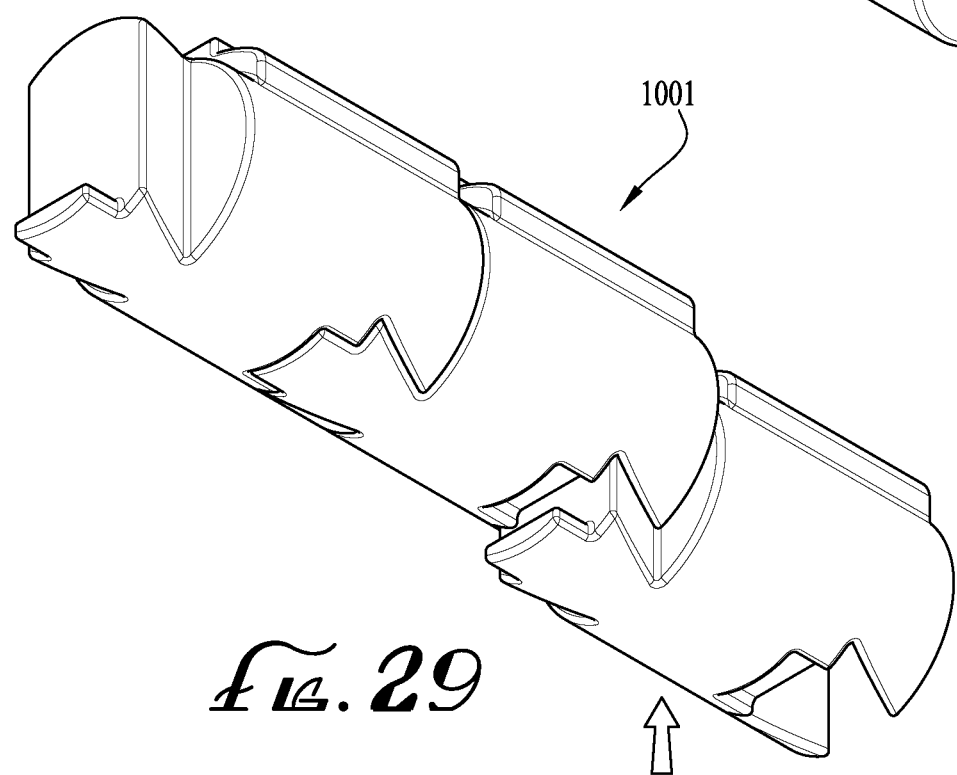

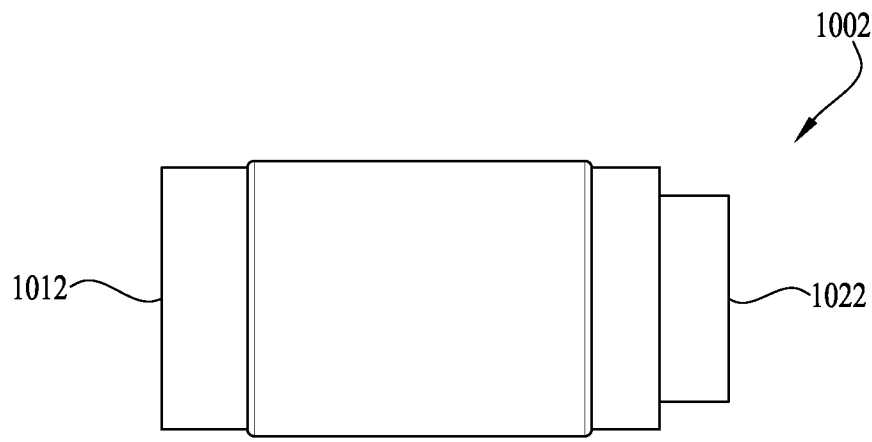
FIG. 33
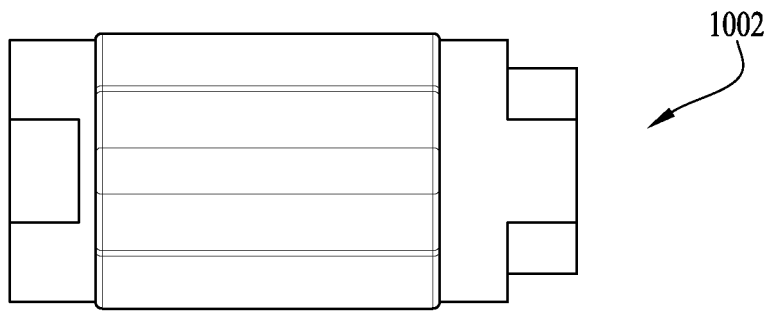
FIG. 34
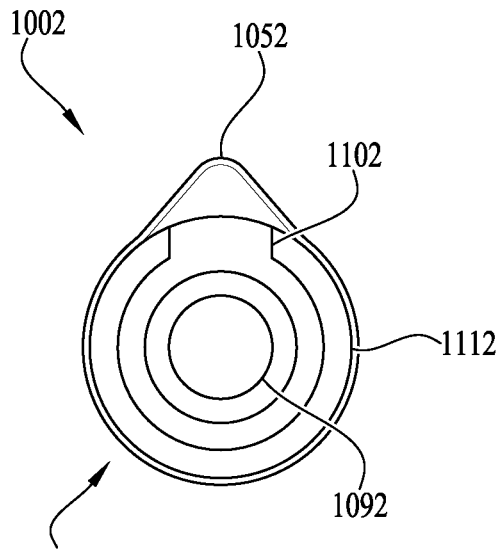 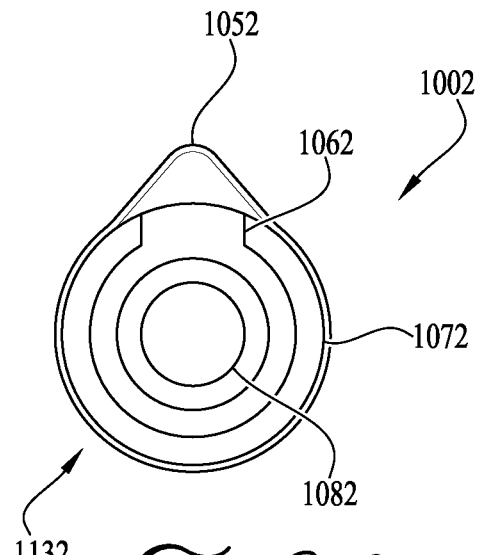
FIG. 35  FIG. 36

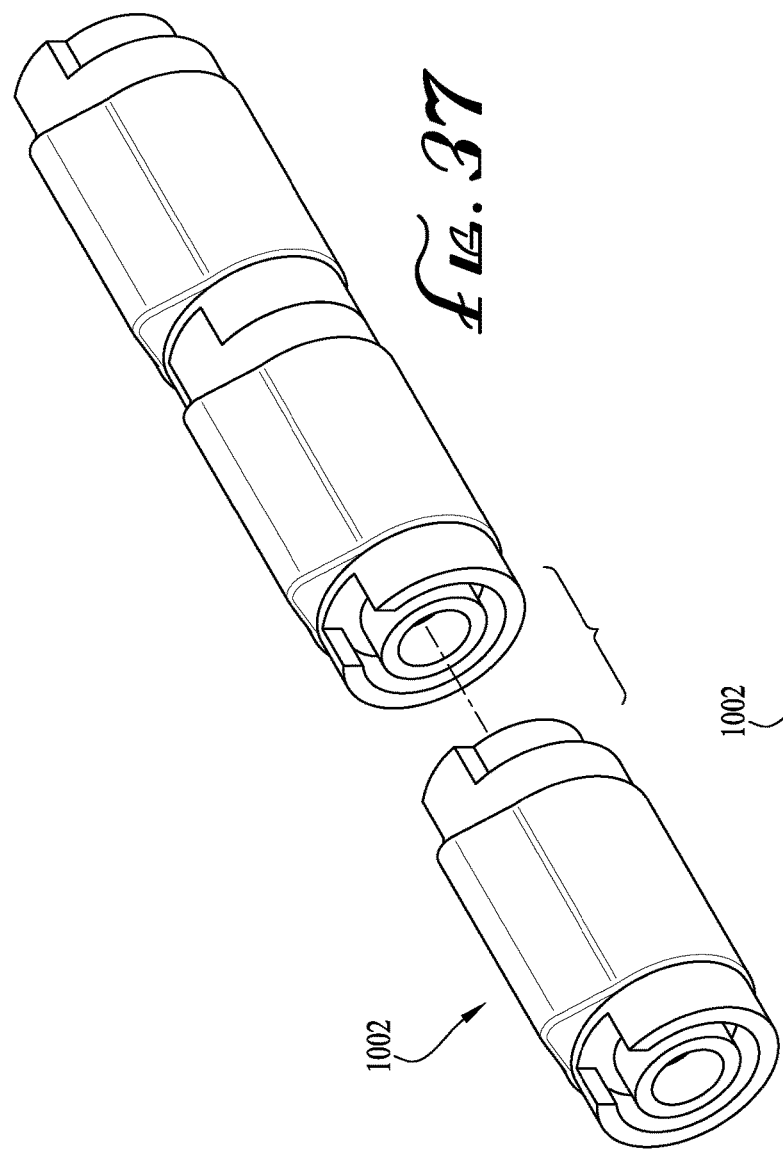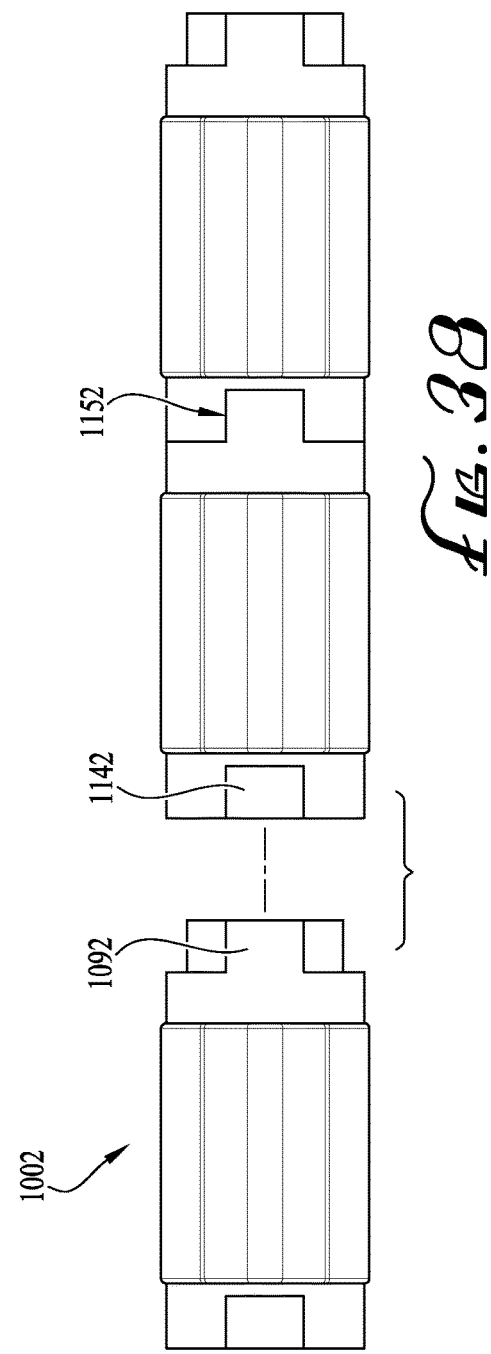

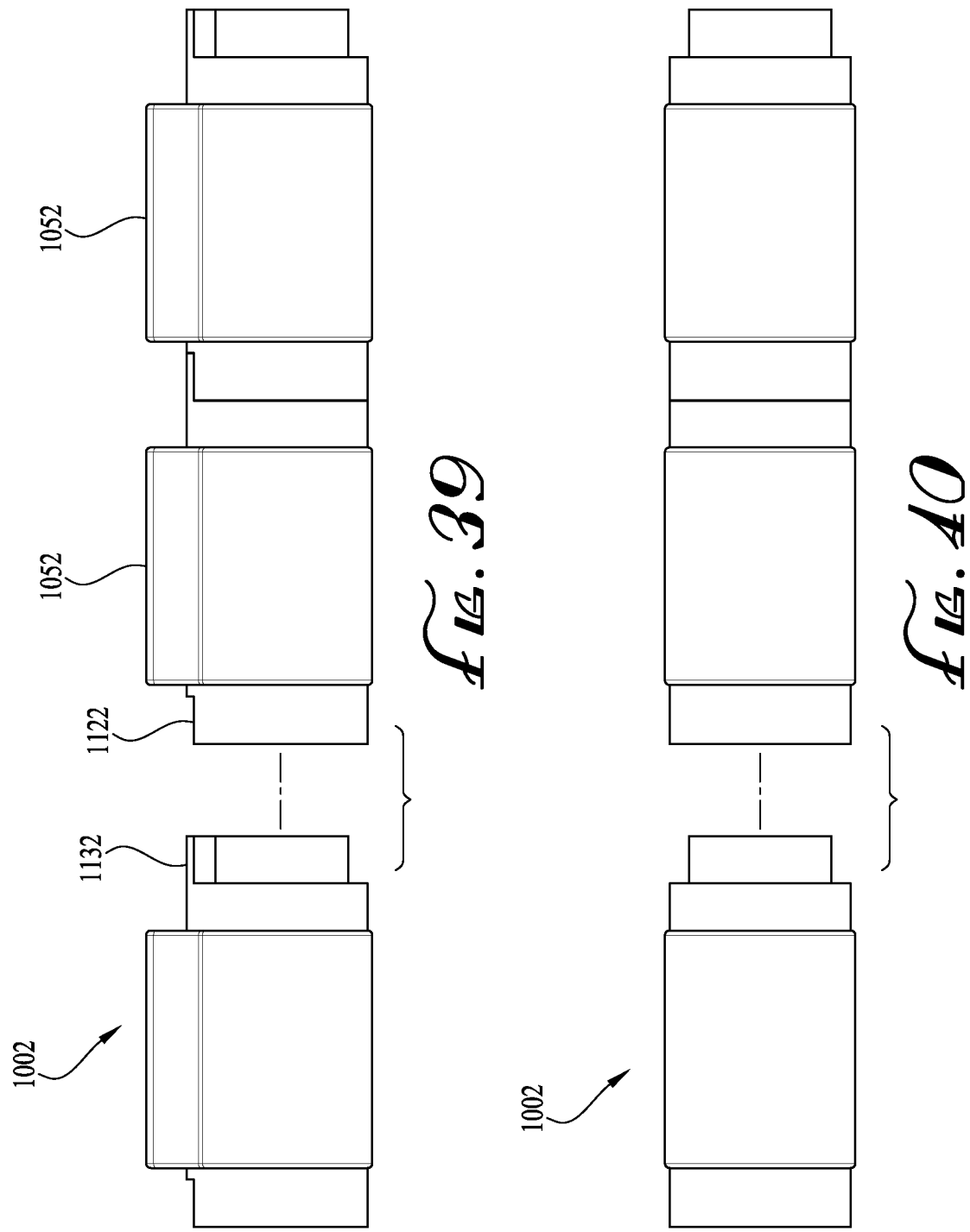

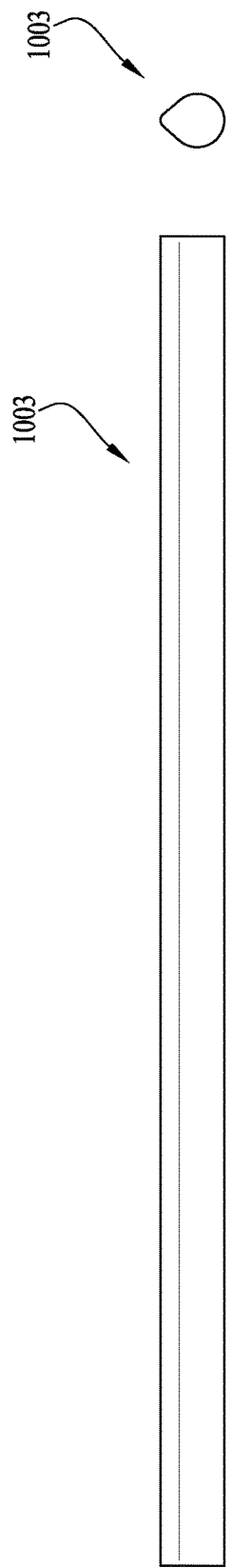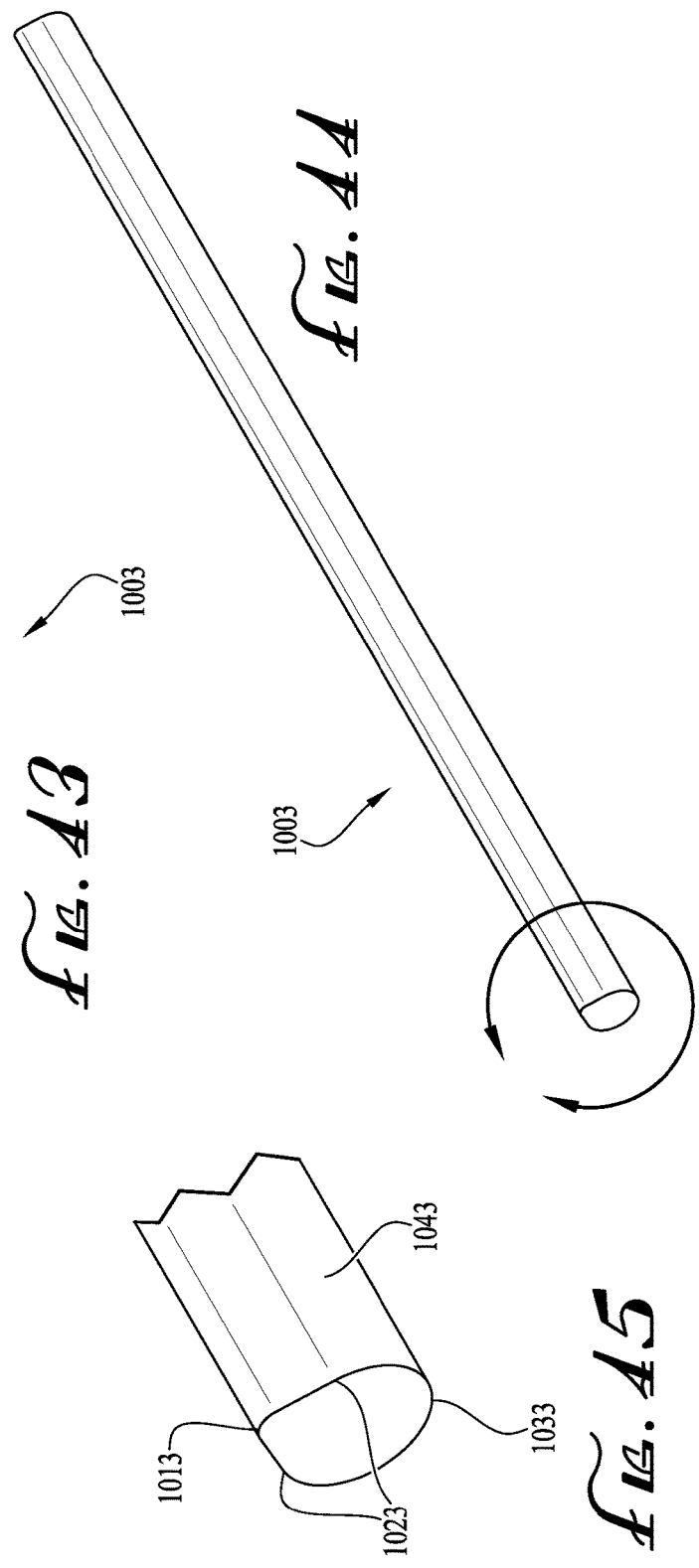

| Hose Trade Name | Color | Construction | Available Sizes |
|---|---|---|---|
| Superleggera | Blue | Convoluted PTFE & Aramid Braid | -04, -06, -10, -12, -16 |
| Race Ultra | Red | Convoluted PTFE & Stainless Steel Braid | -04, -06, -10, -12, -16 |
| Hypersport | Yellow | Smoothbore PTFE & Stainless Steel Braid | -02, -03 |
| MIL Spec AR | Green | Convoluted PTFE & Aramid Braid & Steel Helix | -06, -10, -12, -16, -20 |
| MIL Spec SS | Green | Convoluted PTFE & Stainless Steel Braid & Steel Helix | -06, -10, -12, -16, -20 |
| Critical Mass | Pink | Convoluted PTFE & PPS Braid | -04, -06, -10, -12, -16 |
| Heavyweight | Grey | Smoothbore PTFE & Stainless Steel Braid | -04, -06, -10, -12, -16 |

Fig. 46

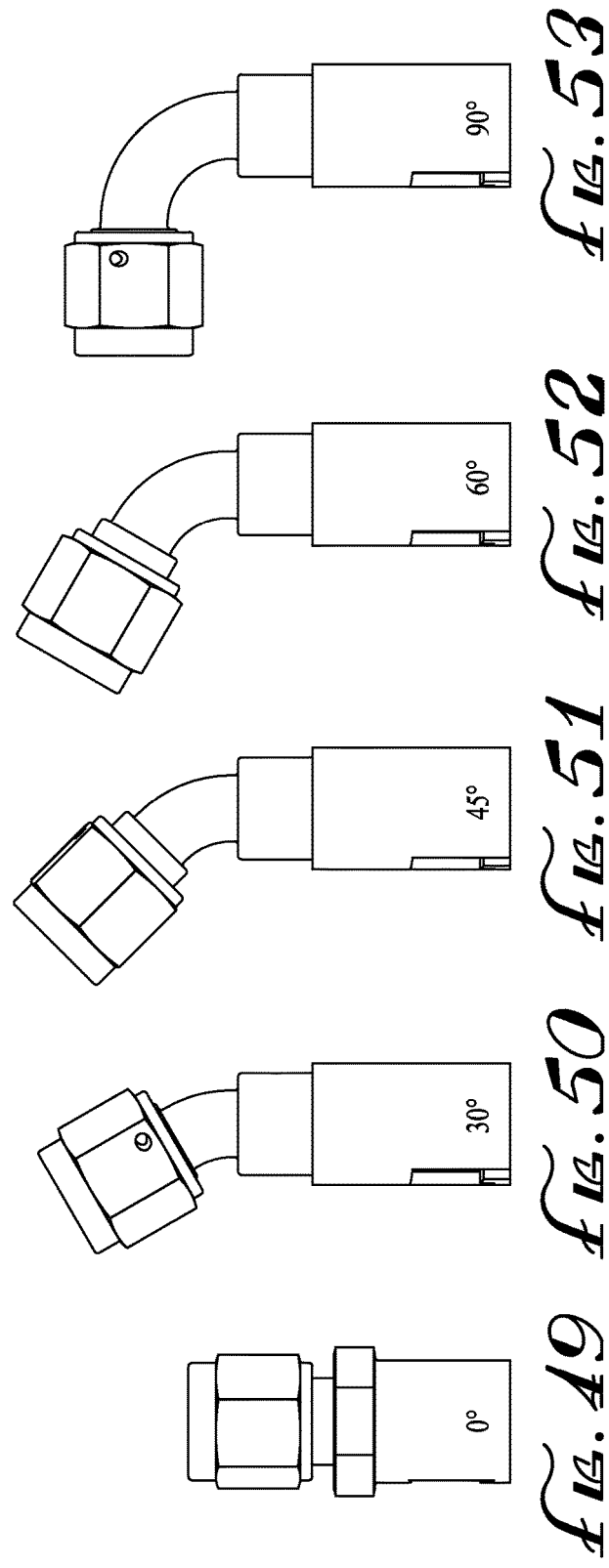
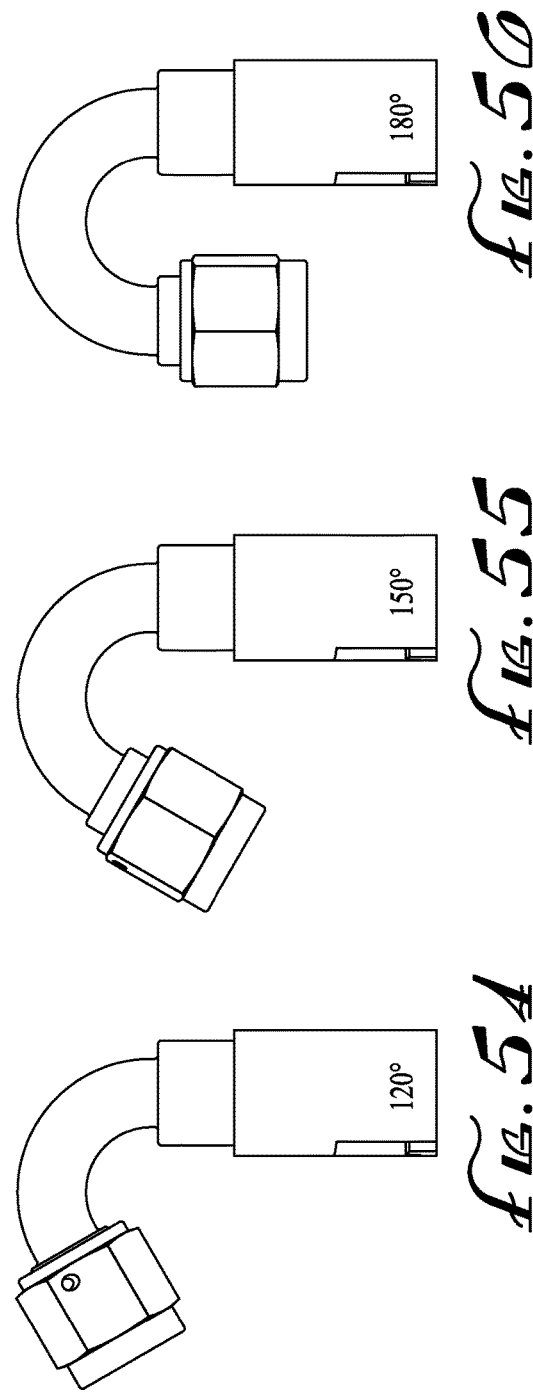

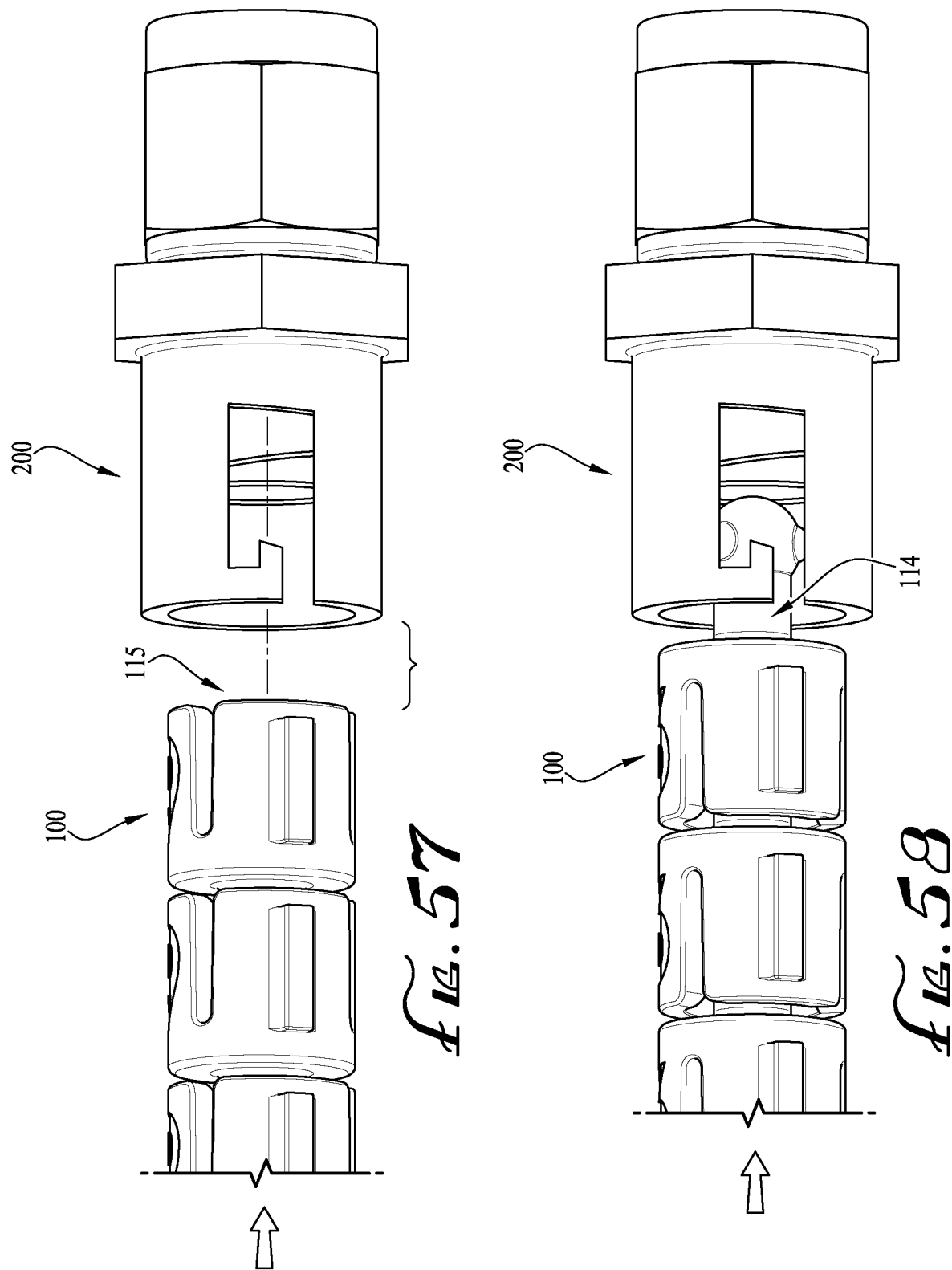

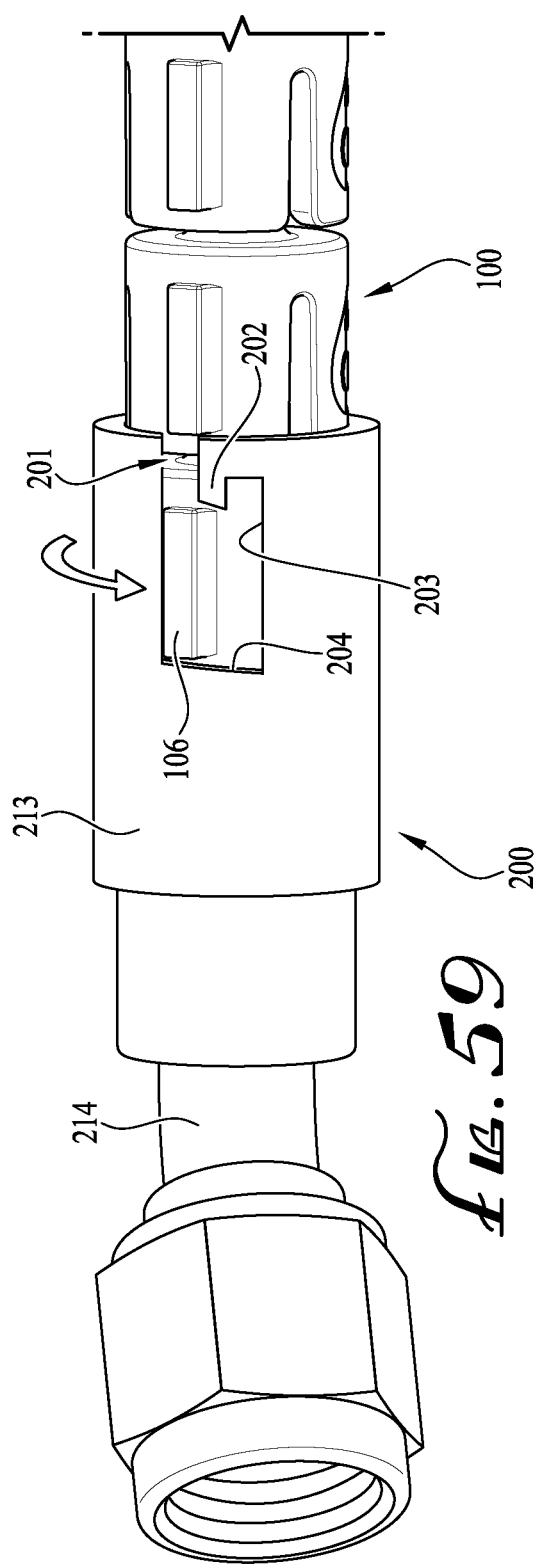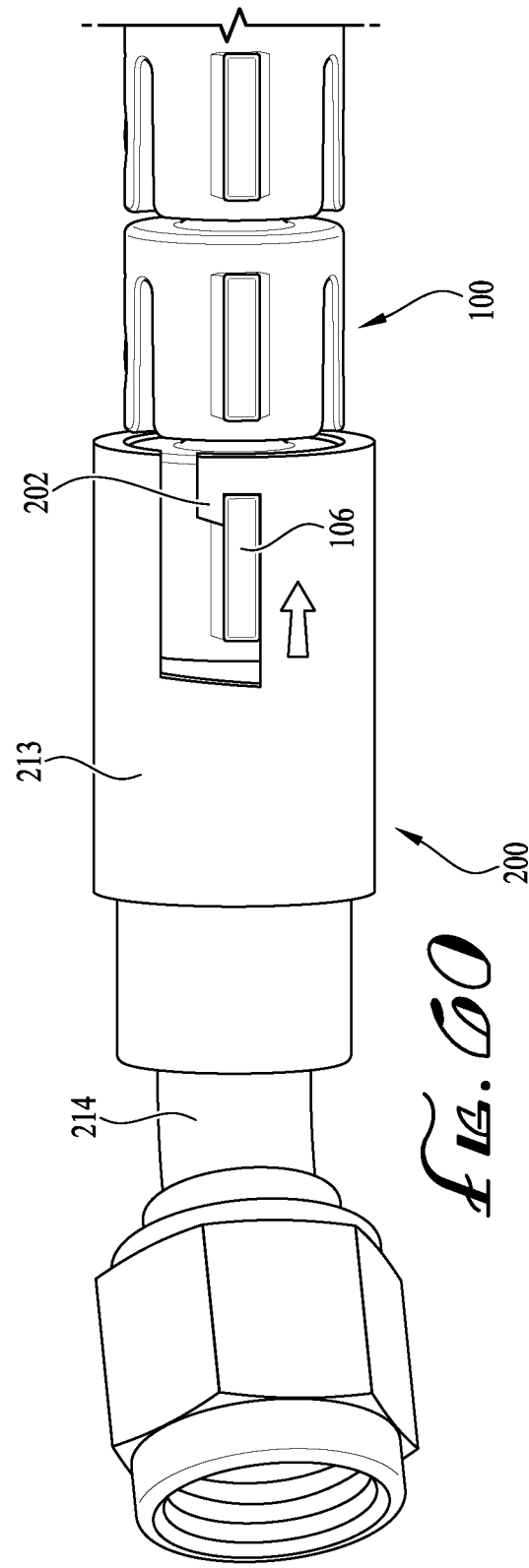

| Size | Connection Types | Angle Types (Tube) | Angle Types (Forged) |
|---|---|---|---|
| -2 | AN/JIC, Banjo | Straight, 30, 45, 60, 90, 120, 150, 180 degree | 45, 90 degree |
| -3 | AN/JIC, Banjo | Straight, 30, 45, 60, 90, 120, 150, 180 degree | 45, 90 degree |
| -4 | AN/JIC | Straight, 30, 45, 60, 90, 120, 150, 180 degree | 45, 90 degree |
| -6 | AN/JIC | Straight, 30, 45, 60, 90, 120, 150, 180 degree | 45, 90 degree |
| -8 | AN/JIC | Straight, 30, 45, 60, 90, 120, 150, 180 degree | 45, 90 degree |
| -10 | AN/JIC | Straight, 30, 45, 60, 90, 120, 150, 180 degree | 45, 90 degree |
| -12 | AN/JIC | Straight, 30, 45, 60, 90, 120, 150, 180 degree | 45, 90 degree |
| -16 | AN/JIC | Straight, 30, 45, 60, 90, 120, 150, 180 degree | 45, 90 degree |
| -20 | AN/JIC | Straight, 30, 45, 60, 90, 120, 150, 180 degree | 45, 90 degree |

Fig. 61

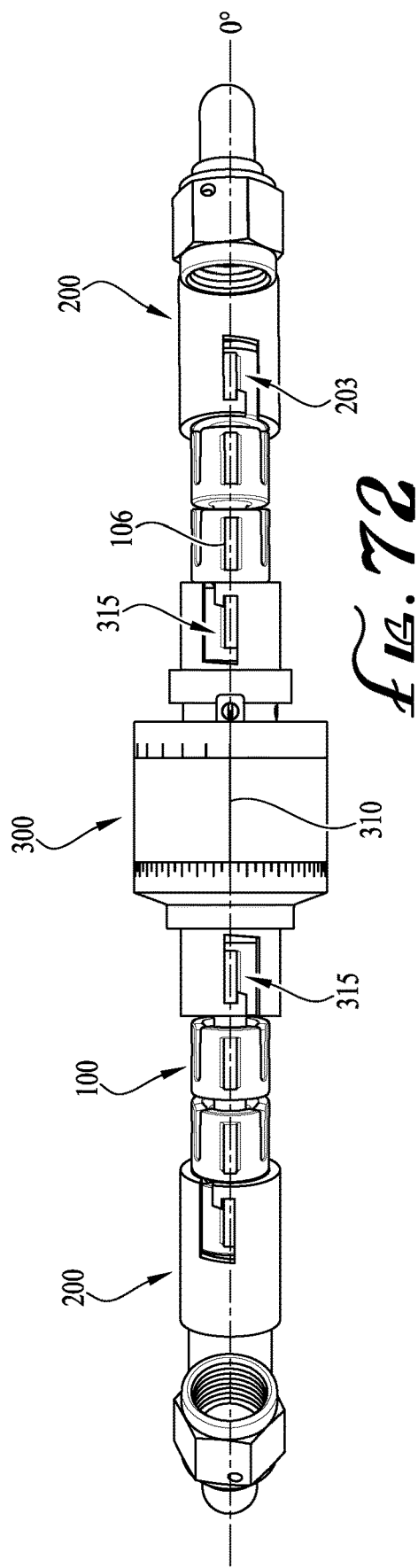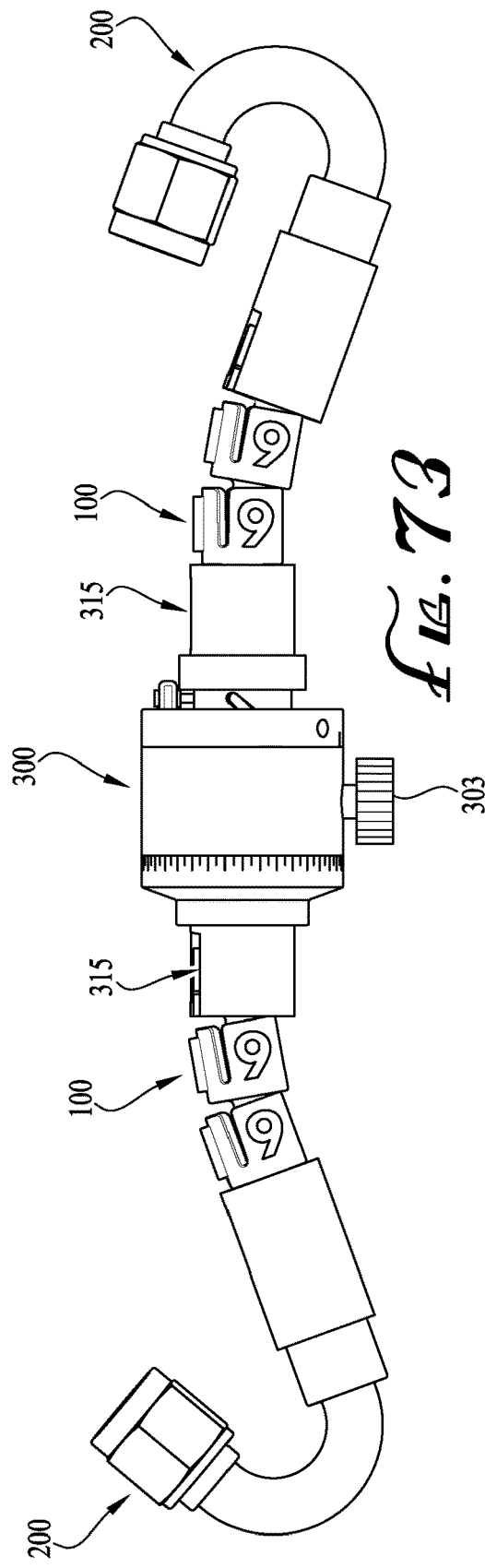

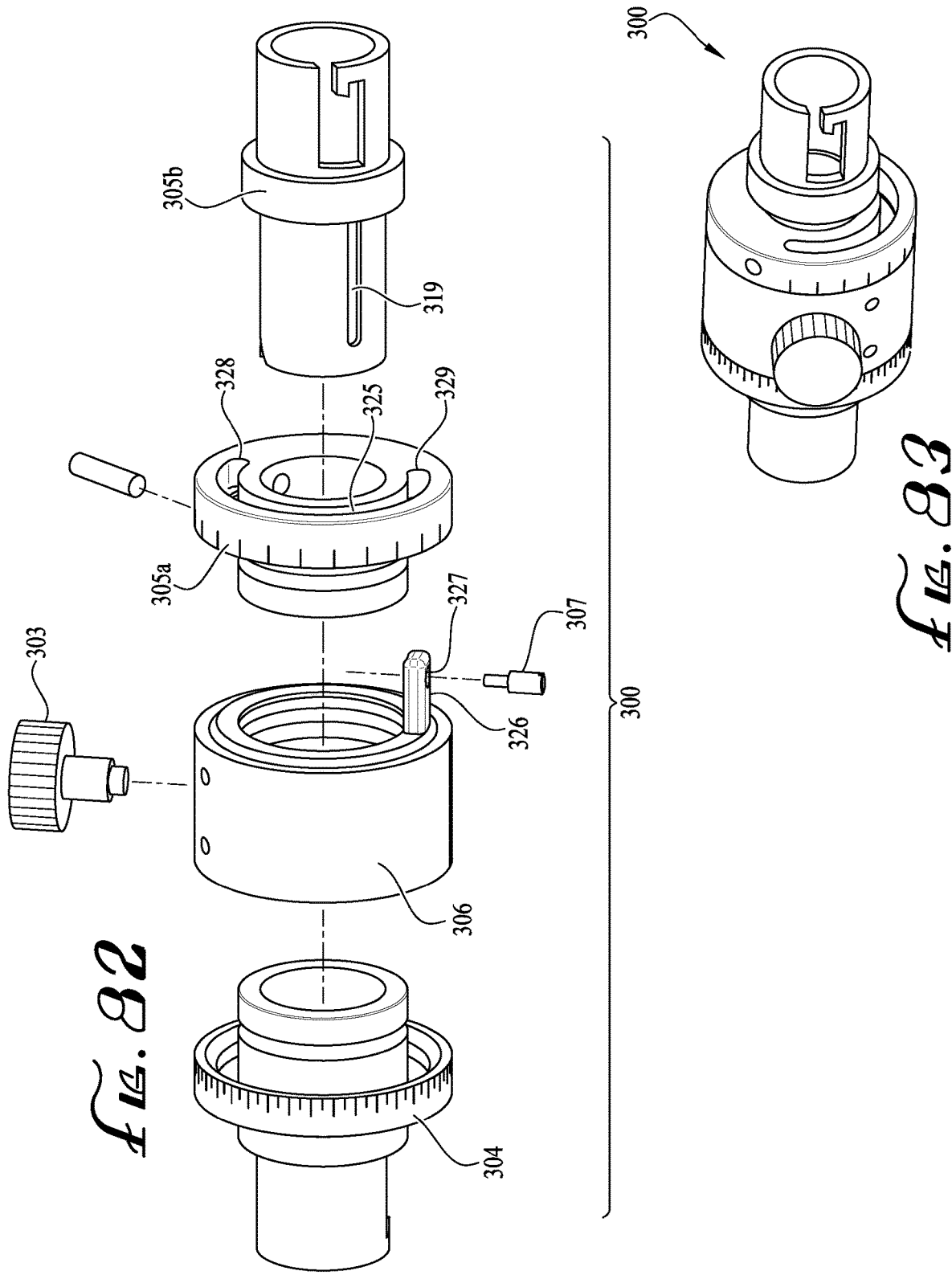

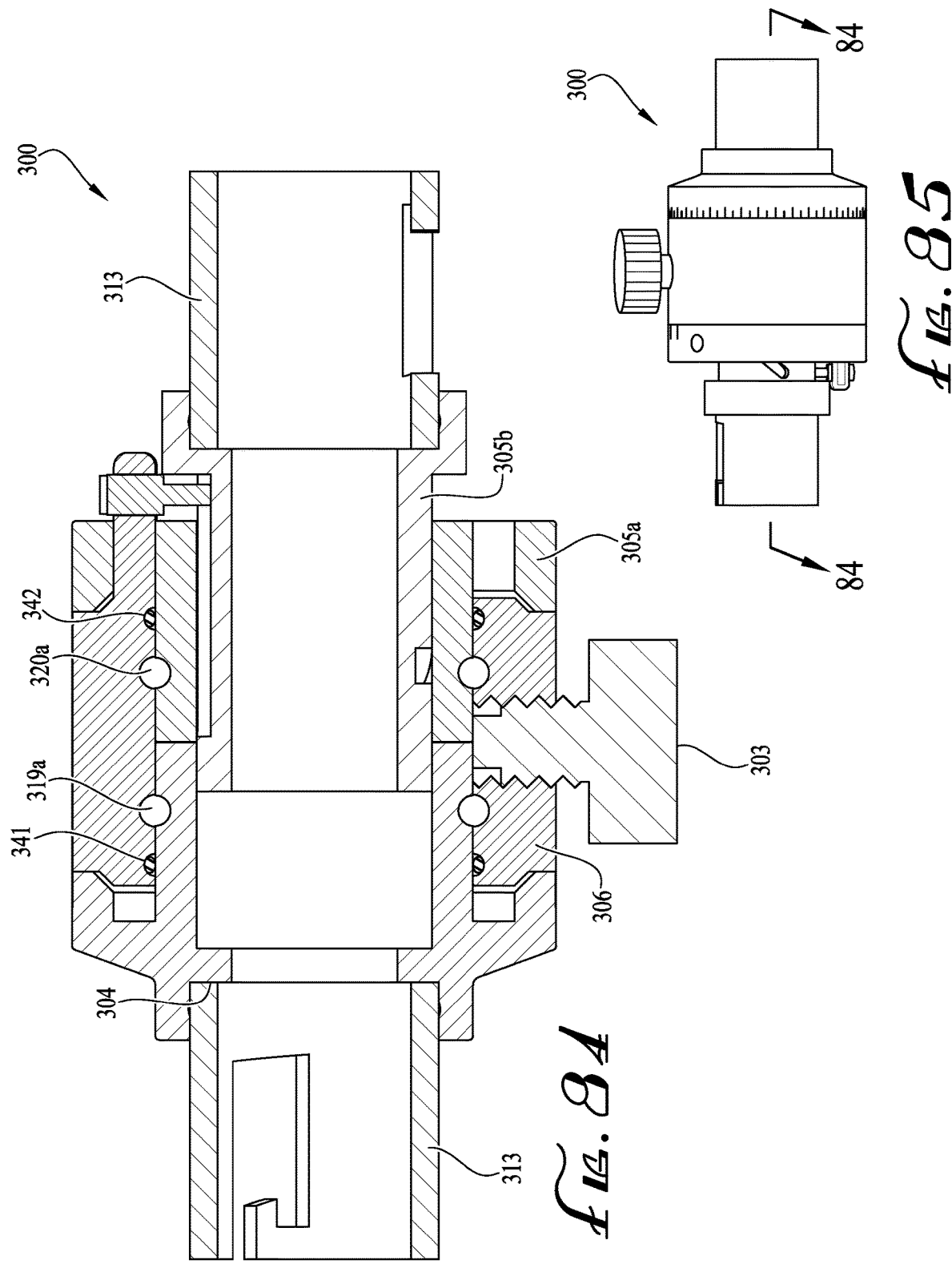

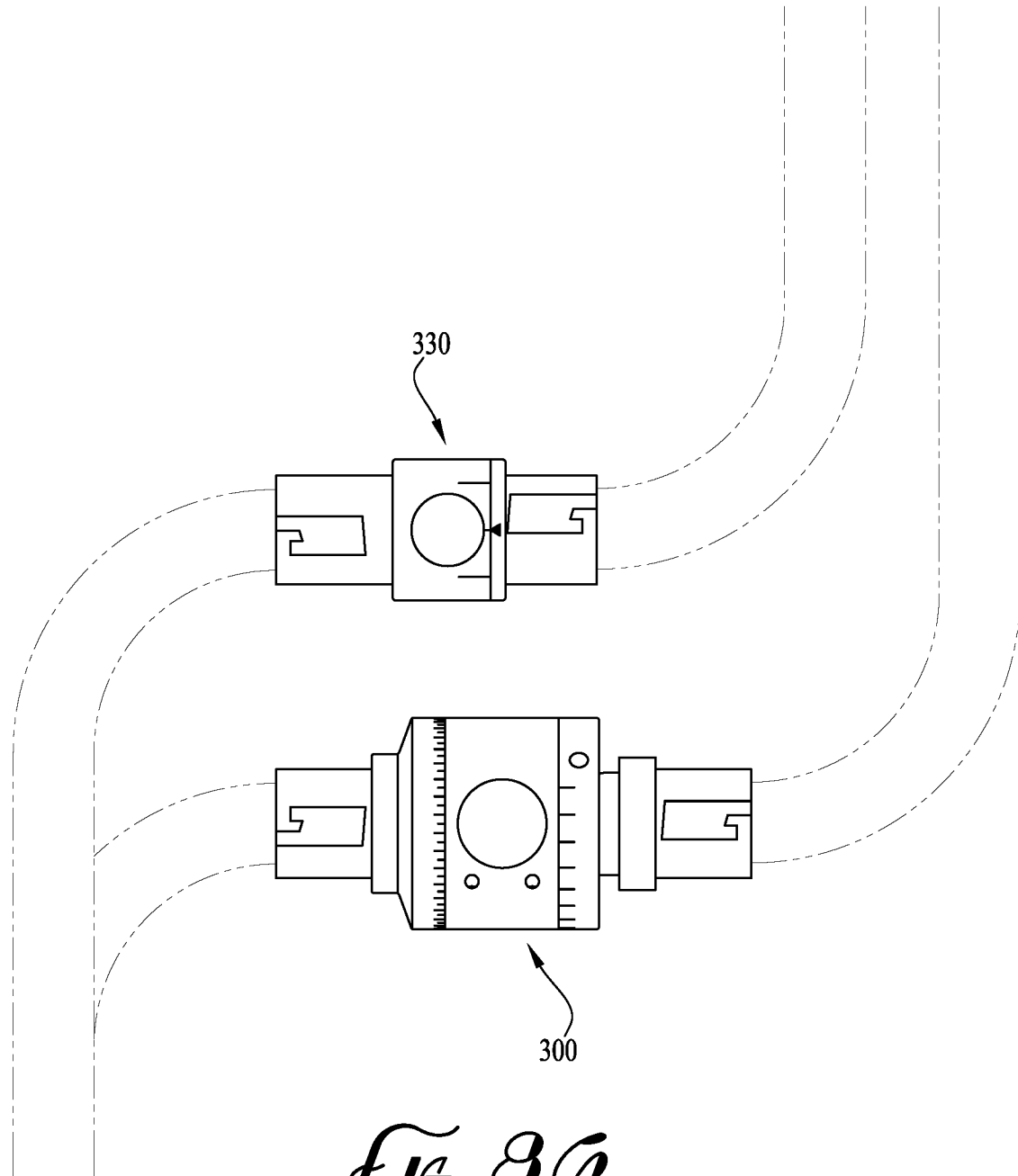

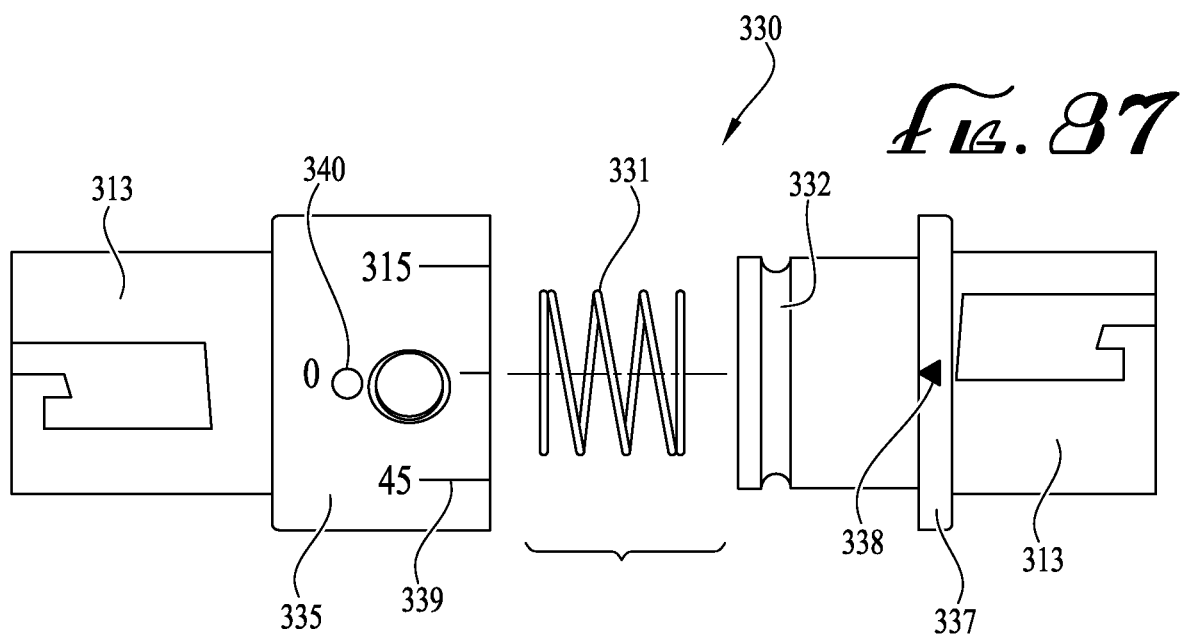
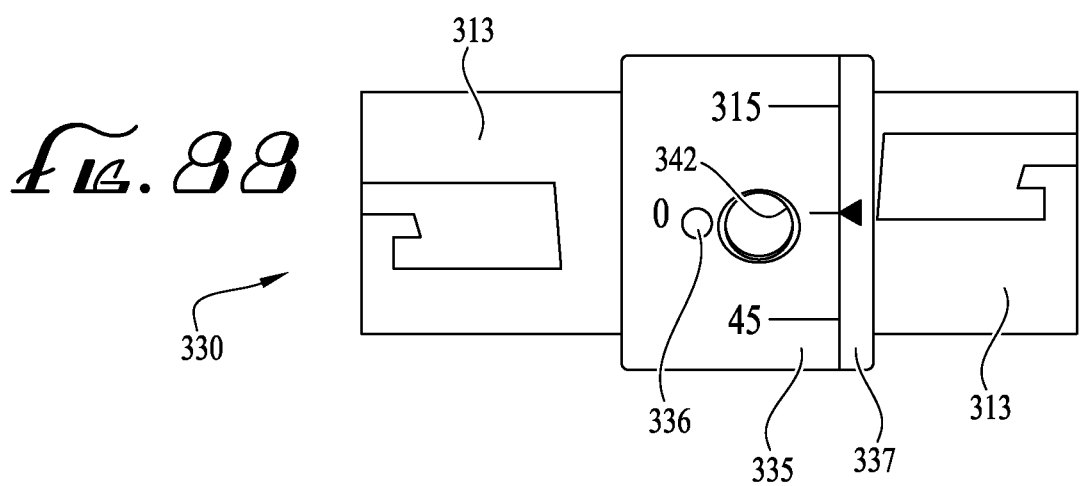
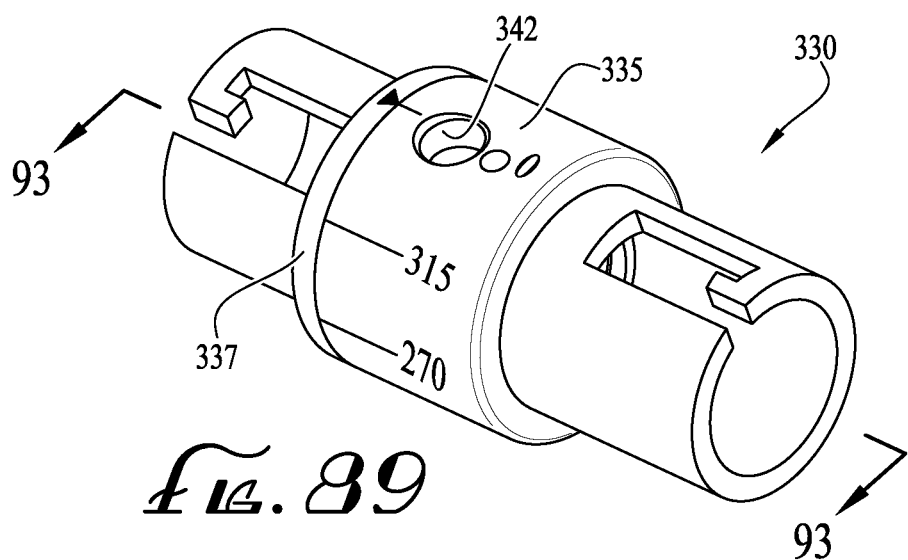

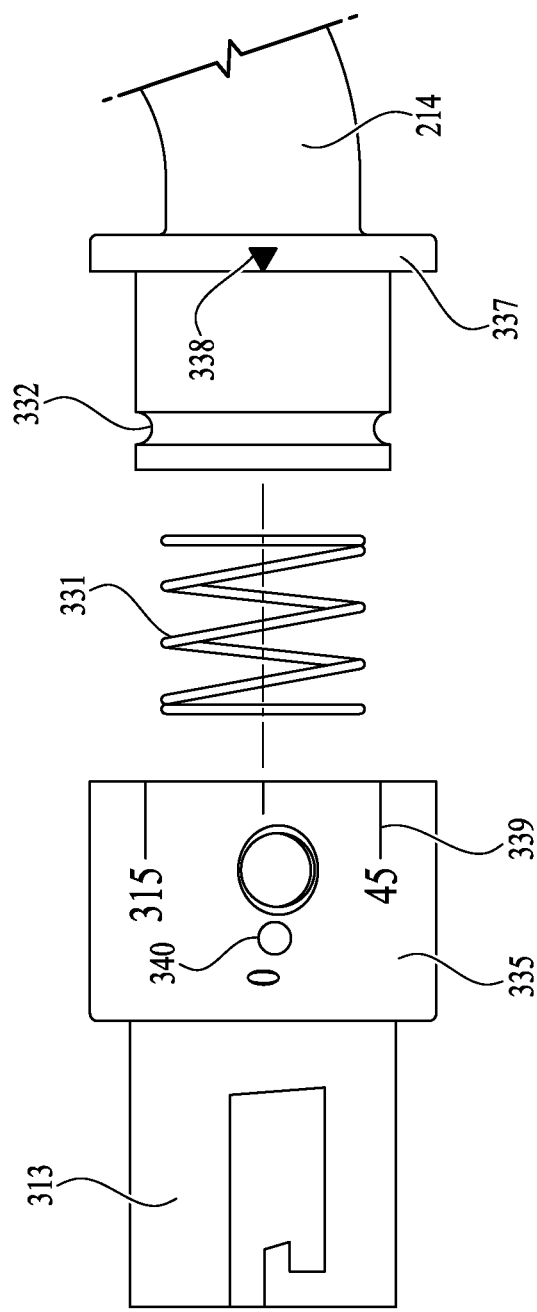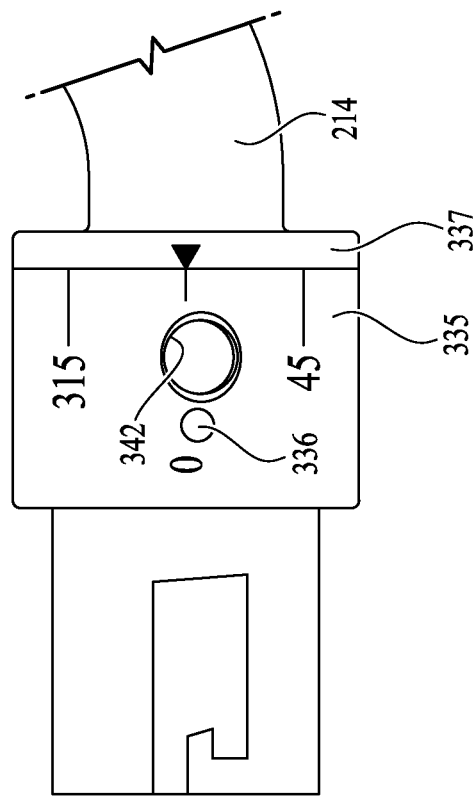

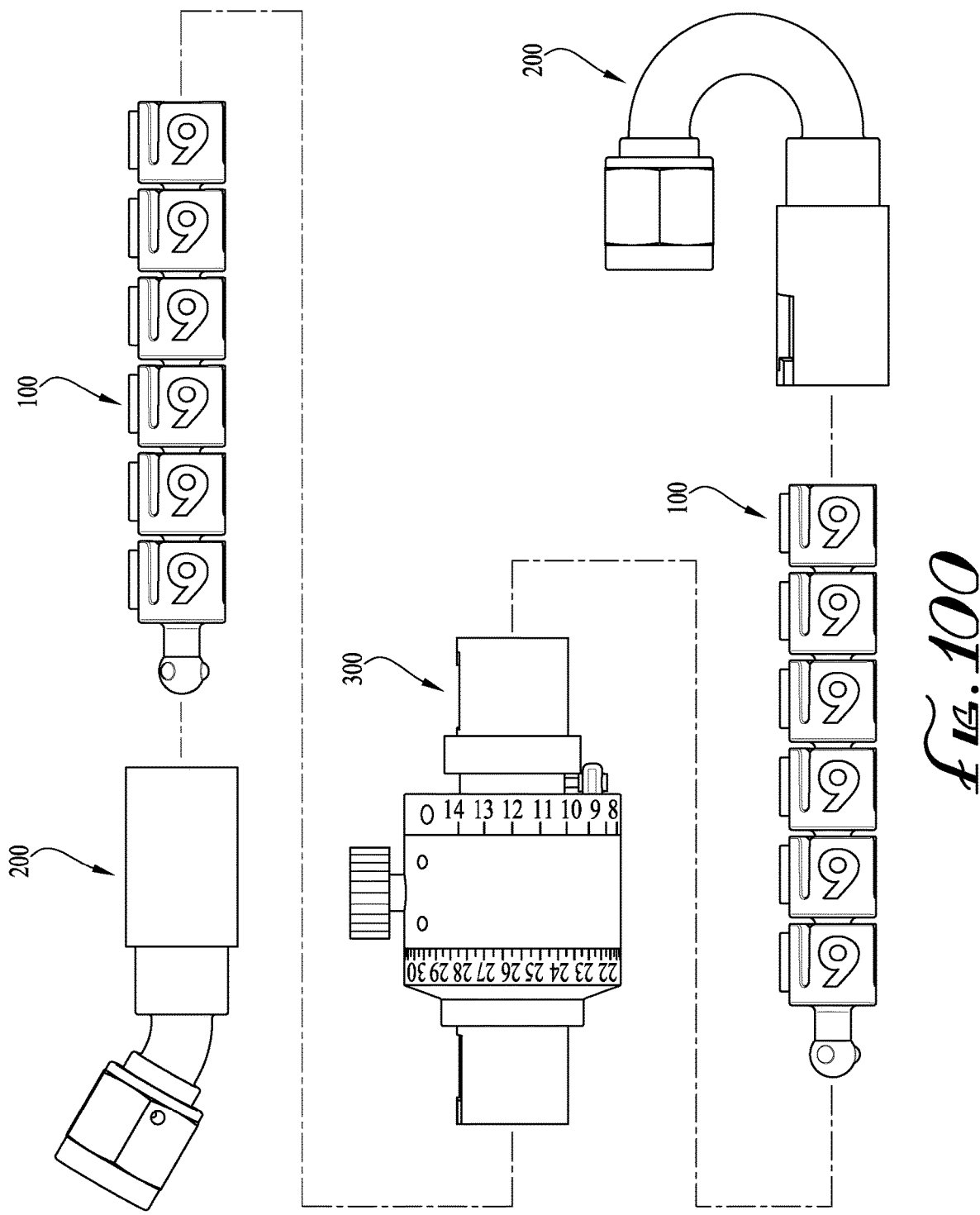

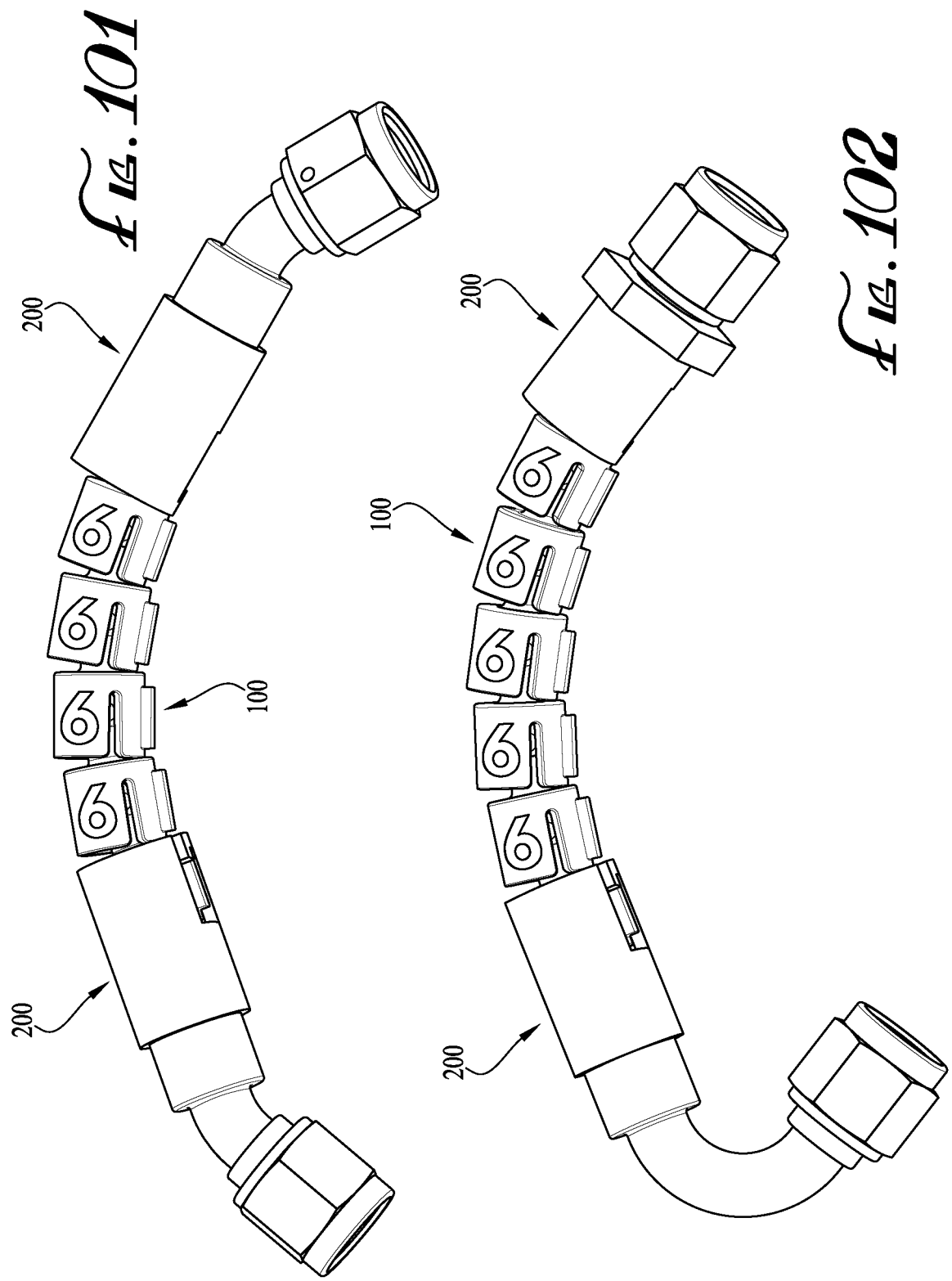

| Component | Characteristic | Measurement |
|---|---|---|
| 100 | Segment Type | Superleggera (Blue) |
| 100 | Segment Size | 6 |
| 100 | Segment Count | 8 |
| 200 | Fitting 1 | 180 Degree |
| 200 | Fitting 2 | 150 Degree |
| 300 | Relative Angle | 295 Degree |
| 300 | Fine Adjustment | 7mm |

FIG. 109

| Component | Characteristic | Measurement/ID | Standard | Unit | Result | Total Material | Assembly Instructions |
|---|---|---|---|---|---|---|---|
| 100 | Segment Type (color) | Blue | Part Number | NA | SL06 | | Cut to length, 178mm of part number SL06, Superleggera type hose size 6. |
| 100 | Segment Size (marking) | 6 | | mm | 116 | | |
| 100 | Segment Count (number) | 8 | 14.5 | mm | 55 | | |
| 300 | Relative Angle (degrees) | 295 Degree | 55 | mm | 7 | | Assemble 295 degrees relative to one another |
| 300 | Fine Adjustment (mm) | 7 | 1 | | | | |
| 200 | Fitting 1 (degrees) | 180 Degree | Part Number | Part Number | 06-180 | 1 | |
| 200 | Fitting 2 (degrees) | 150 Degree | Part Number | Part Number | 06-150 | 1 | |

Fig. 110

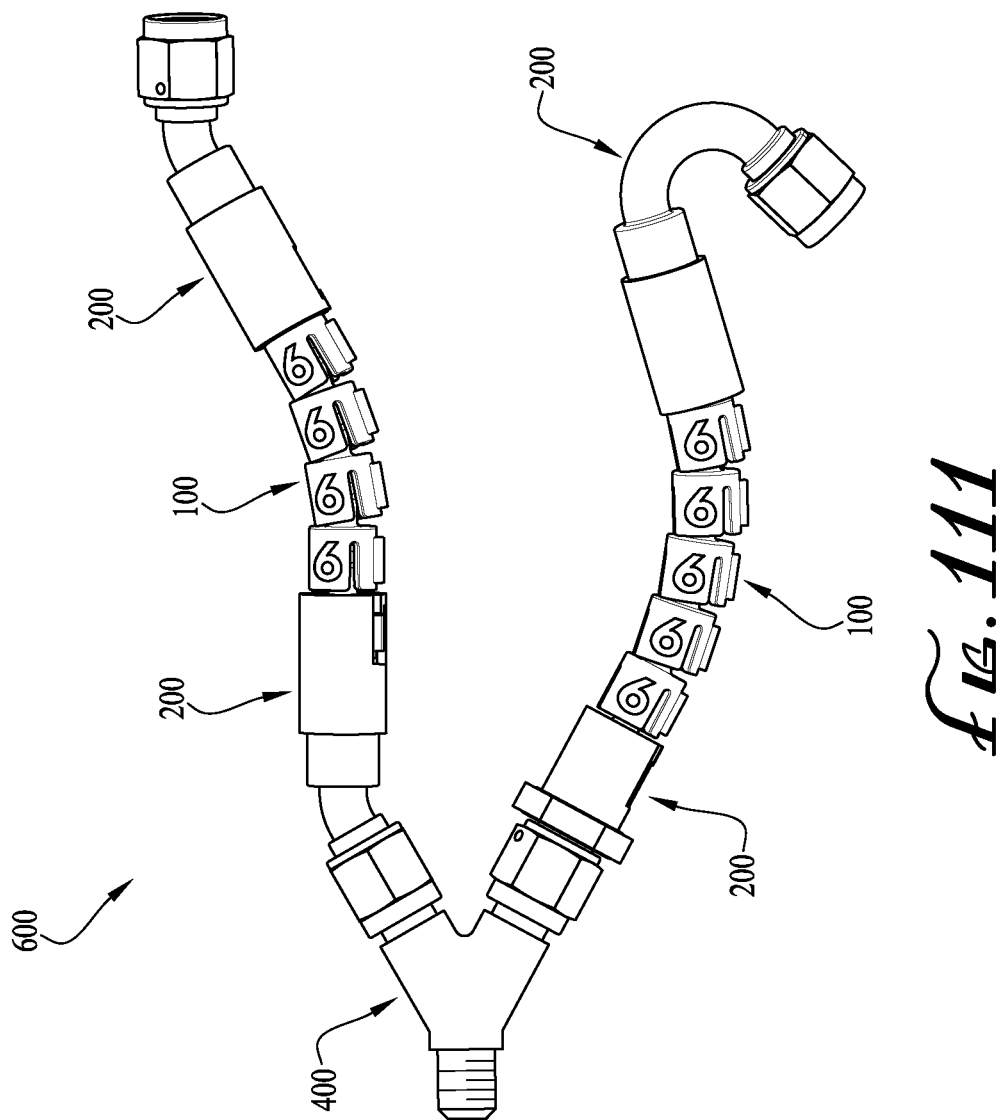

| Assem. ID | Line ID | Component | Characteristic | Measurement/ID | Standard | Unit | Result | Total Material | Assembly Instructions |
|---|---|---|---|---|---|---|---|---|---|
| 602 | 602 | 100 | Segment Type (color) | Blue | Part Number | NA | SL06 | | Cut to length, 178mm of part number SL06, Superleggera type hose size 6. |
| | | 100 | Segment Size (marking) | 6 | | | | 236 | |
| | | 100 | Segment Count (number) | 12 | 14.5 | mm | 174 | | |
| | | 300 | Relative Angle (degrees) | 180 Degree | 55 | mm | 55 | | |
| | | 300 | Fine Adjustment (mm) | 7 | 1 | mm | 7 | | |
| | | 200 | Fitting 1 (degrees) | 180 Degree | | EA | 06-180 | 1 | Assemble 295 degrees relative to one another |
| | | 200 | Fitting 2 (degrees) | 45 Degree | | EA | 06-045 | 1 | |
| | | Component | Characteristic | Measurement/ID | Standard | Unit | Result | Total Material | Assembly Instructions |
| | 604 | 100 | Segment Type (color) | Blue | Part Number | NA | SL06 | | Cut to length, 178mm of part number SL06, Superleggera type hose size 6. |
| | | 100 | Segment Size (marking) | 6 | | | | 116 | |
| | | 100 | Segment Count (number) | 8 | 14.5 | mm | 116 | | |
| | | 300 | Relative Angle (degrees) | NA | 0 | mm | 0 | | |
| | | 300 | Fine Adjustment (mm) | NA | 1 | mm | 0 | | |
| | | 200 | Fitting 1 (degrees) | 150 Degree | Part Number | EA | 06-150 | 1 | Assemble 295 degrees relative to one another |
| | | 200 | Fitting 2 (degrees) | 0 Degree | Part Number | EA | 06-000 | 1 | |
| | | Component | Characteristic | Measurement/ID | Standard | Unit | Result | Total Material | Assembly Instructions |
| | 400 | 400 | Accessory | 1 | Part Number | EA | 06-Y06 | 1 | Blue |

Fig. 114

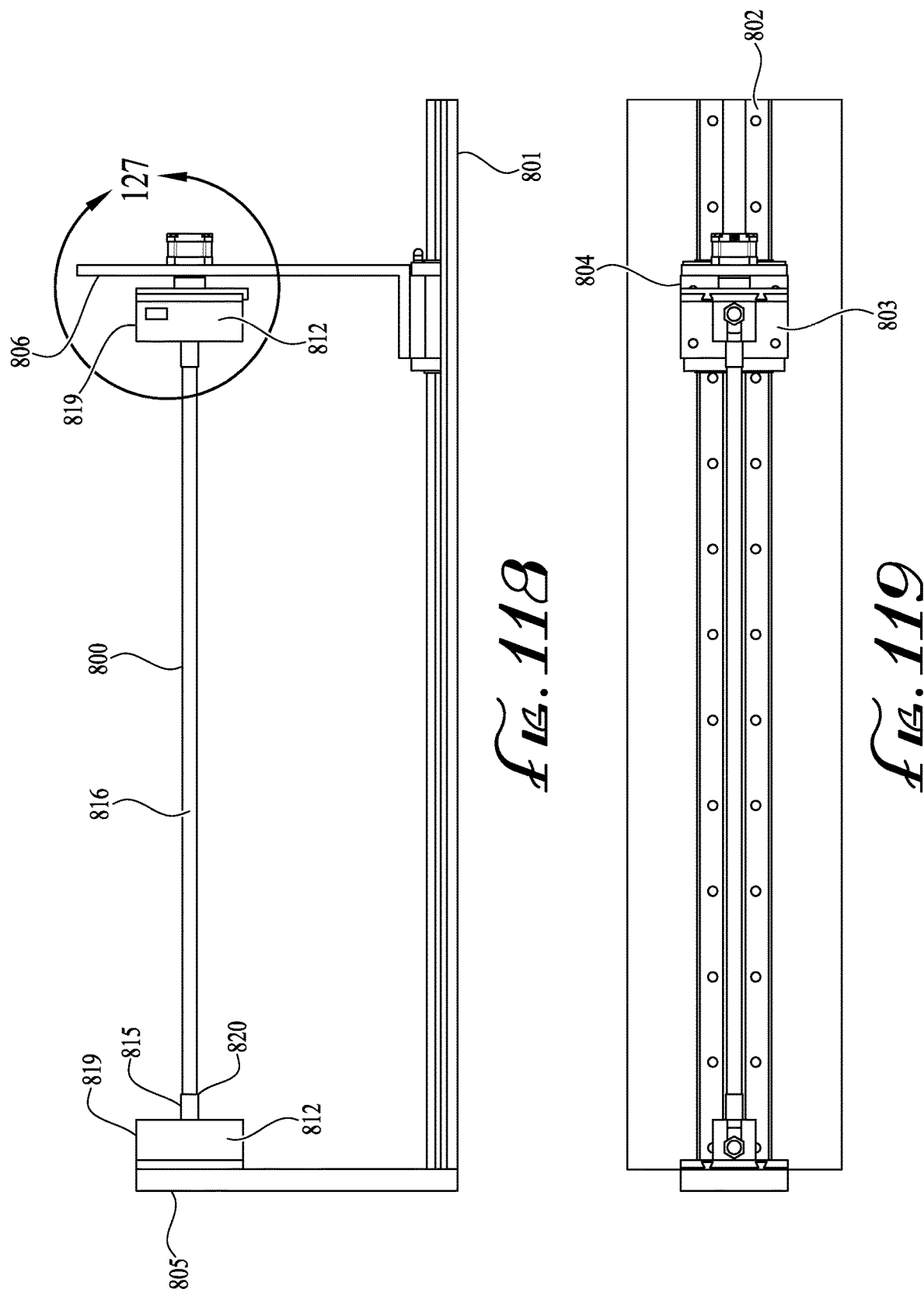

TOOL AND SYSTEM FOR MEASUREMENT, DESIGN COMMUNICATION, ORDERING AND MANUFACTURE OF FLUID HANDLING SYSTEMS AND PARTS

CROSS-REFERENCE TO RELATED APPLICATION

This application claims the benefit of and priority from U.S. provisional application No. 62/799,599 filed on Jan. 31, 2019 and entitled TOOL AND SYSTEM FOR MEASUREMENT, DESIGN COMMUNICATION, ORDERING AND MANUFACTURE OF FLUID HANDLING SYSTEMS AND PARTS. The contents of the above application are hereby incorporated herein by reference in full.

FIELD OF INVENTION

The presently described invention relates generally to a system for creating an accurate analog of materials and assemblies for the purpose of extracting and communicating reliable design information, utilizing the specification provided to manufacture real (or actual) materials and assemblies. More specifically, the present invention relates to various embodiments of a system for remote measurement, design and prototyping, in conjunction with a software system for translating the converted data to real material demand and assembly instructions, and a method for remotely replicating the conditions for producing accurate, custom parts, replicating the specifications of the tool with a real part that is suitable for a wide range of applications, including but not limited to, fluid transfer, hydraulic and plumbing applications in the racing, automotive, power-sport, aviation, space, military, medical, residential, electric vehicle, battery, marine, mining, oil or gas exploration and industrial fields.

BACKGROUND

Within the racing, automotive, power-sport, aviation, space, military, medical, residential, electric vehicle, battery, marine, mining, oil or gas exploration and industrial fields, there is an ongoing need to develop and use "one off" custom parts, prototype parts for development and testing, as well as low to medium volume serial production parts for production application or as part of kits. Presently there are thousands of types and sizes of fittings, multiplied by a high number of hose types and sizes. These materials cover applications such as transferring or carrying fluids and other media, including, but not limited to, various fluids such as brake fluid, air, gases, water, gasoline, diesel, E85, methanol, alcohol, oil, dielectric fluids, glycol, and chemicals. These various types of media are transferred or carried under a wide range of pressures or through use of a vacuum.

The assembled parts have applications in various lines and delivery systems, which include, but are not limited to: oil feed, oil drain, turbo feed, turbo drain, fuel delivery lines, fuel rails, fuel return, fuel venting, fuel return lines, oil delivery lines, oil transfer lines, oil dry sump lines, oil bypass lines, oil breather lines, oil blow by lines, hydraulic brake lines, hydraulic clutch lines, ABS lines, nitrous lines, hydraulic actuator lines, air & gas vent lines, gas delivery lines, chemical delivery lines, chemical transfer lines, water lines, glycol coolant lines, battery cooling lines, hydraulic lines, power steering lines, air suspension lines, hydraulic suspension lines, vehicle lift lines (hydraulic or air), industrial machine lines.

The completed parts are incorporated and utilized in various applications which include, but are not limited to: racing of automobiles, modified vehicles & purpose built vehicles, buggies, custom chassis; racing of motorcycles and purpose built motorcycles, side-car motorcycles, 3-wheel motorcycles, 4-wheel motorcycles; off-road racing, 4×4, "rock-crawling", desert racing, hill climb off-road racing, all-terrain vehicles (ATV), off-road vehicles (ORV), sand-rails; Truck racing, circuit racing, off-road; Rally racing, prototype, production, modified; Prototype and GT racing; Endurance racing; Marine racing, fresh water and offshore; Aircraft; Modified automobiles for racing and street applications; modified motorcycles for racing and street applications; Marine performance and modification, fresh water and offshore; OEM prototype and serial production for automotive, power-sport, aviation, space, industrial and defense applications; aftermarket OEM part replacement kits; oil and gas industry; mining; maritime and naval applications.

The presently-marketed combinations of hoses and fittings used to cover these applications entail providing a consumer or end-user individual components and materials, usually purchased in bulk, in order to build or self-assemble a system on-site according to the application requirement, size, fluid, and environment.

Alternatively, companies, such as assembly companies, offer the materials for sale and will assemble them to the specifications provided by the consumer or end-user, such as with respect to material, length and angle. The vendor may take the assemblies, and install them on-site for a specified application, for an additional cost.

Although some companies which sell or provide fittings and hoses have a system for a consumer to custom-order parts (such as via online, telephone, or facsimile), there is no integrated tool or system that allows the consumer to provide a vendor with a specification that encompasses information such as the type of fittings, placement of the fittings, diameter of the hose, hose type, relative angle, as well an ability to test the routing limits and motion of the hose, physical boundaries of the fittings, a precise minimum bend radius and to correctly route the hose in the specific application, so as to minimize unexpected failures in service.

Presently, the information provided to vendors could only be estimated and not accurately defined, inviting errors, rework and delays in system completion, and it usually involves increased costs and time of hiring a vendor to come on-site to build the requisite systems or parts for a particular application.

The existing systems also have additional disadvantages and risks such as poor measurement estimates, as well as issues with interpretation of the needs of the consumer, including other factors that occur when the specification is recorded by the vendor and thereafter. These risks can introduce some degree of variation from the original specification which potentially results in the part not fitting, fitting in a sub-par manner for a specified application, not meeting the customer's needs, or failing in service. Thus, the existing systems do not provide a means for accurately replicating or optimizing a consumer or end-user's needs.

Because of the inherent problems with specifying, ordering, and building these custom and low volume fluid systems accurately, there is a need for an improved method for consumers to design and specify the part materials (such as optimal parts from the preferred, best and/or most suitable materials available), communicate the specification designed and validated to the vendor that will produce the part, and re-create an accurate production version part from that specification to the appropriate industry standards for the application.

SUMMARY

The present invention relates generally to a system that allows a consumer or vendor to accurately design, then subsequently communicate a specification for a hose or fluid handling assembly part electronically, to a facility, factory, vendor or entity that has the capability and equipment to interpret the specification information and faithfully produce the specified parts, in the exact specification provided by the customer or end-user.

More specifically, the present invention relates to the creation of a tool which is an accurate, modular and reusable analog of the real and actual materials used in these systems that can be assembled on the vehicle or application, accounting accurately for factors which include, but are not limited to, routing, material properties, component size, relative angle of fittings, interference and fit factors.

An exemplary embodiment of the system further includes the capability of uploading the customer's design into an ordering system, accurately interpreting the design into a bill of materials, pricing the assembly, and processing the order, including expediting the order as requested by the customer.

Other exemplary embodiments of the system further include issuing a work order to the production environment and a method for a production cell to read the work order, such as via scan or other similar technology, build and validate the exact combination specified by the customer on a universal fixture that can automatically extend, rotate and house check fixture blocks representing the fittings on the assembly in order to validate that the final product matches exactly the customer's request and supply a finished part to the customer.

Design and Measurement Tool

Embodiments of the present invention include individually-machined, cast, printed or molded segments in an appropriate material (such as metal, elastomeric polymers, composites and plastic, or any combination thereof), which replicate and act as an analog (or analogues) of specific types, brands and constructions of hoses or tubes, and is a component of the tool system referred to herein for purposes of the present disclosure as "Rattlesnake". ("Rattlesnake" pertains to the tool system described herein; however, this reference may be changed to other names or references without departing from the inventive concept of the inventions described.) The individually-machined, cast, printed or molded segments, although similar in design and interface can be provided in any number of exterior geometries to simulate the overall diameter of the real hose, tube, pipe or conduit material, along with the different minimum bend radius of each hose size, construction and type to further aid the consumer or user in their material selection.

The individually-machined, cast, 3D printed (rapid prototyped) or molded segments are capable of being joined together, forming a length of simulated hose or tube, with each segment applied simulating an addition to the overall length of the hose or tube required for the customer's application.

Each "Rattlesnake" segment securely joins or fits together or otherwise extends in length, one into the other in a consecutive fashion, adding a specific length to the chain with each added segment, forming a hose analog which represents the actual desired length of the hose.

Once each "Rattlesnake" segment is snapped, clipped or otherwise temporarily attached together, the integrated structure has a full range of motion indicative of the hose, tube, pipe or conduit material it is built to simulate.

Each hose type and size is represented by a corresponding "Rattlesnake" segment that represents the outside diameter of each hose ("OD") and when connected to each other, the segments represent the manufacturer's minimum total outside diameter real hose material.

Each hose type and size is further represented by a corresponding "Rattlesnake" segment that represents the minimum bend radius ("MBR") of each hose, tube, pipe or conduit and when connected to each other, the segments will bend to the manufacturer's minimum bend radius of the real hose material. The angle of each additional segment is contingent on the "MBR" of the hose material and design of the segment's motion-limiting features.

Each "Rattlesnake" segment is individually-machined, cast, 3D printed (rapid prototyped) or molded in a durable material that functions as a substitute or analog for the actual hose material. It may be appropriate for re-use and may also be disposable, depending upon the customer's requirements.

In exemplary embodiments of the present invention, at each end of the assembled "Rattlesnake" is a separate part, called a "fitting", which is a representative analog of the correct interfacing production fitting for the given hose size. The fitting is the part of the hose assembly that connects, attaches, plugs-in to, screws to, mounts on, clips into or on to, or is located in a space, interfacing with the other systems and hoses.

In these embodiments, these fittings universally fit the "Rattlesnake" segments at either end and maintain a true "0" (zero) degrees orientation in line with the segments, and will also be referred to herein as "fitting tools."

While in exemplary embodiments, two or more interfacing component segments have a 360 degree range of axial motion to simulate the flexibility of the hose, tube, pipe or conduit material, similar to the hose itself, the two or more segments cannot rotate or twist against each other by means of a preventative mechanical interface between the two or more parts that prevent or restrict that type of motion. The purpose of this anti-rotation feature is so that the each of the relative angles of the fittings, once they are installed at each end of the "Rattlesnake" segment chain, regardless of how long the overall length, is accurately maintained and translated into the ordering system. In certain embodiments, as a method of checking that the segments all have the same orientation and engagement, there is an embossed, engraved, printed or otherwise marked, an obvious marking on one side of each segment to verify that all segments are aligned, with or without the mechanical anti-rotation feature included.

There are a multitude of types of fittings that are commercially available in the market which can accommodate various hose sizes, connection angles from straight (0 degrees) through 180 degrees, multiple connection types, permanent crimp connections, torque to seal connections and push on connections, multiple interfacing seal types, swivel nut connections with alternative thread types, face seal connections, "banjo" head connections with metal or rubber seals and retaining bolts, O-ring seals with retaining plate; "quick connect" interface with or without the capacity to form a dry connection without pressure or fluid escape. The types discussed are mere representations of fitting types, and are not intended in a restrictive sense.

In other embodiments of the fitting types above, an equivalent "Rattlesnake" analog for that fitting can be created in various materials and supplied to enable users to create a prototype with that particular type of fitting.

In other embodiments, the "Rattlesnake" fitting is cast, machined, printed, rapid prototyped or otherwise molded in a durable material appropriate for indefinite re-use and for the immediate task of acting as an accurate substitute or analog for the actual hose material, and may be disposable according to the customer's requirements. For fittings with free spinning metal fittings such as but not limited to male or female tube nuts or other interface seals such as O-Rings, these can be incorporated for added integrity of the part's ability to fit into the interfacing system, but in any case, the supplied fittings are generally non-functional and are primarily for measurement and specification purposes.

In exemplary embodiments, the "Rattlesnake" fitting tools, when connected to the "Rattlesnake" segments, constrain the motion of the first segment that it connects to in order to ensure that the hose is not designed too short and, in turn, too tight of a minimum bend radius, creating a potential weakness in the hose. Providing this feature allows for error-proofing for customers for improved design of systems and longer-lasting parts.

The segment is also effectively inserted into the fitting tools, overlapping a length of the fitting in the same way that the real hose material is overlapping the real fitting, and this overlap in length is accounted for and recorded for later reproduction purposes.

The "Rattlesnake" segments have a full range of motion that is characteristic of the hose material it is built to simulate. Considering the constrained length of the hose coming out of the fitting, to that end, the two or more interfacing components, although having a 360 degree range of axial motion to represent the flexibility of the hose material and its connection to the fitting, similar to the hose itself, the fitting and segment cannot rotate or twist against each other by means of a mechanical interface between the two parts that prevent it.

The purpose of this is to accurately maintain the relative angles of the fitting tools at a nominal angle (e.g. 0 degrees is nominal) once they are installed at each end of the "Rattlesnake" segments, regardless of how long the overall length is, so that information is translated correctly into the ordering system. To check that the segments all have the same orientation and engagement, there is the option to have an embossed, engraved, printed, molded or otherwise marked, an obvious marking on at least 1 side of the segment, preferably along the "0 degrees" axis to verify that all segments are aligned, with or without the mechanical anti-rotation feature included.

In an exemplary embodiment, there are two main types of "Rattlesnake" fittings: (1) a fitting tool that comprises a single "0 degree" nominal orientation to the segments and is considered the fixed end of the system, and (2) an adjustment dial or adjustment fitting (referred herein as "Angle Adjustment and Length Adjustment Dial") that allows for adjustment of the angle of orientation between the two or more fitting tools relative to one another and fine adjustment of length.

The fitting tools are used at the ends of the "Rattlesnake" assembly (in various angles, and in various embodiments) and is the starting point for the building of the "Rattlesnake" assembly. In an exemplary embodiment, the fitting tools and segments have only one setting or orientation, which is 0 degrees, in order to error proof the initial setup and focus all adjustments to the Angle Adjustment and Length Adjustment Dial. The 0 degrees and a centerline mark that matches the mark or indicator on the segments, as well as the nominal 0 degrees mark on the Angle Adjustment and Length Adjustment Dial indicate when the system is aligned.

The segments are positively keyed to only fit into the fitting tools at 0 degrees, and despite the segments having different geometry at each end of the segment, the fitting tools have internal geometry that allows for them to fit inside or onto the fitting tools the same way in either orientation, male or female, and retain the same relative datum point for the purpose of accurate measurement.

The Angle Adjustment and Length Adjustment Dial, either including or excluding the length adjustment scale, and in various form factors, may be used between any two segment joints of the "Rattlesnake" assembly where there is sufficient space, and is the component in the assembly that modifies the angle of the two or more fitting tools relative to one another within the "Rattlesnake" assembly, as well as fine adjustment of length.

The Angle Adjustment and Length Adjustment Dial have multiple settings for rotational orientation, and the fitting for one preferred embodiment could achieve 360 degree of angular rotation with an accuracy resolution between 1 and 5 degrees depending on the size of the fitting, manual or digital readout, hose and angle resolution needed, with angle marks printed, laser marked, engraved or otherwise marked on the dial of the fitting. This allows the user to precisely adjust and affix the fitting to the end of the system and view the relative angle in comparison to the angle at the starting point angle which always remains at 0 degrees.

In an exemplary embodiment, an alignment mark and slot is located in the body of the Angle Adjustment and Length Adjustment Dial to ensure the fitting and that it aligns with the alignment marks on the segments and all other connected components, and that the angle can be read off the fitting dial. In other embodiments, a digital readout is incorporated into the dial, offering a finer adjustment, such as 1 degree resolution and a more compact form factor solution thereby allowing work in tighter spaces, which allows the user to precisely adjust and affix the fitting to the end of the system and view the relative angle in comparison to the starting point angle.

In other embodiments, third fittings, tees (3-way), dry breaks or intermediate fittings can be introduced independently to the assembly. These fittings can also be provided as screw-in accessories as part of a kit, allowing users to quickly torque together several single line sections into adaptors to produce complex assemblies.

Adjustment of the assembly can be made whereby segments are added or removed to allow adjustment in hose length and to facilitate proper routing of the segments. Adjustable segments are available to add to the regular segments in-line along straight sections to allow the user to get the line length adjusted to the specifications before measurement of the assembly.

Measuring the assembly, which is normally a cumbersome step, has been simplified by the design features that are built into the "Rattlesnake" tools. In an exemplary embodiment of the invention: 1. The orientation of the fitting tools is defined as consistently measuring 0 degrees; 2. The segments, also nominally at 0 degrees orientation, each add a fixed length, along with adjustable segments and Angle Adjustment and Length Adjustment Dial used in the line, and counting these segments and accessories provides an exact length of the required hose including the overlapping length of hose that is encapsulated under the crimp collar in the fitting; and, 3. The Angle Adjustment and Length Adjustment Dial has a clear readout of the desired orientation angle, to as low as a 1 degree angle and 1 mm length resolution in various designs and embodiments, and this precisely informs the user of the relative angle between the two fitting tools, even if the hose is not routed in a straight line.

Systems

The data retrieved from the dimensions of the "Rattlesnake" include as follows: 1. The orientation of the fitting tool is defined as 0 degrees, and whereby the user identifies the exact type of fitting used, e.g. a 90 degree AN swivel fitting; 2. The type of segment is identified (size and construction) and are counted, whereby the segments each add a fixed length also at 0 degrees, along with adjustable segments, an Angle Adjustment and Length Adjustment Dial and other accessories used in the line, and whereby counting the segments and other inline parts will provide the information for the hose type and for calculation of the length required; 3. The Angle Adjustment and Length Adjustment Dial has a clear readout of the orientation angle required and/or the read out for fine adjustment of length.

The data is entered into an interface, such as a web interface, utilizing either a computer or mobile device-based internet browser such as, but not limited to, Internet Explorer, Chrome, Safari, Firefox, Opera etc., via a mobile device or computer application or "App", or via a portal software through a computer or mobile device.

When logged into the browser interface, application "App" or portal, the customer can input the data retrieved from the "Rattlesnake" tool into the fields, data entry boxes, slider or other software-based buttons and data manipulation options that would facilitate entry of the data identified above.

Within the interface, the user first selects the application for the hose. For example, should the user select that the purpose of the hose system they are designing is for a brake system, the system would eliminate all hose and fitting options (sizes and types) not considered appropriate for that type of system for either compatibility or performance reasons. Only the materials most suited for, or most commonly used for a given application are shown. An override would be allowed, but preferably with strict conditions and without warranty.

The user then inputs the "Rattlesnake" data segment count or measured length which establishes the total length or distance between the 2 fittings. The number of segments generates the total length of the hose between the 2 fittings, accounting for or calculating the hidden length of the hose material that overlaps the fitting at each end, thereby calculating the total length of hose.

The total segment length includes overlapping geometry, as one segment fits inside the next segment, and as such, the total length is not necessarily the accumulative length. For example, if the segment length is 20 mm, and each additional segment adds 15 mm, and if there are 10 segments joined, the total calculated length is 155 mm (9×15 mm+1× 20 mm). In addition, there is a defined length added to account for material overlapping the fittings to establish the total length. In this case, the number of segments is inputted into the specified field and the total length will be established.

The user then enters the "Rattlesnake" data from the fitting tool whereby the user identifies the two or more fittings that the user has chosen for the completion of the "Rattlesnake" prototype. For example, a 90 degree flat banjo fitting tool may be used at one end and a 45 degree side banjo fitting tool may be used at the opposite end, and thus, both of these fittings are selected from the available options that fit the hose selected by the user.

In the exemplary embodiment described, lastly, the user enters the readout data from the Angle Adjustment and Length Adjustment Dial that establishes the final and accurate orientation of the fitting tools relative to each other. A dial or scale feature about the circumference of the moving head of the fitting, or alternatively a digital readout, provides a readout in degrees to show the user what the relative angle is between the setting of the fitting tools. The resulting angle is shown on the fitting and this figure is then entered into the web interface in the field assigned to it.

The result of all of the parameters (e.g., hose type, fitting types, segment count and fine adjustment, fitting angle) having been entered into the fields is the overall specification for manufacturing the part, matching that which was designed utilizing the "Rattlesnake" tool and system. The customer has now faithfully re-created their design in a digital format, and it is now transmitted to the vendor, organization or persons that will re-create the specification, minimizing or eliminating any errors, misalignment, or misinterpretation and with the exact materials specified by the user.

In other embodiments, there is a field within the menu options to incorporate multiple fittings. The example provided above describes a 2-fitting construction; however, assemblies with three or more fittings, whether they are tees, valves, quick connects, couplings, filters, etc. are all available to include, following the same methods described herein.

In other embodiments, the addition of accessories and the specification of available colors and finishes are also selectable options for the finishing of the part. Non-critical fit components like exterior grommets, heat shielding, flame shielding, safety wiring, temperature indicators, covers etc. can also be selected and applied as required as part of the selection process, and a dedicated field or control for the available options will be provided.

After checkout, a work order is created, and a document or message is provided to the production floor with the assembly instructions and the materials to be allocated to that work order. The work order may be a printed order to the floor that is preferably able to be electronically scanned via a barcode (such as a 2-dimensional barcode) containing all the order information and/or via an Radio Frequency Identification (RFID) tag that is printed and attached to the hose at the beginning of the process for assembly. The barcode or RFID tag contains the following information: 1. MATERIAL REQUIREMENT: hose type, hose cut length, fitting part numbers and quantity, accessory part numbers and quantity, 2. TOOLING REQUIREMENT: Crimp dies (RFID tagged), check fixture blocks required (RFID tagged), automatic check/alignment fixture specifications (distance and orientation), 3. TESTING REQUIREMENT: Pressure adaptors, test pressure and cycle type, cleanliness type, 4. DELIVERY REQUIREMENT: Packaging required, shipping label, fulfillment instructions.

Production

In an exemplary production process, when a new order reaches the floor, all materials driven by the bill of materials (BOM) specification are picked and placed into a tote or container, and the RFID tag that contains all work order information is placed on the hose and used as a "shop traveler" document, providing all instructions for the process which will remain with the hose until it reaches the customer.

As materials leave the stores, they pass a portal that reads the RFID tag, checking the parts into the production cell, providing visibility to all the orders on the floor, and the requisite sequence by which to process them in order to efficiently build all requirements in a particular order and to ensure orders do not stagnate or get delayed.

The work order/tote is then chosen, scanning the RFID tag on the hose to translate the build specification to the assembly cell, work order information, specification shown on screen in assembly cell. All the required inputs of tooling (e.g., crimp tools, fitting blocks) and materials are displayed, and the alignment fixture is set up automatically with the correct length and orientation for the particular job.

There can also be "Poke-Yoke" features which are sometimes referred to as error-proofing measures in the cell that confirm the work order, that the correct check fixture blocks and crimp dies have been selected for the work order, and which also validates the process.

After the check fixture blocks installed onto automatic build/check fixture are validated, the check fixture automatically draws apart to become longer according to the work order, which then rotates the adjustable end to the specified angle, checking all parameters.

The part is assembled and aligned on an automatic fixture, which simulates the straight-line condition of the hose assembly based on the user's data, and ensures that the assembly configuration is accurate prior to the part being crimped together.

The part is crimped together based on all the information from the work order, rechecked in fixture, serialized and recorded in the manufacturing system as passing assembly testing. The part is then transferred back to work in progress (or "WIP") and is transferred to the testing cell.

The part is scanned into the testing cell, loading all pressure testing and cleaning requirements required for that work order. The part is pressure tested, cleaned and certified, updating the serialization record as having passed assembly and pressure testing. The part is transferred back to work in progress ("WIP") and is transferred to the packaging cell.

The above-summarized features of the measurement/specification tool (or the "Rattlesnake" tool), the web interface and production methodology are provided so that the detailed description of various embodiments thereof may be better understood. It is to be understood that the invention is not limited to the details of construction or to the arrangements of the components set forth in the above summary and below description, or as illustrated in the drawings. Rather, the invention may be practiced in numerous forms and embodiments. Also, it is to be understood that the phraseology and terminology employed herein are for the purpose of the description and should not be regarded as limiting.

These and other embodiments, features, aspects, and advantages of the inventive systems will become better understood with regard to the following description, appended claims and accompanying drawings.

BRIEF DESCRIPTION OF THE DRAWINGS

The foregoing aspects and the attendant advantages of the present invention will become more readily appreciated by reference to the following detailed description, when taken in conjunction with the accompanying drawings, wherein:

FIG. 4 is a partially-exploded perspective view of a chain or series of the segment embodiment depicted in FIG. 1.

FIG. 5 is a partially-exploded perspective view of a chain or series of the segment embodiment depicted in FIG. 1.

FIG. 6 is a perspective view of the segment depicted in FIG. 1.

FIG. 7 is a perspective view of the segment depicted in FIG. 1.

FIG. 8 is a cross-sectional view of the segment taken along line 8-8 of FIG. 6.

FIG. 12 is a cross-sectional view of a chain of segments taken along line 12-12, depicting the flexibility and bend radii between joints of the chain or series of segments.

FIG. 13 is a perspective view of a chain of segments, depicting the flexibility and bend radii between joints of the chain or series of segments.

FIG. 14 is a side elevation view of a chain of segments, depicting features integrated into the mating surfaces of the segments to allow for a controlled degree of rotation, but preventing twisting along the connected axis.

FIG. 15 is a partially-exploded side elevation view of a chain of segments, depicting features integrated into the mating surfaces of the segments to allow for a controlled degree of rotation, but preventing twisting along the connected axis.

FIG. 16 is a perspective view of a series of segments depicting aligned segments through alignment of the orientation marks on the segments.

FIG. 28 is a back perspective view of a chain or series of the segment embodiment depicted in FIGS. 19-25.

FIG. 29 is a bottom perspective view of a chain or series of the segments depicted in FIGS. 19-25.

FIG. 33 is a bottom plan view of the segment depicted in FIG. 30.

FIG. 34 is a top plan view of the segment depicted in FIG. 30.

FIG. 35 is a front elevation view of the segment depicted in FIG. 30, showing the female end of the segment.

FIG. 36 is a back elevation view of the segment depicted in FIG. 30, showing the male end of the segment.

FIG. 37 is a partially-exploded perspective view of a series of the segment embodiment depicted in FIGS. 30-36.

FIG. 38 is a partially-exploded top plan view of a series of the segment embodiment depicted in FIGS. 30-36, showing the mode of attachment of two or more segments.

FIG. 39 is a partially-exploded side elevation view of a series of the segment embodiment depicted in FIGS. 30-36.

FIG. 40 is a partially-exploded bottom plan view of a series of the segment embodiment depicted in FIGS. 30-36.

FIG. 41 is a side elevation view of an embodiment of the segment using an extruded or molded flexible material design.

FIG. 42 is a front elevation view of the segment embodiment depicted in FIG. 41.

FIG. 43 is a top plan view of the segment embodiment depicted in FIG. 41.

FIG. 44 is a perspective view of the segment embodiment depicted in FIG. 41.

FIG. 45 is an enlarged perspective view of the segment embodiment depicted in FIG. 44.

FIG. 46 is a table that shows the relationship between sizes and types of segments and how they are identified in an exemplary embodiment of the system.

FIG. 49 is a side elevation view of an embodiment of a fitting tool used in the system of the present invention.

FIG. 50 is a side elevation view of an embodiment of a fitting tool used in the system of the present invention.

FIG. 51 is a side elevation view of an embodiment of a fitting tool used in the system of the present invention.

FIG. 52 is a side elevation view of an embodiment of a fitting tool used in the system of the present invention.

FIG. 53 is a side elevation view of an embodiment of a fitting tool used in the system of the present invention.

FIG. 54 is a side elevation view of an embodiment of a fitting tool used in the system of the present invention.

FIG. 55 is a side elevation view of an embodiment of a fitting tool used in the system of the present invention.

FIG. 56 is a side elevation view of an embodiment of a fitting tool used in the system of the present invention.

FIG. 57 is a perspective view of an embodiment of the fitting tool and its component parts, showing its relationship to the segment chain and a mode of connection to the female side of a segment.

FIG. 58 is a perspective view of an embodiment of the fitting tool and its component parts, showing its relationship to the segment chain and a mode of connection to the male side of a segment.

FIG. 59 is a perspective view of an embodiment of the fitting tool and its component parts, showing its relationship to the segment chain.

FIG. 60 is a perspective view of an embodiment of the fitting tool and its component parts, showing its relationship to the segment chain.

FIG. 61 is a table of the range of exemplary fittings and connection types that share common geometry, scaled according to the intended hose type, and a preliminary and limited range of alternate industry standard and common types of fittings tools that could function within the utility of the system in addition to "AN" style fitting tools.

FIG. 72 is a top plan view of an embodiment of the Angle Adjustment and Length Adjustment Dial depicting its method of assembly and integration to the other components in the system at zero degrees.

FIG. 73 is a side elevation view of an embodiment of the Angle Adjustment and Length Adjustment Dial depicting its method of assembly and integration to the other components in the system.

FIG. 82 is an exploded perspective view of an embodiment of the Angle Adjustment and Length Adjustment Dial and its components.

FIG. 83 is a perspective view of an embodiment of the Angle Adjustment and Length Adjustment Dial.

FIG. 84 is a cross-sectional view of an embodiment of the Angle Adjustment and Length Adjustment Dial, taken along line 84-84 of FIG. 85.

FIG. 85 is a side elevation view of the Angle Adjustment and Length Adjustment Dial depicted in FIG. 84.

FIG. 86 is a top plan view of embodiments of the Angle Adjustment and Length Adjustment Dial and an embodiment of the Angle Adjustment and Length Adjustment Dial in an alternate form factor referred to herein as the Mini Angle Dial.

FIG. 87 is an exploded top plan view of the Mini Angle Dial.

FIG. 88 is a top plan view of the Mini Angle Dial.

FIG. 89 is a perspective view of the Mini Angle Dial.

FIG. 96 is an exploded side elevation view of an embodiment of the Angle Adjustment and Length Adjustment Dial in an alternate form factor and its components.

FIG. 97 is a side elevation view of an embodiment of the Angle Adjustment and Length Adjustment Dial in an alternate form factor.

FIG. 100 is an exploded side elevation view of an exemplary segment assembly of the present invention.

FIG. 101 is a perspective view of an exemplary segment assembly incorporating angled fitting tools.

FIG. 102 is a perspective view of an exemplary segment assembly incorporating angled and straight fitting tools.

FIG. 109 is a table of specifications drawn from an exemplary segment assembly of the present invention which includes information provided by a user within a website or a portal.

FIG. 110 is a table depicting translation of the specifications from FIG. 109 into a usable output format in a work order that is used to initiate the manufacturing process.

FIG. 111 is a side elevation view of an embodiment of a segment assembly incorporating a "Y" fitting and angled fittings.

FIG. 114 is a table of the specifications of the assembly shown in FIG. 113.

FIG. 118 is a front elevation view of an embodiment of an alignment machine which is used in replicating the customer's design and specifications.

FIG. 119 is a top plan view of an embodiment of an alignment machine which is used in replicating the customer's design and specifications.

FIG. 120 is a perspective view of the adjustable angle end of the alignment machine depicted in FIGS. 115-119.

FIG. 121 is a top plan view of the adjustable angle end of the alignment machine depicted in FIGS. 115-119.

FIG. 122 is a bottom plan view of the adjustable angle end of the alignment machine depicted in FIGS. 115-119.

FIG. 123 is a side elevation view of the adjustable angle end of the alignment machine depicted in FIGS. 115-119.

FIG. 124 is a front elevation view of the adjustable angle end of the alignment machine depicted in FIGS. 115-119.

FIG. 125 is a front elevation view of the adjustable angle end of the alignment machine depicted in FIGS. 115-119.

FIG. 126 is an enlarged perspective view of the adjustable angle end of the alignment machine, enlarged as shown in FIG. 115.

FIG. 127 is an enlarged front view of the adjustable angle end of the alignment machine, enlarged as shown in FIG. 118.

Reference symbols or names are used in the Figures to indicate certain components, aspects or features shown therein. Reference symbols common to more than one Figure indicate like components, aspects or features shown therein.

DETAILED DESCRIPTION

Various aspects of specific embodiments are disclosed in the following description and related drawings. Alternate embodiments may be devised without departing from the sprit or the scope of the present disclosure. Additionally, well-known elements of exemplary embodiments will not be described in detail or will be omitted so as not to obscure relevant details. Further, to facilitate an understanding of the description, a discussion of several terms used herein follows.

The word "exemplary" is used herein to mean "serving as an example, instance or illustration." Any embodiment described herein as "exemplary" is not necessarily to be construed as preferred or advantageous over other embodiments. Likewise, the term "embodiments" or "configuration" is not exhaustive and does not require that all embodiments or configurations include the discussed feature, advantage or mode of operation.

The detailed description set forth below is intended as a description of presently-preferred embodiments of the invention and is not intended to represent the only forms in which the present invention may be constructed and/or utilized. However, it is to be understood that the same or equivalent functions and results may be accomplished by different embodiments that are also intended to be encompassed within the spirit and scope of the invention, and additional variations of the present invention may be devised without departing from the inventive concept. The description itself is not intended to limit the scope of any patent issuing from this description. Rather, the inventors have contemplated that the claimed subject matter might also be embodied in other ways, to include different elements or combinations of elements similar to the ones described in this document, in conjunction with other present or future technologies.

Figure 1:
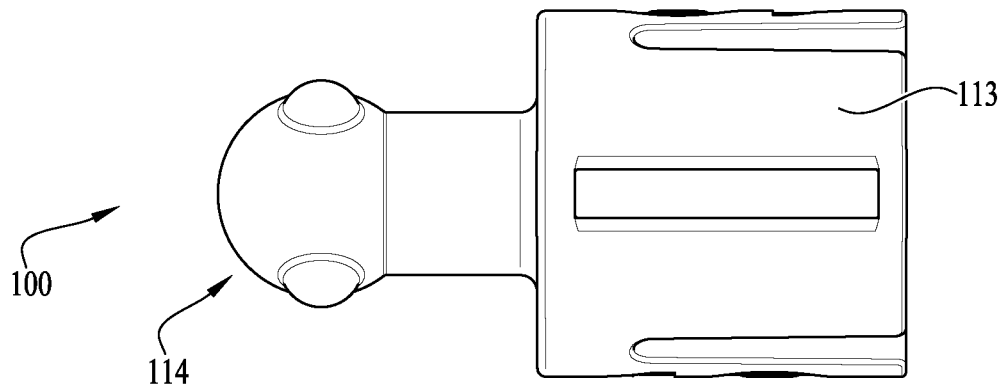
FIG. 1 is a top plan view of an embodiment of a single segment component.
Figure 2:
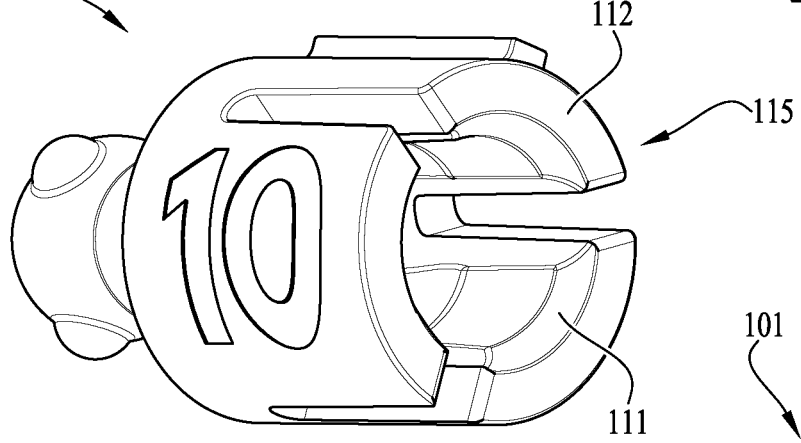
FIG. 2 is a perspective view of the segment depicted in FIG. 1.
Figure 3:
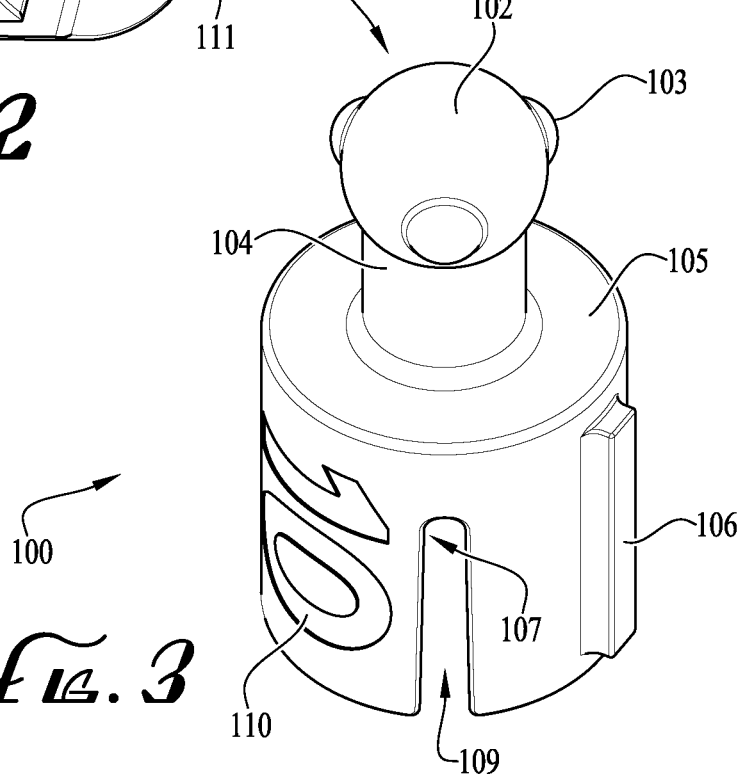
FIG. 3 is a perspective view of the segment depicted in FIG. 1.
Figure 9:
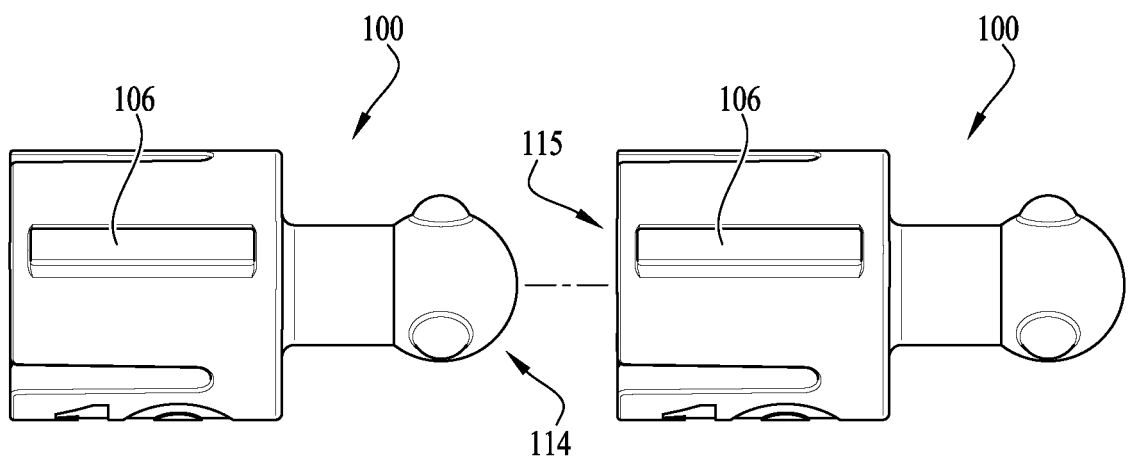
FIG. 9 is a top plan view of two of the segments depicted in FIG. 1.
Figure 10:
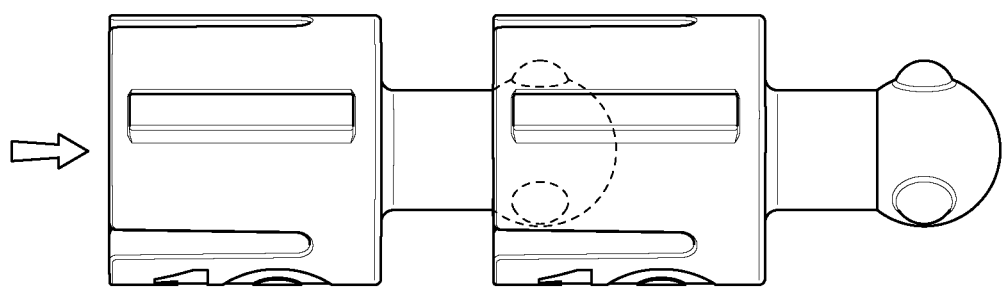
FIG. 10 is a top plan view of two of the segments depicted in FIG. 1, in a semi-connected configuration, showing the mode of attachment of two or more segments.
Figure 11:
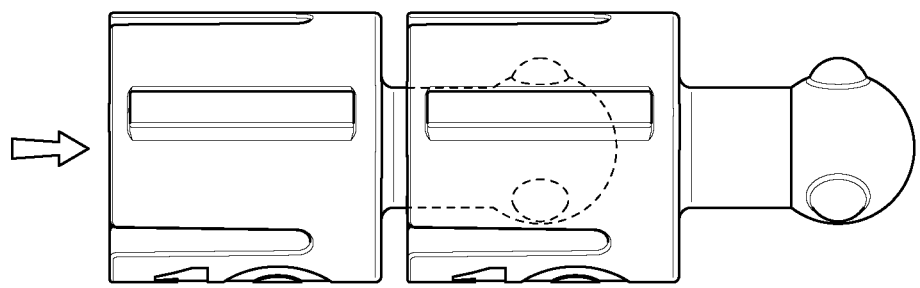
FIG. 11 is a top plan view of two of the segments depicted in FIG. 1, in a fully-connected configuration, showing the mode of attachment of two or more segments.

Referring to FIGS. 1 through 3, depicted therein is a single hose segment (100) of an exemplary size, with the following features: male control joint cluster (101), male longitudinal control joint (102), male torsion control joint (103), control joint neck (104), body front face (105), 0 degree alignment spine/mark (106), female torsion control joint (107), flex slot (109), size marking (110), segment body (113), the male side (114) of the segment (100), the female side (115) of the segment, the body rear face (112) and the control joint neck motion limit chamfer (111).

The features of an exemplary embodiment of the segment (100) as depicted in FIG. 1 through 3 generally depict the important components of the segment (100) for the effective operation of the segment (100) when assembled in a chain or continuous, aligned length.

FIGS. 4 and 5 depict a partially-exploded perspective view of a chain or series of the segment embodiment in FIG. 1. It shows a chain of segments in a partially-exploded arrangement, with the male control joint cluster (101) of the male side being attached to the female side (115) of each preceding segment (100). As discussed below, attaching the female side (115) to the male side (114) of a chain is also another method of attachment.

FIGS. 6 and 7 depict perspective views of the segment (100), male side (114), and female side (115), and the details of both sides of the segment, depicting the features identified above.

FIG. 8 is a cross-sectional view of the segment taken along line 8-8 of FIG. 6. FIG. 8 illustrates the anti-rotation geometry of the segment configuration. As shown in FIGS. 6 through 8, the general internal and external features of the anti-rotation geometry include the male control joint cluster (101), male longitudinal control joint (102), male torsion control joint (103), female longitudinal control joint (116), female torsion control joint (107), female inner face (118), socket lock edge (117) and the 0 degree alignment spine (106) which indicates to the user that the chain of segments is aligned visually. Several injection-molding features specific to the manufacturing process for a plastic embodiment are also noted.

The embodiment of "Rattlesnake" segments (100) depicted in FIGS. 1 through 8 are generally comprised of a rigid material produced from various materials which include, but are not limited to, plastic, elastomeric, silicone, composite or metal material, with one end with male connecting features, and the opposite end with female features that can be joined in an unlimited length.

Each section of segment (100) represents a production hose material and is of adequate overall diameter to accurately represent the physical dimensions of the representative hose or tube so as to allow the user to know the physical limitations of the space or area that the "Rattlesnake" assembly is being used or routed, as a simulation for a final assembled part. The "Rattlesnake" segments (100) are preferably made of a material of adequate strength to be indefinitely reusable and utilized in industrial, commercial or field environments.

Various grades of metal, elastomeric polymers, composites and plastic would be an acceptable material for this purpose. The segments (100), when connected together and utilized with the other components of the "Rattlesnake" system, form the portion of the analog of the hose or tube that will be designed by the user for a specified application.

In an exemplary embodiment, the "Rattlesnake" segments (100) have a "male" (114) and "female" (115) geometry or configuration that form part of each end of the segment (and this portion or feature may be molded or machined into each end) with internal and external interlocking features, comprised of a male (114) interlocking shape and anti-rotation male control joint cluster (101), mating to a female interlocking geometry (107, 116). These components are designed to allow axial flexibility preferably at 360 degrees around the centerline without twisting so as to preserve angular accuracy and integrity of the measurement tool. This design allows for indefinite connectivity to each other as shown in FIGS. 9 through 13 and flexibility between segments that makes the segments simulate the hose that they represent.

Figure 30:
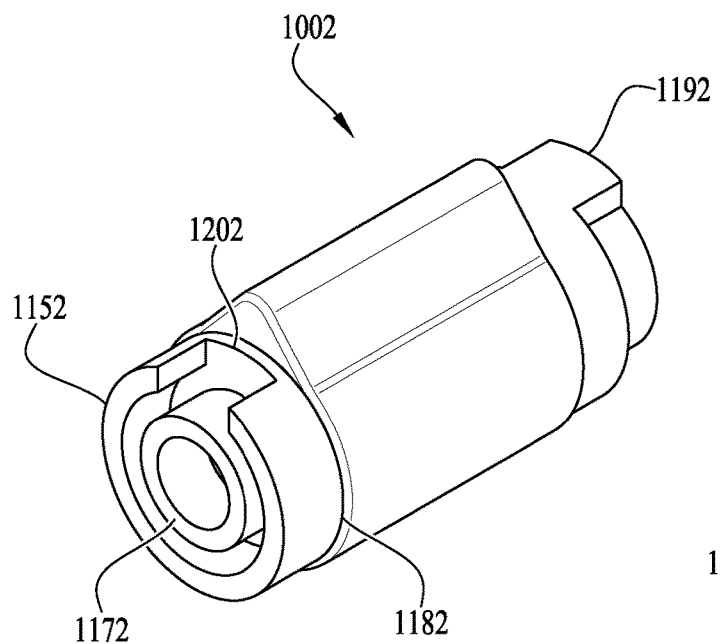
FIG. 30 is a perspective view of an alternative embodiment of a segment using a composite material design.
Figure 31:
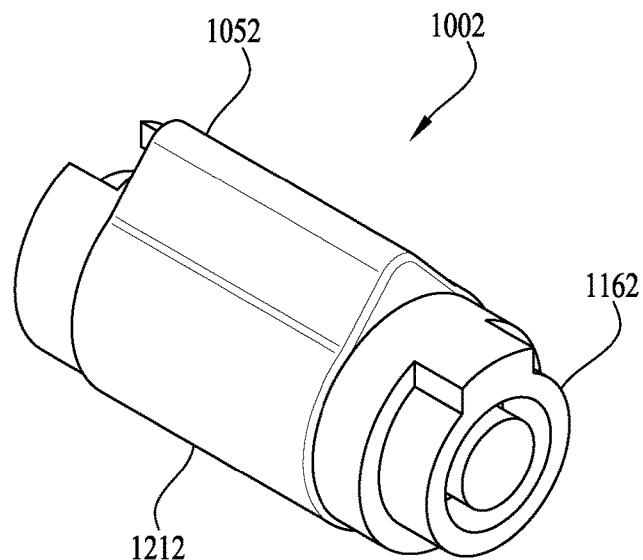
FIG. 31 is a perspective view of the segment depicted in FIG. 30.
Figure 32:
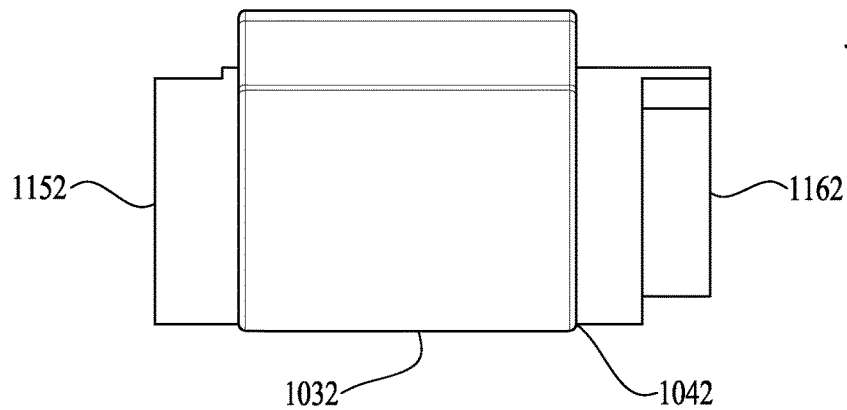
FIG. 32 is a side elevation view of the segment depicted in FIG. 30.

FIG. 13 is a perspective view of a chain of segments, depicting the flexibility and bend radii between joints of the chain or series of segments. FIG. 12 is a cross-sectional view of a chain of segments taken along line 12-12, depicting the flexibility and bend radii between joints of the chain or series of segments. As shown in these figures, the "Rattlesnake" segments (100) are generally shaped such that they interlock into one another, yet they offer a consistent 360 degree (preferred) range of motion around the joint up to a specific bend radius determined by the type of hose it is representing. The angle between segments is a simulation of the "minimum bend radius" (MBR) of the hose that is being simulated and is shown in FIGS. 12 and 13. Alternate embodiments of the segments (later shown in FIGS. 19, 30 and 41 (referred to as segments (1001), (1002), and (1003), respectively) also behave in the same way as the embodiment of the segment (100) based on modifications of design parameters and materials so as to allow the flexibility to represent the desired bend radius.

FIG. 14 shows a chain of segments (100), depicting features integrated into the mating surfaces of the segments to allow for a controlled degree of rotation, but preventing twisting along the connected axis. FIG. 15 is a partially-exploded side elevation view of a chain of segments. As depicted in FIGS. 14 and 15, there are features at the end section of the segments (100) that would facilitate controlling and preventing the rotational motion around the center axis of each interlocking segment regardless of the number of segments in the chained assembly. There is interlocking geometry at each end of the segment (100) with a male side (114) and female side (115) section. The interlocking configuration (through 101 and 107) on the segment (100) that prevent rotation of the segments against each other, without impeding the performance of achieving the range of movement and bend angles, includes the male control joint cluster (101), (encompassing a male longitudinal control joint (102), male torsional control joint (103)), and female torsional control joint (107), female longitudinal joint (116), and flex slots (109).

Referring to FIG. 16, depicted therein is the presence of an orientation mark (106) on the segment that "error proofs" the orientation of the fitting tools (200) (see FIGS. 57 and 58) and embodiments of the Angle Adjustment and Length Adjustment Dial (300) (see FIG. 105), ensuring that they are always installed and measured at a nominal orientation, which is at 0 degrees. The orientation marks facilitate having an exact and repeatable orientation and alignment of the segments. This feature can be in the form of a slot, groove, boss, extrusion or any other feature that can orient, positively locate or key the segment in only one direction so that the continuity of angle is maintained along the entire chain of segments (100) and fittings (200, 300).

Figure 17:
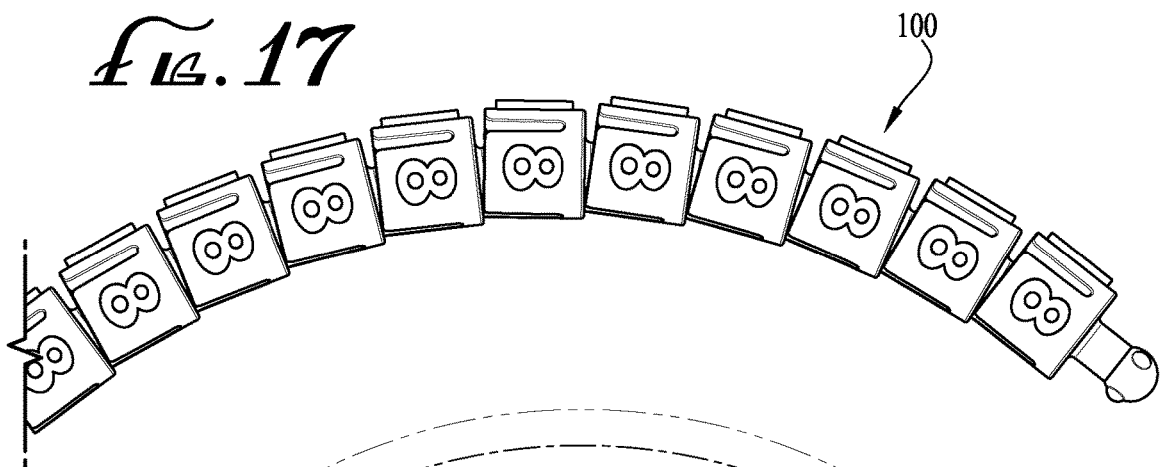
FIG. 17 is a side elevation view of a series of segments depicting the minimum bend radius of a series of segments.
Figure 18:
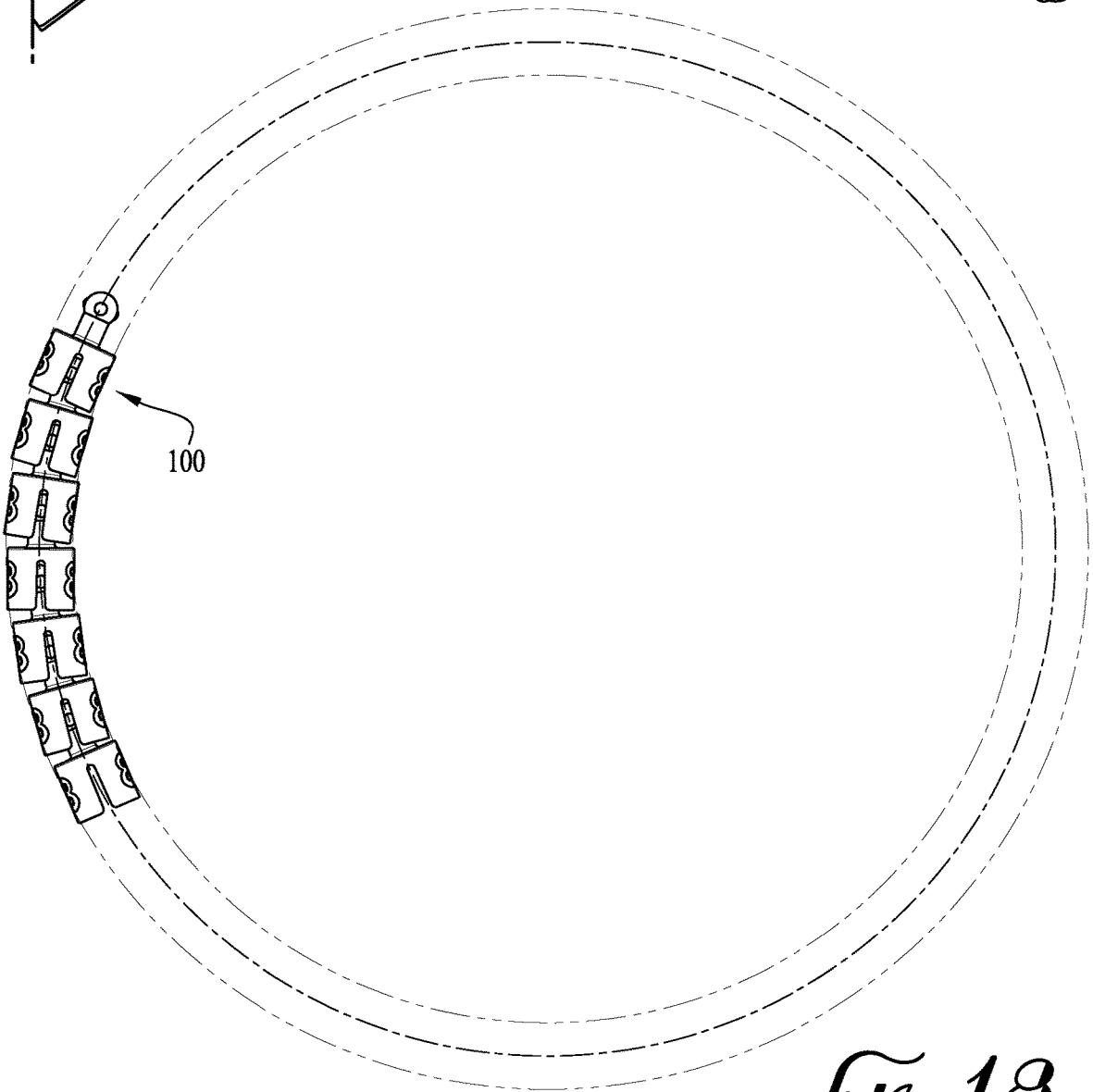
FIG. 18 is a bottom plan view of the series of segments depicted in FIG. 17.

FIGS. 17 and 18 depict a series of segments showing the minimum bend radius of a series of segments. In this exemplary embodiment, when the series of segments (100) reach their minimum bend radius, the chain or series of segments will rest naturally at this radius. In this embodiment, the segments (100) will naturally rest at the recommended bend radius for optimal hose performance, flow and longevity according to the specifications of the manufacturer, and once the minimum bend radius is reached, the segment chain will reach its maximum flexibility and break apart in order to prevent design errors.

Figure 19:
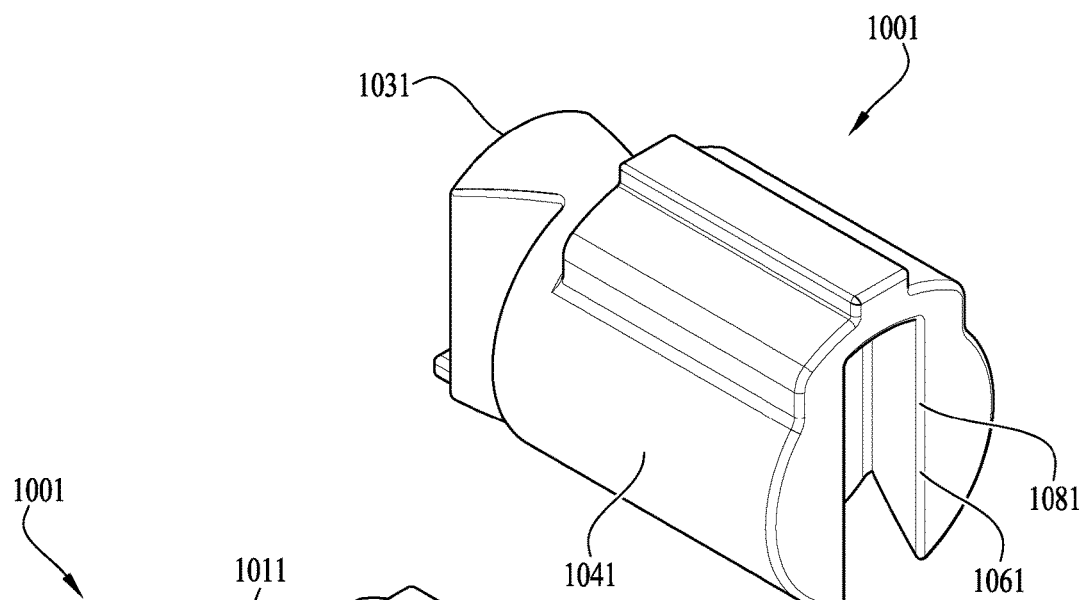
FIG. 19 is a perspective view of an alternative embodiment of a segment using a fully elastomeric material design.
Figure 20:
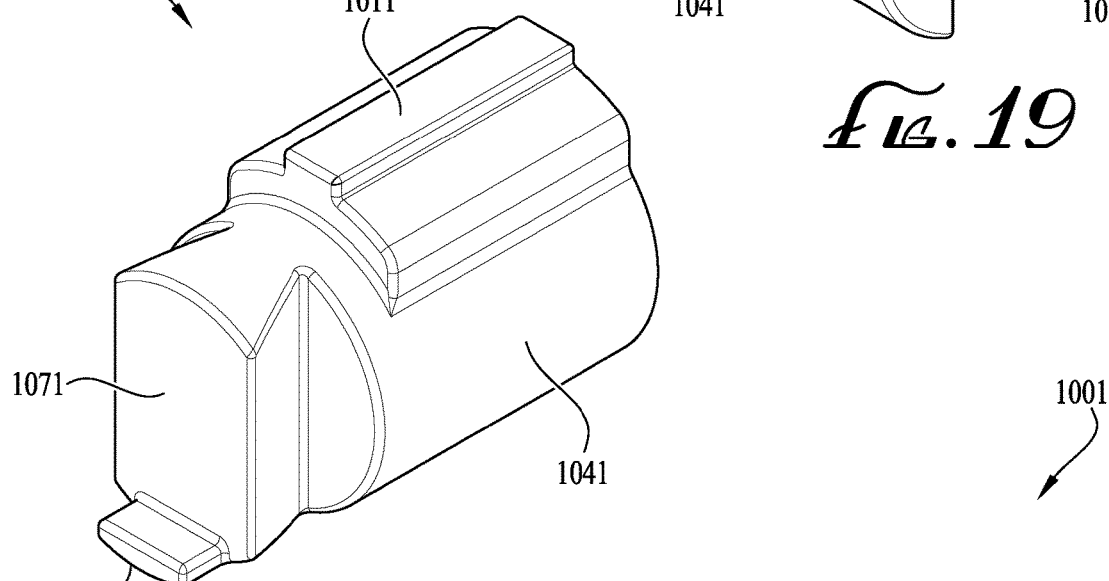
FIG. 20 is a perspective view of the alternative embodiment depicted in FIG. 19.
Figure 21:
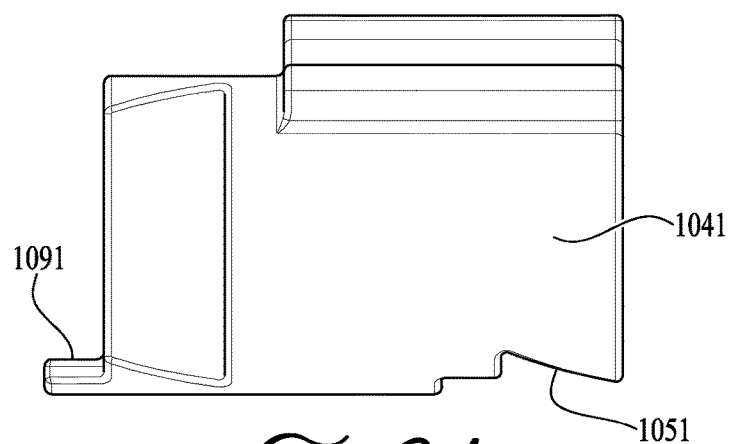
FIG. 21 is a side elevation view of the alternative embodiment depicted in FIG. 19.
Figure 22:
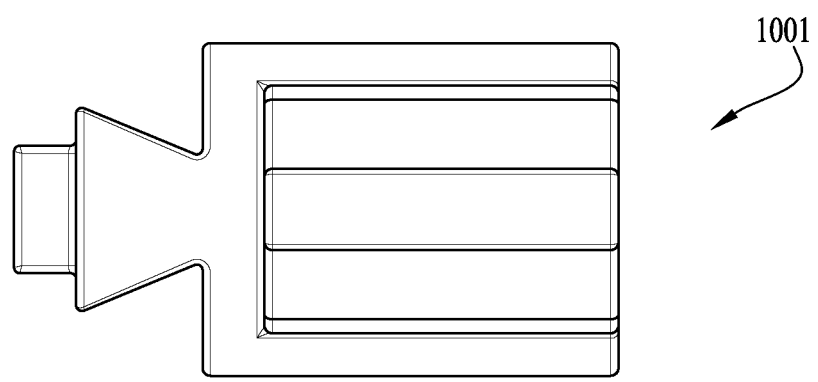
FIG. 22 is a top plan view of the alternative embodiment depicted in FIG. 19.
Figure 23:
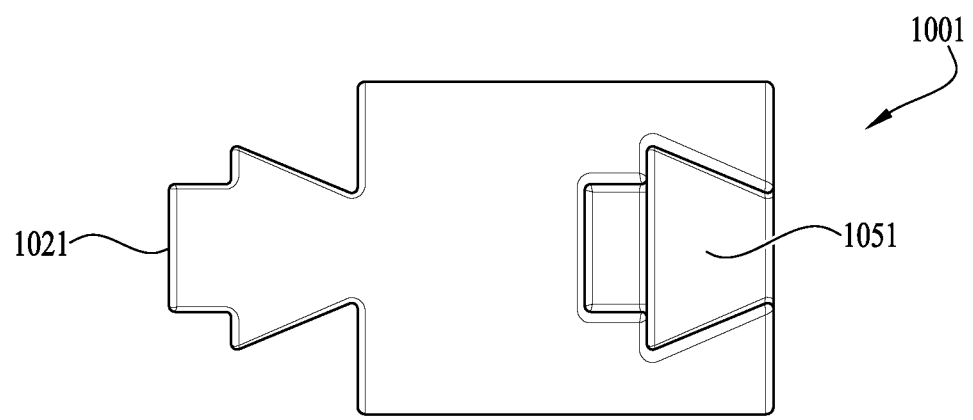
FIG. 23 is a bottom plan view of the alternative embodiment depicted in FIG. 19.
Figures 24, 25:
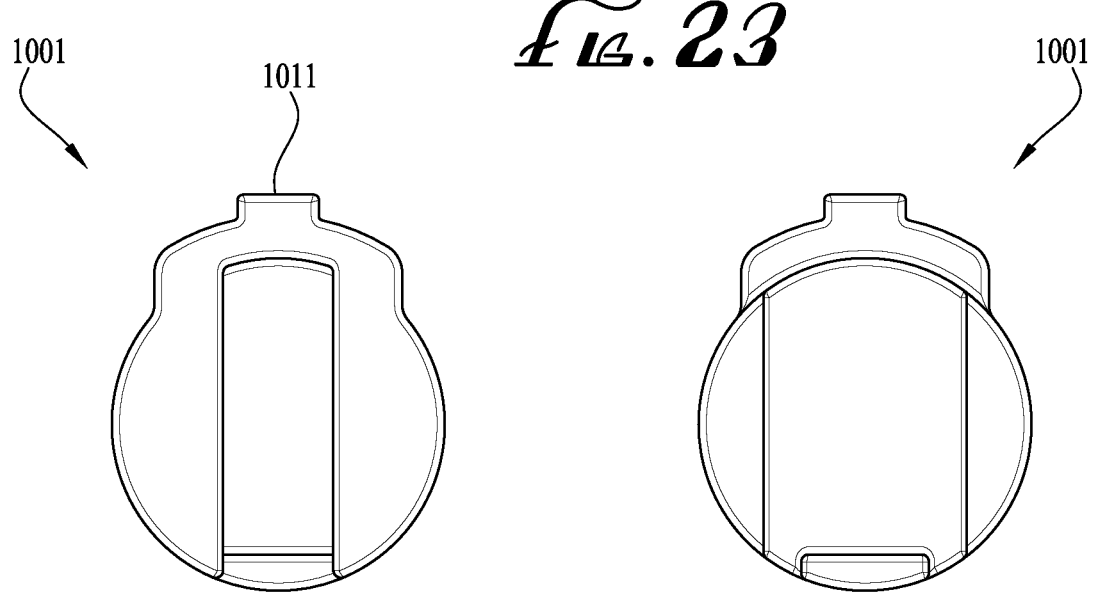
FIG. 24 is a back elevation view of the alternative embodiment depicted in FIG. 19.
FIG. 25 is a front elevation view of the alternative embodiment depicted in FIG. 19.
Figure 26:
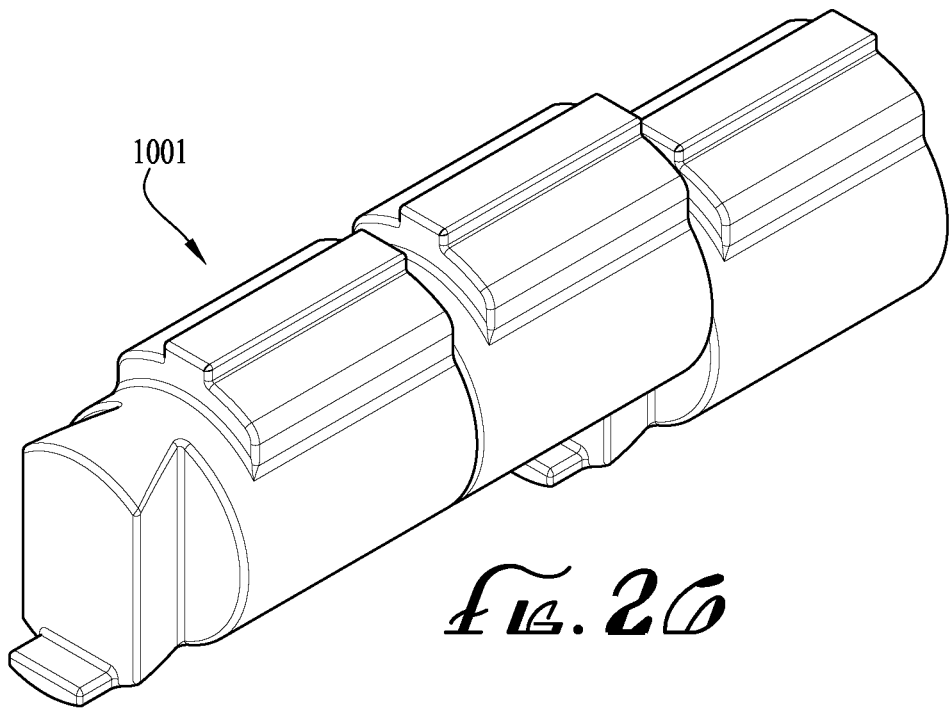
FIG. 26 is a front perspective view of a chain or series of the segments depicted in FIGS. 19-25.
Figure 27:
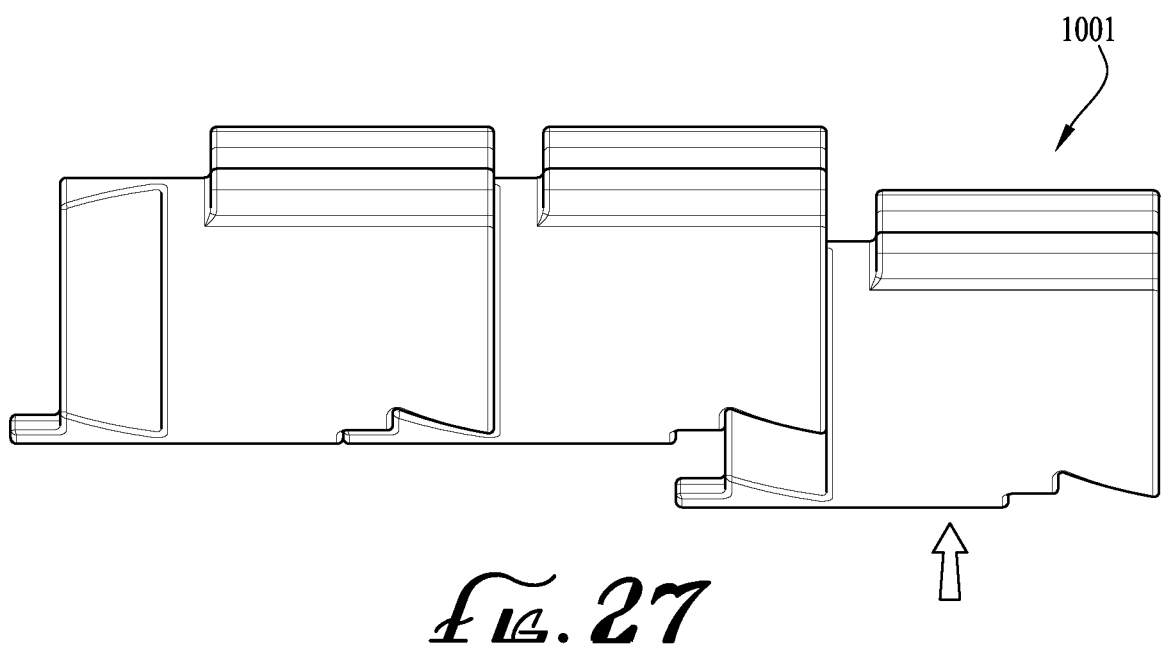
FIG. 27 is a side elevation view of a chain or series of the segments depicted in FIGS. 19-25, showing the mode of attachment of two or more segments.

FIGS. 19 through 21 depict an alternative embodiment of the segment design. Segment (1001) is molded from an elastomeric material that creates an approximately similar stiffness and flexibility that replicates that minimum bend radius of a particular hose type when assembled in a chain. Segment (1001) has a molded geometry that affords segments to be robustly joined without twisting, generally following the same principles of design and functionality as the rigid segment (100) depicted in FIGS. 1 through 18. As shown in FIGS. 22 through 29, features of the segment (1001) include an orientation mark (1011), lock tab (1021), anti-rotation geometry (1051), male locking feature (1031), female locking feature (1061), segment body (1041), male connection feature (1071), female connection feature (1081) that secures the position of the segments (1001) in relation to one another.

FIGS. 30 through 40 depict another alternative embodiment of the segment design. In this embodiment, the segment (1002) comprises a composite elastomeric design that, in exemplary embodiments, is molded from a material that creates an approximately similar stiffness that replicates the minimum bend radius of a particular hose type when assembled in a chain. As shown in FIGS. 35 and 36, the segment (1002) also includes the connection geometry at each end with molded or machined rigid end plates (1132 male and 1122 female), made from a metal, plastic, or composite material, that affords segments to be robustly joined without twisting, following the same principles of design and function as the rigid segment (100) in FIG. 1 through 18. Referring to FIGS. 30 through 38, the segment (1002) also comprises the following design features: Male (1132) and female (1122) connection ends, male connector (1072), female connector (1112), female boss (1092), male boss (1082), male keyway (1062), female keyway (1102), elastic segment body (1032), orientation markings (1052), internal locking design features male (1192) and female anti-rotation feature (1202), segment body (1212), joint between the segment and connector ends (1182), male connector button (1162), female connector button (1152), lock tab (1092), female lock tab slot (1142), locked union (1152), and locking ridge (1092).

FIGS. 41 through 45 depict another alternative embodiment of the segment design, using an extruded or molded flexible or elastomeric material. Segment (1003) is extruded or molded from a material that creates an approximately similar stiffness that replicates the minimum bend radius of a particular hose type when used in a length. This segment embodiment, however, is not supplied in pre-cut or prepared segments, but rather, supplied in a predetermined length that the user can cut to the size needed, and in exemplary embodiments, is not reusable. Preferably, the material used is a low cost, low tooling option to achieve the same basic objective as using the molded individual segments, which is as an analog for the production hose material. Examples of materials are rubber, EPDM, santoprene, or similar elastic material extruded through a die. Referring to FIGS. 41 through 45, the segment design incorporates basic design features that are common to the other segment designs such as: the orientation marking (1013), an anti rotation feature (1023), a consistent overall diameter segment body (1043) and a male connection geometry (1033).

"Rattlesnake" segments (100, 1001, 1002, 1003) that are depicted in the drawings represent exemplary embodiments and will vary based on the size, type, material and construction of hose that the segment is designed to represent, which can include but is not limited to −02, −03, −04, −05, −06, −08, −10, −12, −14, −16, −18, −20, −22, −24 and larger standard sizes. FIG. 46 is a table representing illustrative examples of the types of variations of materials used in various embodiments of the "Rattlesnake" system, which, in general terms, comprise the steps of producing a representative analog of a part, converting the data to components and specifications, and using that data to create the real, intended, part from actual materials.

These hoses, tubes or conduit are available in various constructions and materials such as, but not limited to, PTFE, Nylon, rubbers and other flexible polymers, polymer, composite or metal tubes/pipes, along with various coverings and reinforcements such as, but not limited to, aramid, rubbers, metals and polymers, resulting in various dimensions across brands and models. The "Rattlesnake" segments (100, 1001, 1002, and 1003) in all embodiments will be designed to follow the dimensional and physical performance properties (e.g., bend radius) of hoses or tubes offered to the customer or user.

The Overall Diameter (OD) of the "Rattlesnake" segments (100, 1001, 1002, 1003) is set according to the hose size that it represents. For example, some segments can potentially have the same OD as another segment type; however, the flex angle of that segment can be different, indicative of another hose construction type and should not be used with a non-matching segment as the angle control components such as the control joint neck (104) and the control joint neck motion limit chamfer (111) shown in FIG. 12 on the segment (100), for instance, will not match and will cause a discrepancy. Thus, in order to prevent a mismatch, in an exemplary embodiment, the segments color-coded.

Segments (100, 1001, 1002, 1003) are preferably marked on the side to discern the size rating, and will be color-coded to discern construction/hose type, and will reflect their general size ('AN'/dash size or similar industry standard). Examples of these size markings are shown in FIG. 3, depicted as size marking (110). In exemplary embodiments, all diameters of the "Rattlesnake" segment have identical functionality and utility with approximately relative design or dimensions, which vary according to the required scale of the segment and the required bend radius, so that the movement is consistent across the complete segment size range.

In addition to the various outside diameters of hose, every hose type, even with similar or identical outside diameter can have different flexibility (bend radius) properties, and this should be clearly identified to the user so as to retain system design accuracy. For this purpose, in an exemplary embodiment, each segment type in a particular size is color-coded to identify it against the hose type or types that it represents, as shown in FIG. 46. There is also an option of embossing, engraving, or otherwise printing the outside diameter standard on the side of the segment body, as shown in FIG. 3 on the segment (100) with size marking (110).

There is an infinitely variable and expansive range of segment types (100, 1001, 1002, 1003) that may need to be developed in order to offer users analogs for common and specialized types of hoses, alternate brands/manufacturers, alternate dimensions (OD) and performance (such as MBR) configurations. As such, in other embodiments, the mode of connection of the segments (100, 1001, 1002, 1003) to the fitting tools (200) and/or Angle Adjustment and Length Adjustment Dial (300), may also be modified.

The segment examples shown are, accordingly, to be regarded in an illustrative rather than a restrictive sense. It will, however, be evident that additions, subtractions, deletions, and other modifications and changes may be made thereunto without departing from the broader spirit and scope of the inventions as set forth in the claims.

Figure 47:
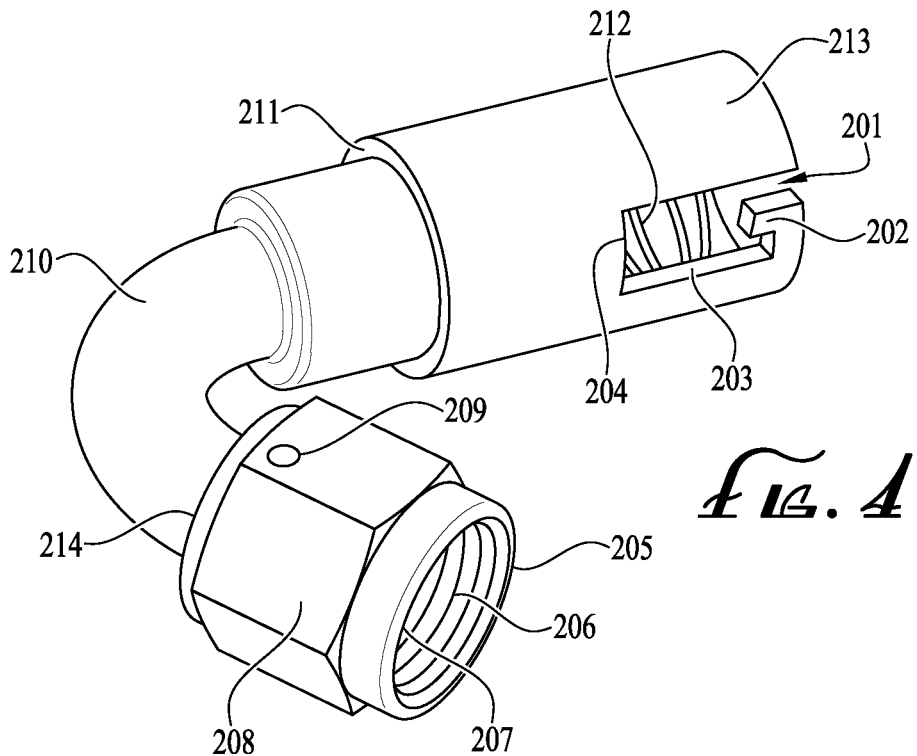
FIG. 47 is a perspective view of an embodiment of the fitting tool and its component parts.

Referring to FIG. 47, it shows a preferred embodiment of a fitting tool (200), comprising a segment receiver body (213) that is capable of accepting the male side (114) connector of the segment (100), as well as the female side (115) of the segment (100), as shown in FIGS. 57 and 58. Various embodiments of the fittings can be supplied to match the chosen design of the segment (100, 1001, 1002, 1003) for a particular application, according to the specification of the fitting tools (200).

Figure 48:
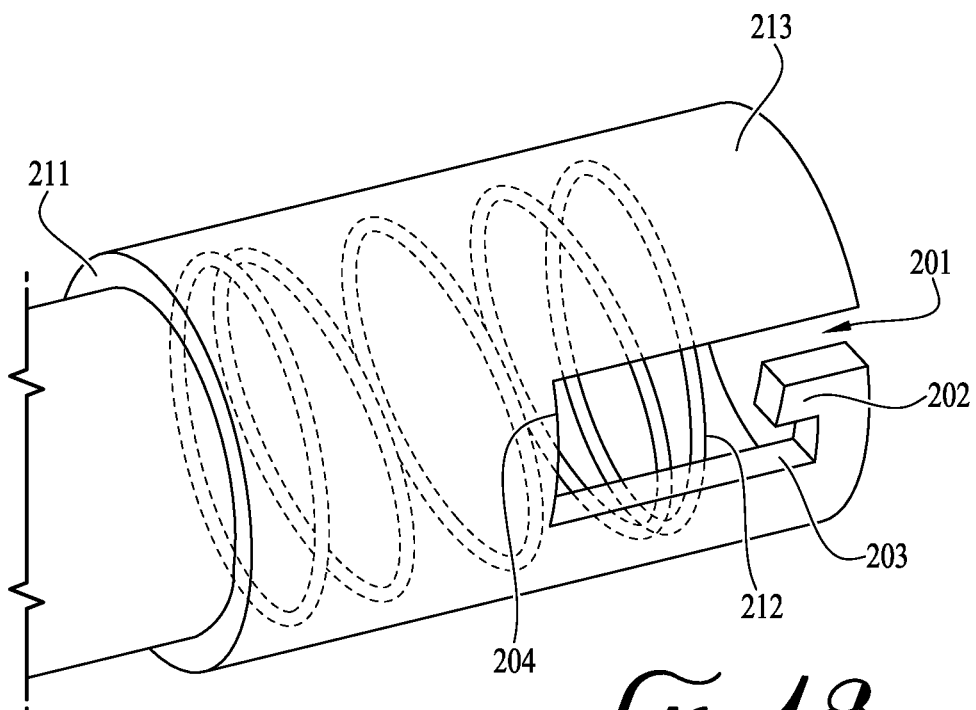
FIG. 48 is an enlarged perspective view of an embodiment of a fitting tool and its component parts.

As shown in FIGS. 47 and 48, the fitting tool (200) in exemplary embodiments comprise a segment receiver body (213), segment spine slot (201) by which the segment (100, 1001, 1002, 1003) is oriented at the nominal 0 degrees to the fitting tool (200) about the alignment mark/spine (106) on each segment (100), as shown in FIGS. 59 and 60. The fitting tool (200) also comprises a locking tab (202) to retain the inserted segment (100) in place. FIGS. 59 and 60 show the general method of connecting exemplary embodiments of the "Rattlesnake" segments (100) to the fitting tools (200) wherein the segment spine slot (201) and the alignment mark (106) on the segments are aligned. As shown in FIGS. 47 and 48, and FIGS. 59 and 60, the front edge of the segment's alignment mark/spine (106) is directed towards the angled guide edge (204) and the segment is allowed to rotate into position where it is retained in position against the locking tab (202).

The alignment of the fitting tool and the segment is critical to the accuracy of the final assembly, as such alignment is necessary to correctly set the final coordinates of the Angle Adjustment and Length Adjustment Dial (300) and the relative coordinates of each fitting tool (200) in the assembly. The segment receiver body (213) is an important part of the fitting tool (200) as it contains the datum and geometry relative to the design of the other components in the "Rattlesnake" system (e.g., 100, 1001, 1002, 1003 and 300). All geometry that is located beyond the segment receiver body (213) such as the fitting geometry analogue body (214) is modifiable or interchangeable according to the design of the real part (fitting) that the fitting tool (200) is made to represent.

The fitting tools (200) in various sizes and bend angles, as shown in FIGS. 49 through 56, are direct analogs of the actual production fittings, and are used to precisely determine the overall specification of the required fitting and its relationship to the segment count/length (e.g., 100, 1001, 1002, 1003) and Angle Adjustment and Length Adjustment Dial (300). There are precise datum built into the fitting tools (200) that are relative to the datum of the production fittings and those built into the segments (100, 1001, 1002, 1003) and the Angle Adjustment and Length Adjustment Dial (300), such that when assembled, reliable, repeatable and communicable, consistent data can be derived from the design of the assembly of components (100, 200, 300).

The fitting tools (200) are able to receive the various exemplary embodiments of the segments (100, 1001, 1002, and 1003) for which they are designed to accommodate and have them secured into the segment receiver body (213), which maintains the data for alignment and for length positioning when used in a chain, as shown in FIGS. 57 and 58.

The fittings shown in FIGS. 47 through 56 are general representations of the range of available fittings, which represent actual production parts. Referring to FIGS. 59 and 60, the fitting geometry analogue body (214) can be interchangeable and can be made to suit any available fitting type, design or industrial standard, and would be compatible with other embodiments of fitting tools (200) in various types of angles and segments (100, 1001, 1002, 1003).

FIG. 61 is a table of the various types of exemplary embodiments of connection types that share common geometry, scaled according to the intended hose type, and a range of alternate industry standard and common types of fitting tools that are capable of functioning within the functionality of the system. Included in that table are examples of various sub-components and features specific to a particular geometry, available for adaption to the segment receiver body (213) including, but are not limited to, 37 degree AN/JIC swivel and banjo-type connectors, in angles ranging from 0 degrees to 180 degrees as in FIGS. 49 through 54.

The embodiments of the fitting tool depicted in FIGS. 47 and 48 and identified in FIG. 61 pertain to a swivel "AN" type fitting, where the fitting geometry analogue body (214) includes a hex nut (208), attachment nut locking pin (209), fitting tube analogue (210), an internal sealing surface, fitting attachment thread (206). Features of the fitting analogue body are fully customizable in angle, size, manufacturing technique and proportions, in accordance with the fitting that it is built to represent, and will accurately represent the production fitting up to the hose termination datum (211) which is the point at which the fitting analogue body (214) terminates and the segment receiver body (213) begins.

The materials that comprise or form the fittings (200) in the preferred embodiments are preferably rigid, durable materials such as various grades of polymer, including but not limited to, Nylon PA, ABS, PP, PE, PC, PCABS, PS, TPE, PMMA, synthetic additive manufacturing polymers, composites, polymer/composite alloys, along with grades of Aluminum (Aluminum), Brass, Steel, Stainless Steel, Copper, Magnesium, and alloys.

Figure 62:
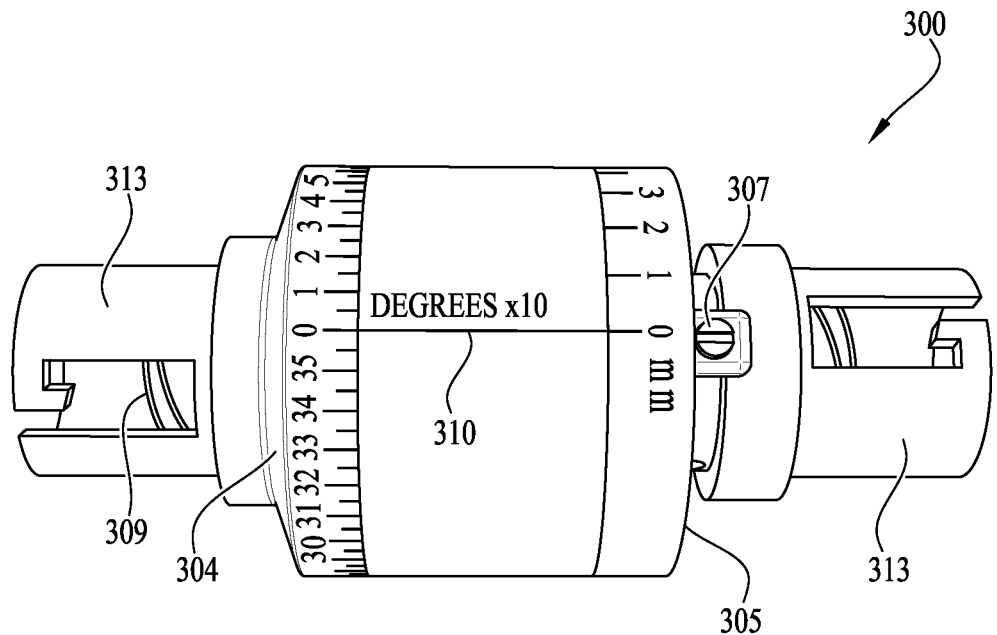
FIG. 62 is a perspective view of an embodiment of the Angle Adjustment and Length Adjustment Dial and its component parts.
Figure 63:
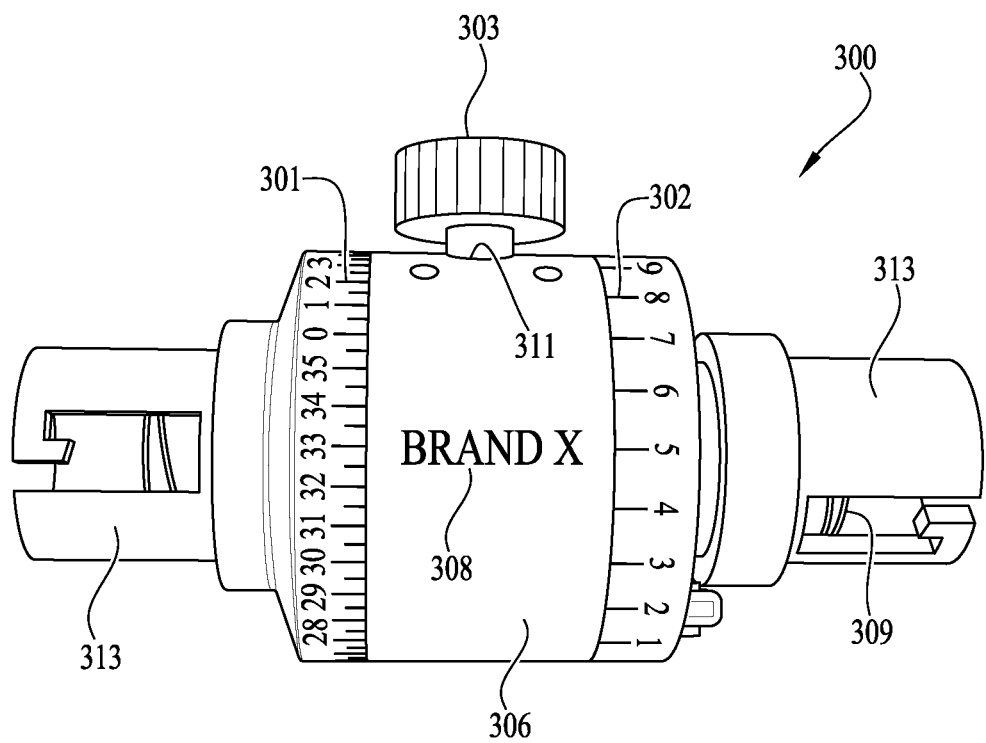
FIG. 63 is a perspective view of an embodiment of the Angle Adjustment and Length Adjustment Dial and its component parts.

FIGS. 62 and 63 depict the following features of the Angle Adjustment and Length Adjustment Dial (300) in an exemplary embodiment: angle degree marking dial (301), millimeter adjustment marking dial (302), position locking screw (303), clocking angle adjustment hemisphere (304), fine length adjustment hemisphere (305), dial center body (306) extension guide screw (307), logo marking area (308), retention spring (309), zero marking (310), locking screw hole (311), segment receiver body (313). These features are present in other size and form factor embodiments of the Angle Adjustment and Length Adjustment Dial (300).

The Angle Adjustment and Length Adjustment Dial (300) shown in FIGS. 62 and 63 is a general representation but is intended to adapt to all hose/segment (100, 1001, 1002, 1003) sizes as needed according to the mating design features, primarily affecting the area on the Angle Adjustment and Length Adjustment Dial (300) where the segments connect (313) and its component features, and may be changed or interchanged to accommodate the various segment (100, 1001, 1002, 1003) types and sizes that are offered.

Figure 64:
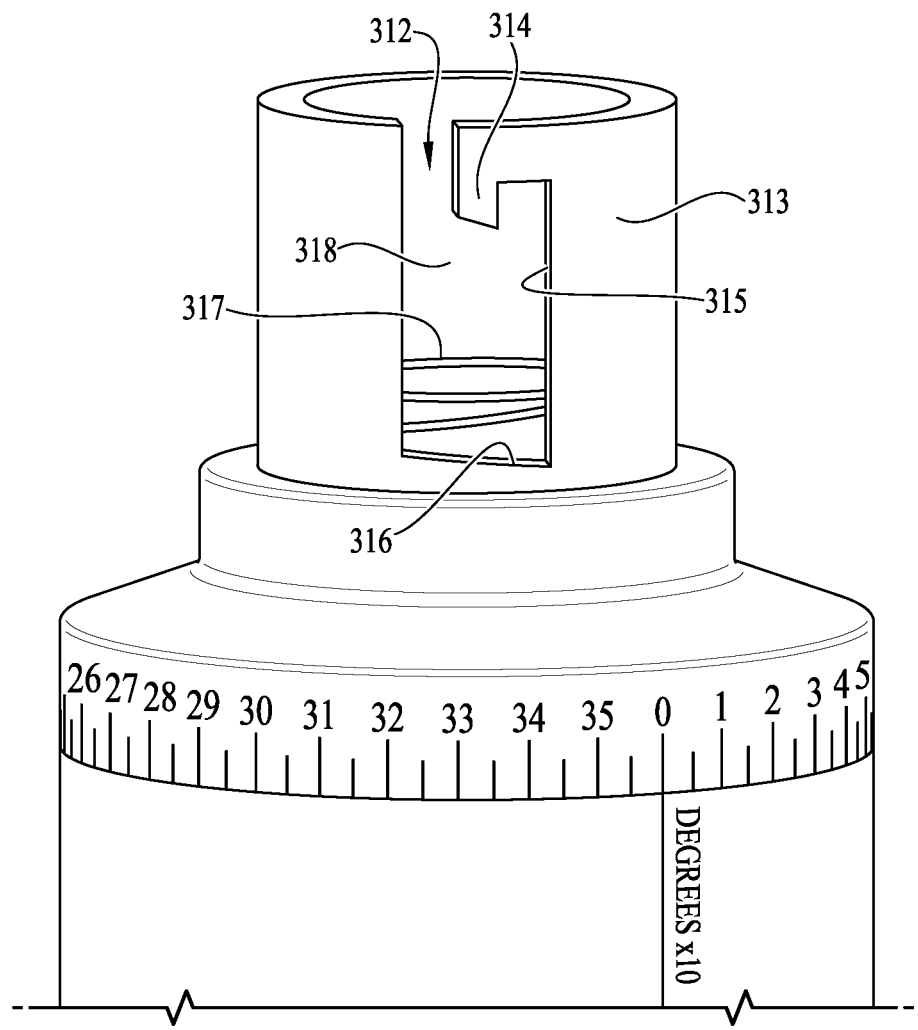
FIG. 64 is a perspective view of an embodiment of the Angle Adjustment and Length Adjustment Dial segment receiver body and its component parts.

FIGS. 62 through 64 show an exemplary embodiment of the Angle Adjustment and Length Adjustment Dial (300), comprising a segment receiver body (313) at each end of the dial that will accept the female and/or male ends of the segment (100) with identical features and function to the fitting tools (200) to accept or join the segments (100).

Figure 65:
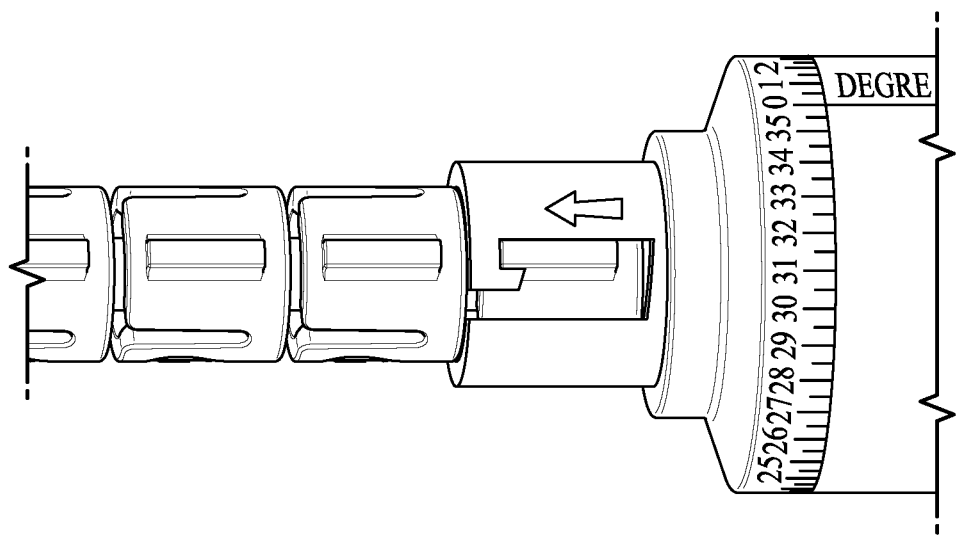
FIG. 65 is a perspective view of an embodiment of the Angle Adjustment and Length Adjustment Dial and its segment receiver body, depicting how a segment is inserted into the segment receiver body.
Figure 66:
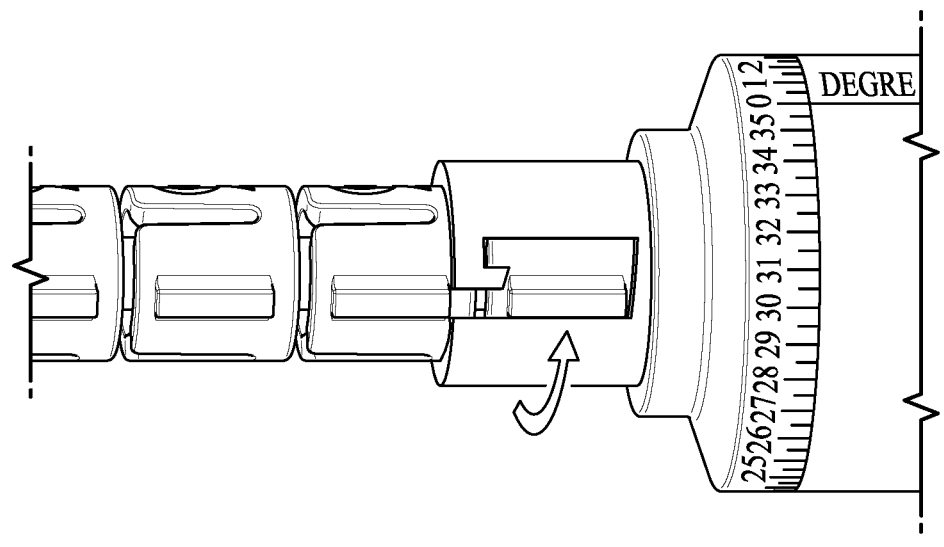
FIG. 66 is a perspective view of an embodiment of the Angle Adjustment and Length Adjustment Dial and its segment receiver body, depicting how a segment is inserted into the segment receiver body prior to rotating the segment into a locked position.
Figure 67:
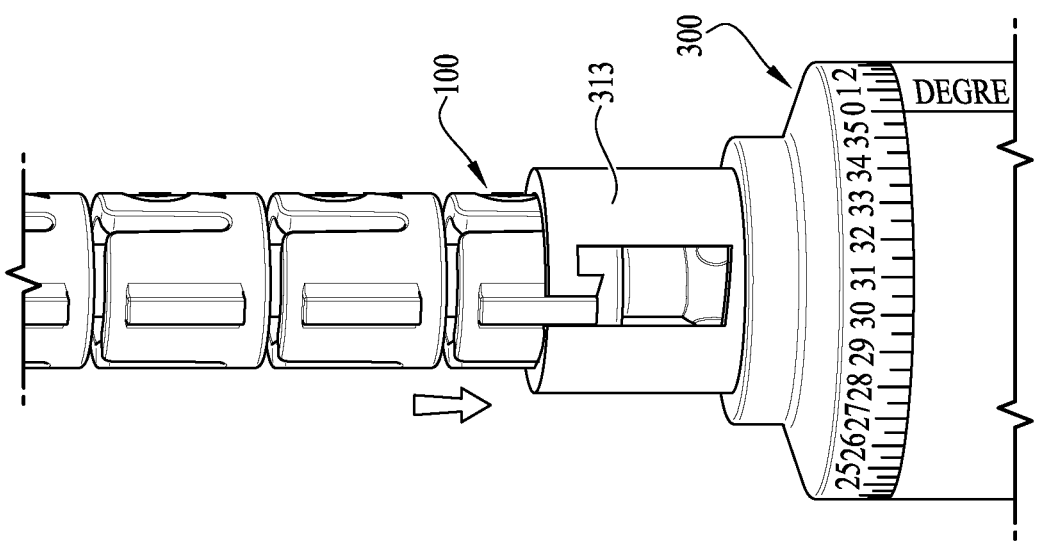
FIG. 67 is a perspective view of an embodiment of the Angle Adjustment and Length Adjustment Dial and its segment receiver body, depicting how the segment is set to a locked position.

Mating features for the segment (100, 1001, 1003, 1003) are located on the Angle Adjustment and Length Adjustment Dial (300), which comprise the segment spine slot (312), locking tab (314), 0 degree alignment edge (315), angled guide edge (316), retention and return spring (317), inside mating surface (318). These features afford the correct and consistent engagement and positioning of the segments consistent with the fitting tools (200) and provide accurate measurement information anywhere along the assembly. FIGS. 65 through 67 show the general method of connecting exemplary embodiments of the "Rattlesnake" segments (100) to the Angle Adjustment and Length Adjustment Dial (300), wherein the segment spine slot (312) and the alignment mark on the segments are aligned, and wherein the segment is turned into a locked position.

Figure 68:
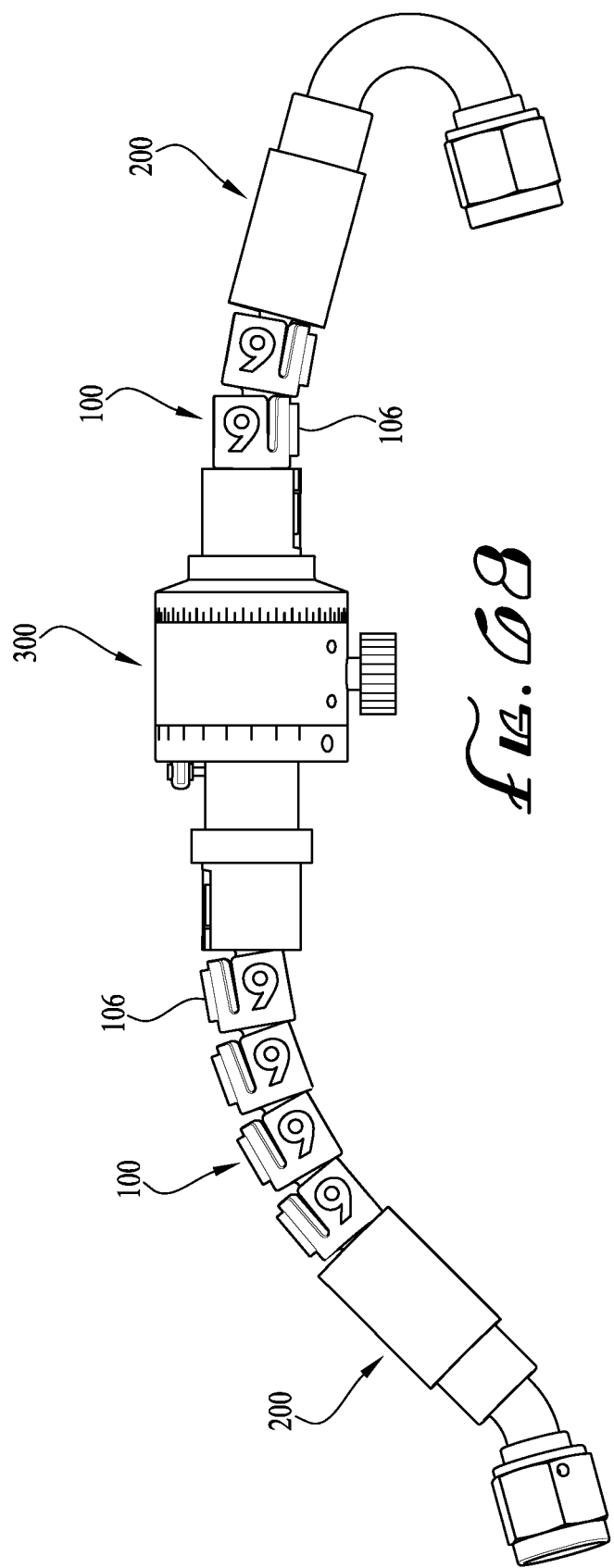
FIG. 68 is a side elevation view of an embodiment of the Angle Adjustment and Length Adjustment Dial in a position wherein said Angle Adjustment and Length Adjustment Dial can adjust the relative angle between 2 fitting tools in a short chain of segments.
Figure 69:
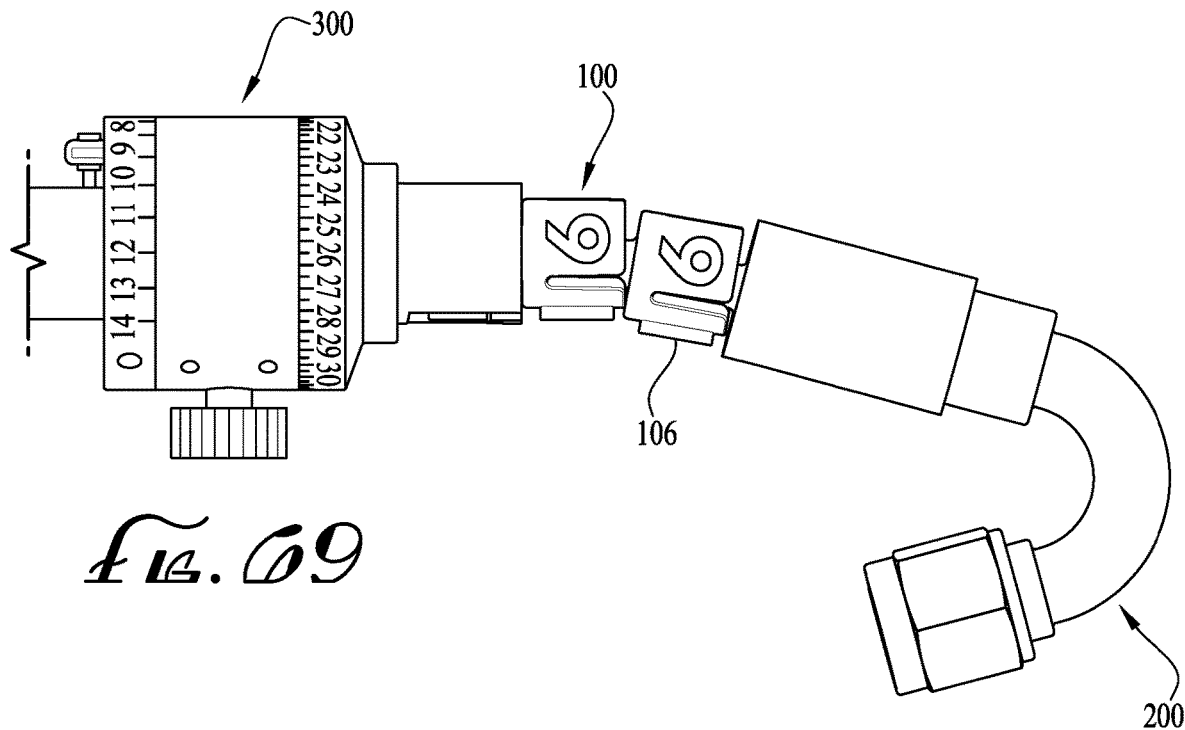
FIG. 69 is a side elevation view of an embodiment of the Angle Adjustment and Length Adjustment Dial and a mechanism to afford length adjustment in a chain of segments between fitting tools using the Angle Adjustment and Length Adjustment Dial.
Figure 70:
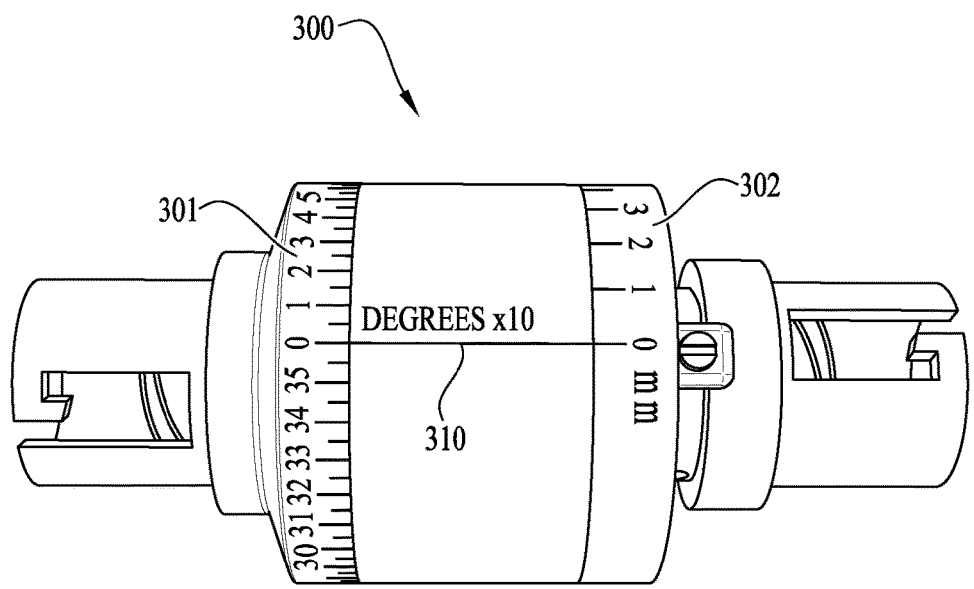
FIG. 70 is a perspective view of an embodiment of the Angle Adjustment and Length Adjustment Dial, showing an exemplary zero marking on said Angle Adjustment and Length Adjustment Dial.
Figure 71:
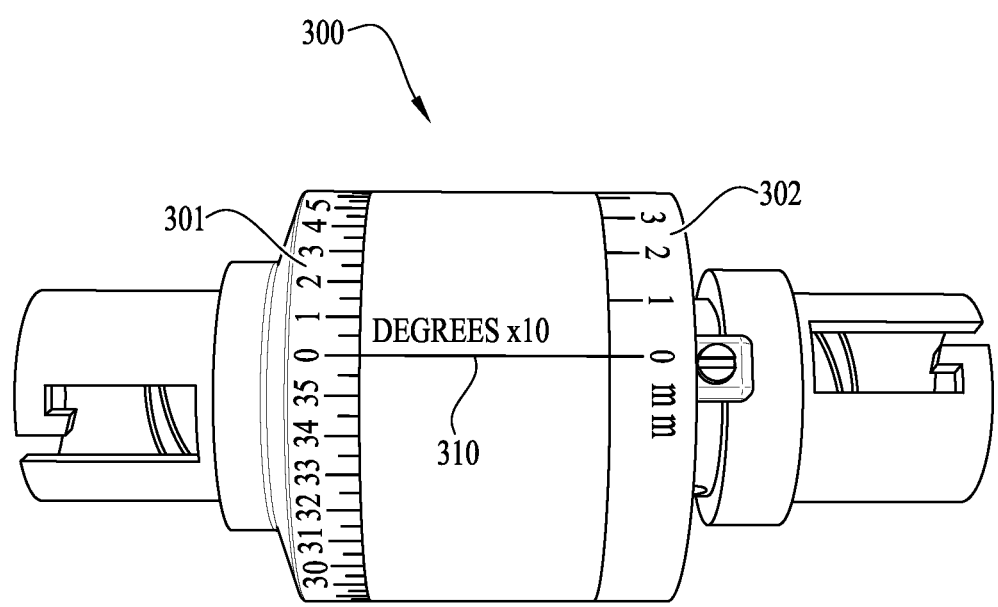
FIG. 71 is a perspective view of an embodiment of the Angle Adjustment and Length Adjustment Dial, depicting the measurement resolution of the angle and length markings on said Angle Adjustment and Length Adjustment Dial.

In the exemplary embodiment shown in FIG. 68 the Angle Adjustment and Length Adjustment Dial (300) is an instrument that can capture the critical angular orientation of the fitting tools (200) at each end of the "Rattlesnake" assembly relative to one another regardless of size, length or bend radius, precisely determining the overall specification and measurements of the prototype assembly analog. As shown in FIGS. 69 through 71, this information is provided on the Angle Adjustment and Length Adjustment Dial (300) as a readout through the angle degree marking dial (301), centered to the zero marking (310). The Angle Adjustment and Length Adjustment Dial (300) can be placed at any point along the segments (1000, 1001, 1002, 1003) and achieve the same result and accuracy, which are within the user's discretion.

In the exemplary embodiment as shown in FIGS. 69 and 70, the Angle Adjustment and Length Adjustment Dial (300) is an instrument that can capture and modify the fine adjustment of length in the assembly to precisely adjust the length between 2 fittings by less than the length of one additional segment (100, 1001, 1002) and providing a readout of the measurement on the millimeter adjustment marking (302), centered to the zero marking (310). The Angle Adjustment and Length Adjustment Dial (300) can be placed at any point along the segments (1000, 1001, 1002, 1003) and achieve the same result and accuracy, which are within the user's discretion.

The angle resolution of the angle degree marking (301) and length adjustment marking (302) shown in FIG. 71 is intended to represent the general principle of operation that is common to all sizes and types of hoses and fittings, and is not intended in a restrictive sense, and depending on size or application could show an angle resolution of less than 1 degree of angle, or 1 mm of length, or utilize a digital readout for finer adjustment.

The Angle Adjustment and Length Adjustment Dial (300) in an exemplary embodiment is unique to a particular size of hose segments (100, 1001, 1002, 1002) but alternatively could be adjusted in such a way that it is easily adaptable to the entire range of sizes of segments (100, 1001, 1002, 1003) with adaptors available to attach the appropriate segment receiver (313). Other design factors are determined by the material type, size constraints for packaging and need for analog or digital angle readouts.

As shown in FIGS. 72 and 73, the Angle Adjustment and Length Adjustment Dial (300) is part of the sample "Rattlesnake" assembly. These figures depict the method by which the fitting (300) interacts with the other components of the assembly, which comprises the fitting tools (200) and a number of segments (100), with the Angle Adjustment and Length Adjustment Dial (300) set to 0 degrees (its nominal position), with a consistent, uniform alignment being shown on the segments (100) at the alignment mark (106) and on the fitting tools (200) at the 0 degree alignment edge (203).

The following features allow for the accurate and repeatable re-orientation of the Angle Adjustment and Length Adjustment Dial (300): the segment receiver body (313) align the fitting (300) to the preferred embodiment of the segments (100), to the 0 degree alignment edge (315) to the clocking angle adjustment hemisphere (304) or the fine length adjustment hemisphere (305) (where equipped) which align about the zero marking (310) of the dial center body (306).

Figure 74:
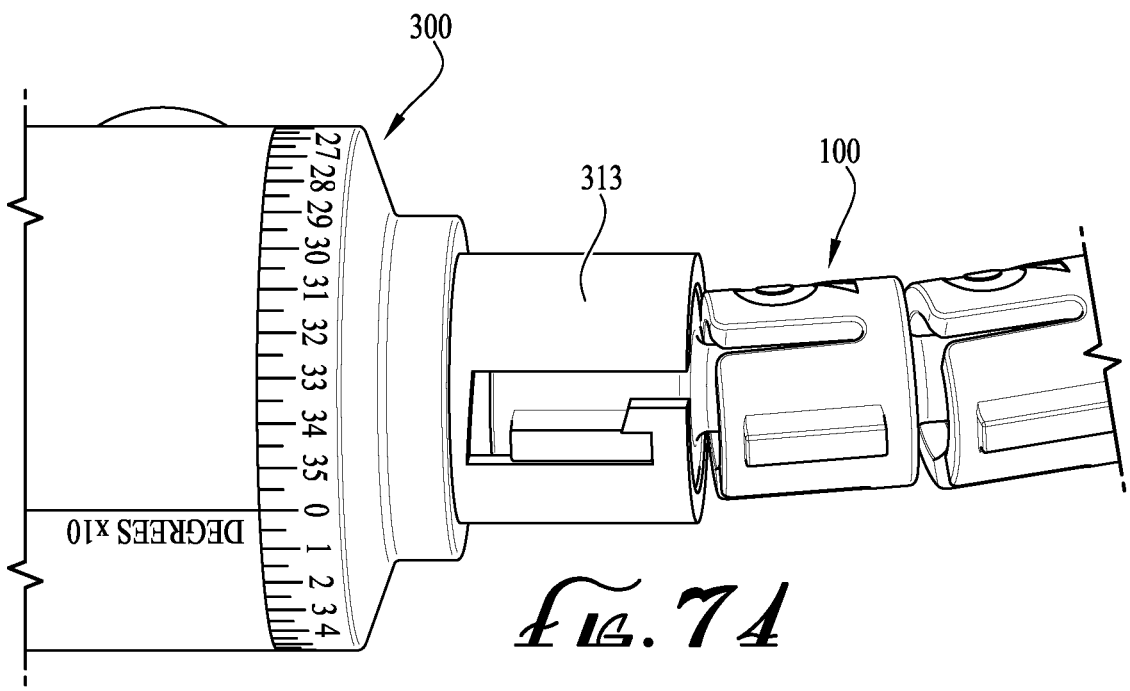
FIG. 74 is a perspective view of an embodiment of the Angle Adjustment and Length Adjustment Dial and its segment receiver body, connected to a segment and in a locked position.
Figure 75:
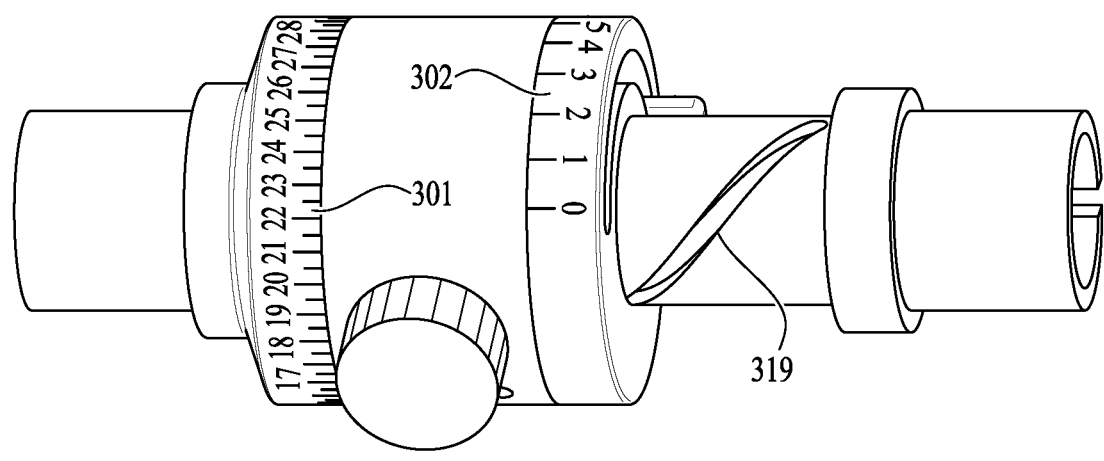
FIG. 75 is a perspective view of an embodiment of the Angle Adjustment and Length Adjustment Dial and its segment receiver body, showing its extension channel.
Figure 76:
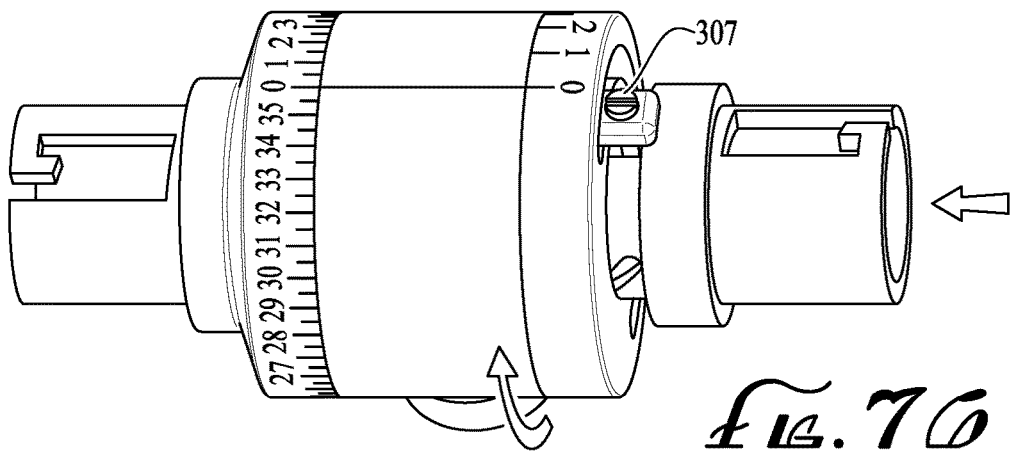
FIG. 76 is a perspective view of an embodiment of the Angle Adjustment and Length Adjustment Dial and its segment receiver body, showing rotation of the millimeter adjustment marking dial for fine length adjustment.
Figure 77:
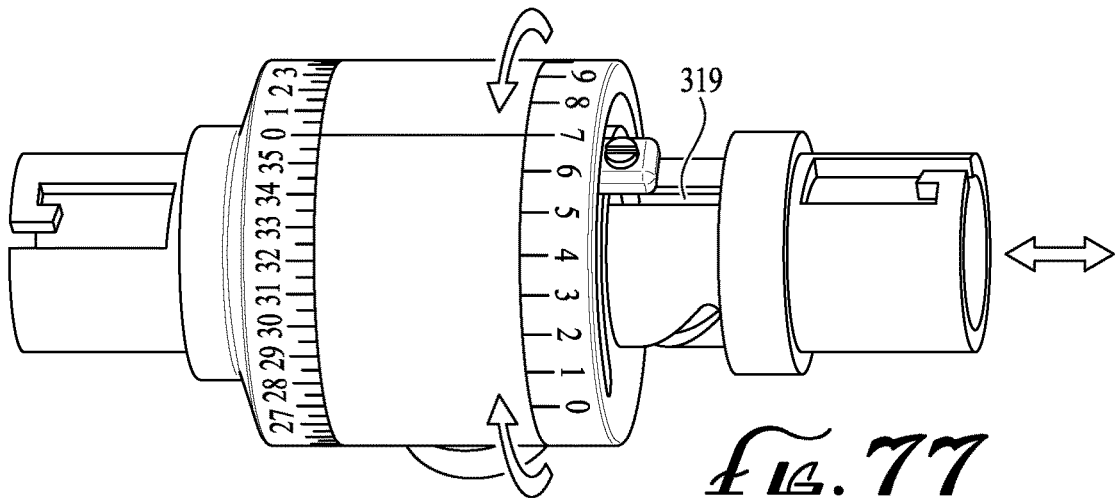
FIG. 77 is a perspective view of an embodiment of the Angle Adjustment and Length Adjustment Dial and its segment receiver body, showing rotation of the millimeter adjustment marking dial for fine length adjustment.
Figure 78:
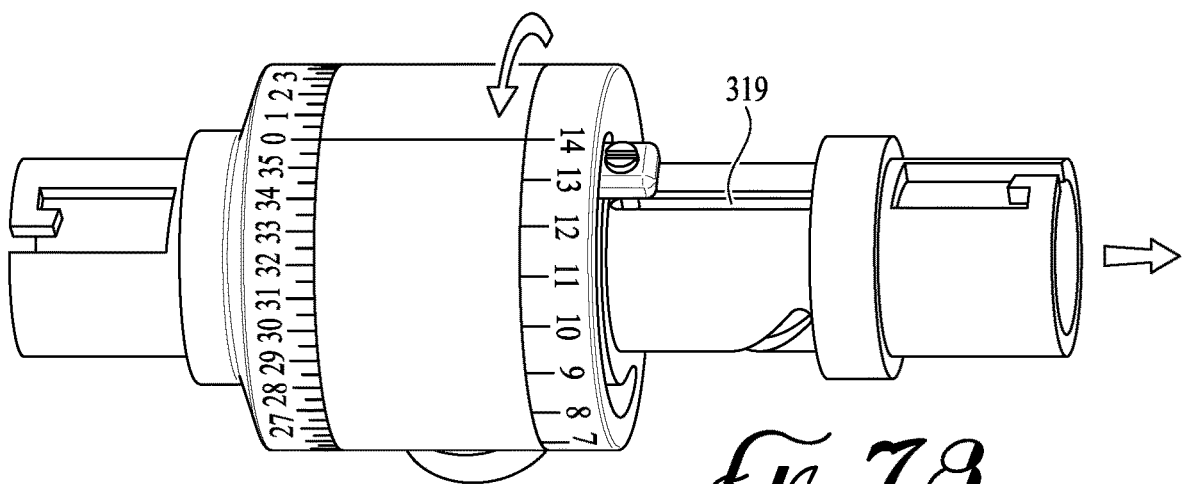
FIG. 78 is a perspective view of an embodiment of the Angle Adjustment and Length Adjustment Dial and its segment receiver body, showing rotation of the millimeter adjustment marking dial for fine length adjustment.
Figure 79:
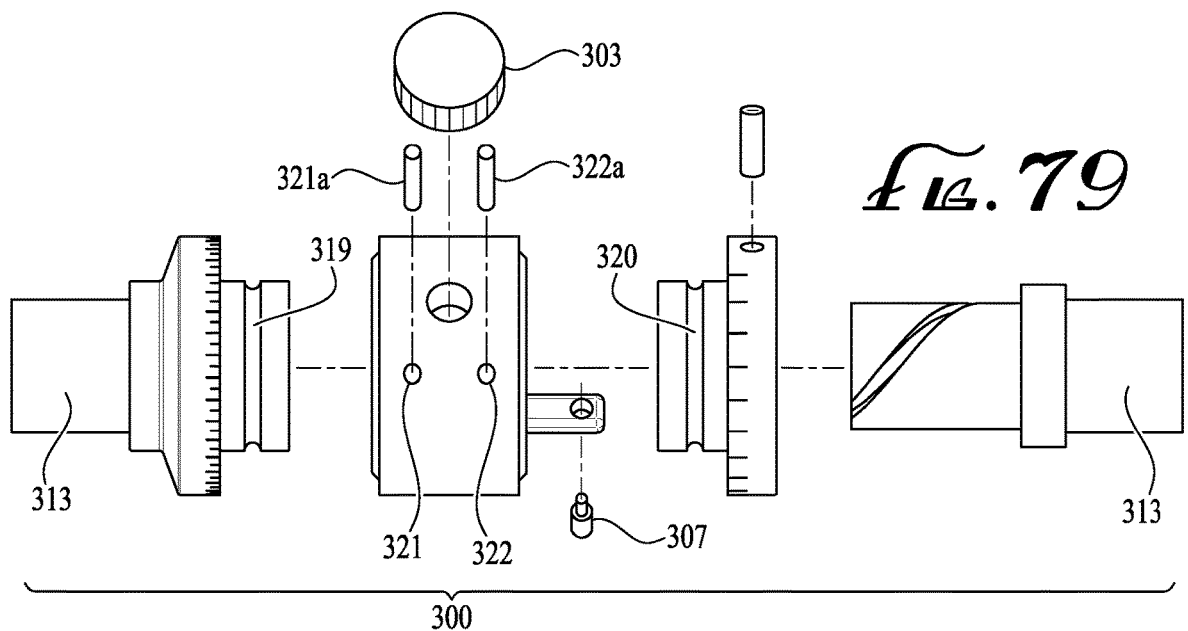
FIG. 79 is an exploded elevation view of an embodiment of the Angle Adjustment and Length Adjustment Dial and its components.
Figure 80:
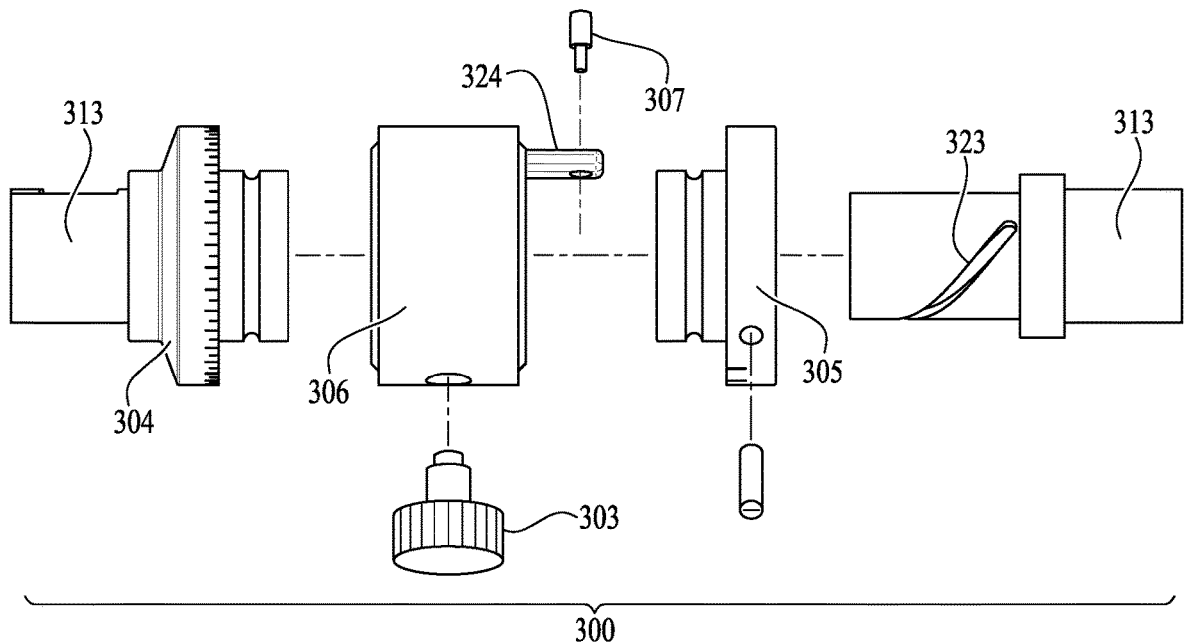
FIG. 80 is an exploded elevation view of an embodiment of the Angle Adjustment and Length Adjustment Dial and its components.
Figure 81:
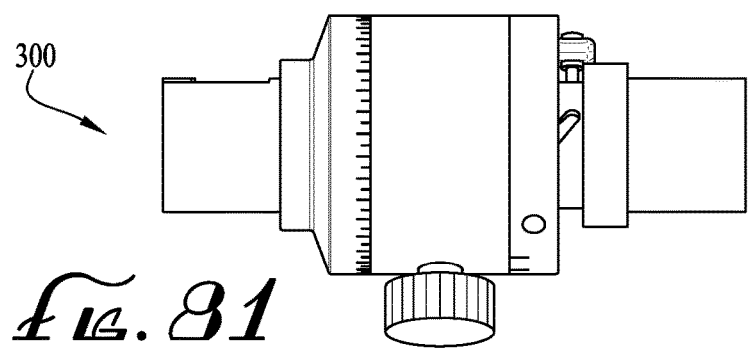
FIG. 81 is a perspective view of an embodiment of the Angle Adjustment and Length Adjustment Dial.

FIG. 74 shows the features that ensure that the segment (100) is positioned correctly into the segment receiver body (313) so as to avoid positioning errors. These features include the segment spine slot (312) which is the keyway to insert the 0 degree alignment mark/spine (106) present on the segment (100). The segment (100) is guided into position, along the face of the inside mating surface (318) and pushes against the retention and return spring (317) (which is used both to retain the segment in its position against the locking tab (314) and the 0 degree alignment edge (315) or to return the segment through the spine segment slot (312) upon disassembly). As shown in FIGS. 65 through 67, the front edge of the segment's 0 degree alignment mark/spine (106) is directed towards the angled guide edge (316) and the segment is allowed to rotate into position against the 0 degree alignment edge (315) where it is returned and retained in position against the locking tab (314) by the retention and return spring (317).

As shown in FIGS. 74 through 78, and referring to FIGS. 62 and 63, the readouts provided by the Angle Adjustment and Length Adjustment Dial (300) for both angle and length adjustment are shown by the relative positions of the clocking angle adjustment hemisphere (304) and the fine length adjustment hemisphere (305), each of which includes a segment receiver body (313) which maintains the segment (100) orientation to their relative 0 degree marking, either on the angle degree marking dial (301) or in the case of the fine length adjustment hemisphere (305) it is always relative to the zero marking (310), relative to their position to the zero marking (310) located on the dial center body (306). From these readouts based on the positioning described, the measurements can then be accurately observed. The position of the dials can be secured with the position locking screw (303), placed in the screw hole for the locking screw (311) that when tightened engages the shaft (319), fixing the position of the clocking angle adjustment hemisphere (304) and the fine length adjustment hemisphere (305) simultaneously to the dial center body (306), in-turn securing all other components attached to the dial, such as the segments (100) and the fitting tools (200).

FIGS. 79 through 82 depict the various components of the Angle Adjustment and Length Adjustment Dial (300). Shown in these figures are the clocking angle adjustment hemisphere (304) and fine length adjustment hemisphere (305), each with a segment receiver body (313), and their mechanical features relating to their operation and relationship to the dial center body (306), including the method for retaining the hemispheres to the body with lock pin holes (321, 322) and the channels on the hemispheres (319, 320). Also depicted are features specific to the fine length adjustment hemisphere (305), rotational controller (305a), extender body (305b), rotational control channel (325), the rotational control channel minimum limit (328), the rotational control channel maximum limit (329), the motion control pin (326) which strikes the maximum and minimum rotational limits (329, 328), the channel guide (319), the extension channel (323), the guide pin mount (324) and the guide channel pin mount hole (327).

An embodiment of the Angle Adjustment and Length Adjustment Dial shown in FIGS. 84 and 85 shows an O-ring seal (341) and O-ring channels (342, 343) which provide rotational interference so as to stabilize the turning motion and to assist in the control of axial motion of the moving hemispheres (304, 305) about the dial center body (306). The hemispheres (304, 305) are affixed to the dial center body (306) with assembly locking pins (321a, 322a) in the lock pinhole (321, 322), into the locking pin channels (319, 319a, 320, 320b).

Exemplary embodiments of the Angle Adjustment and Length Adjustment Dial (300) may have angular graduations printed on to it (301, 302), applied as a label or laser marked directly onto the body of the fitting (306) or either hemisphere (304, 305). All markings at 0 degrees correspond to the zero degree mark (310) and to the nominal positions of the 0 degree alignment edges (315) on the hemispheres (304, 305).

Exemplary embodiments of the Angle Adjustment and Length Adjustment Dial (300) are formed from various grades of durable metals or composites that are durable under heavy or repeated use.

Figure 90:
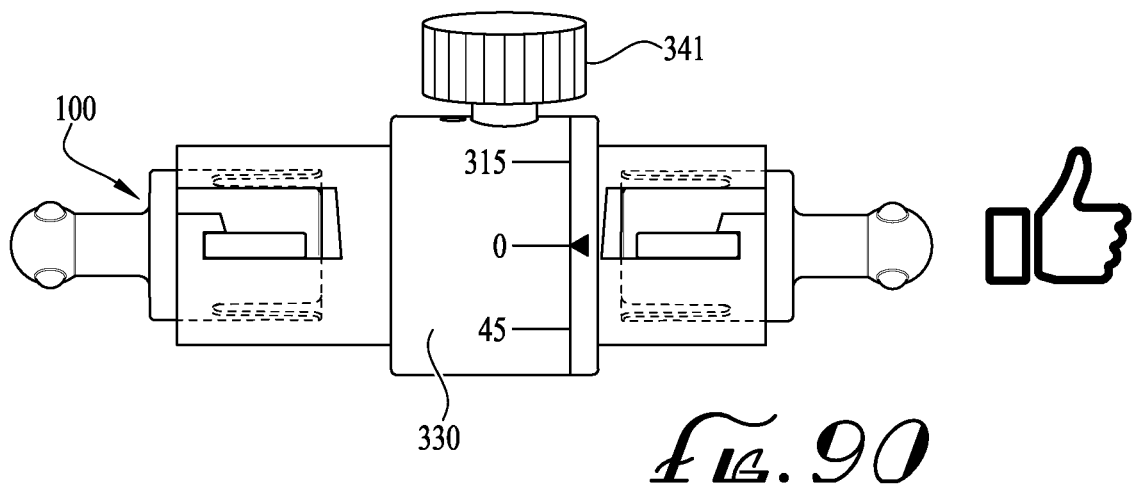
FIG. 90 is a side elevation view of an embodiment of the Mini Angle Dial, depicting orientation of the segments inserted into said fitting.
Figure 91:
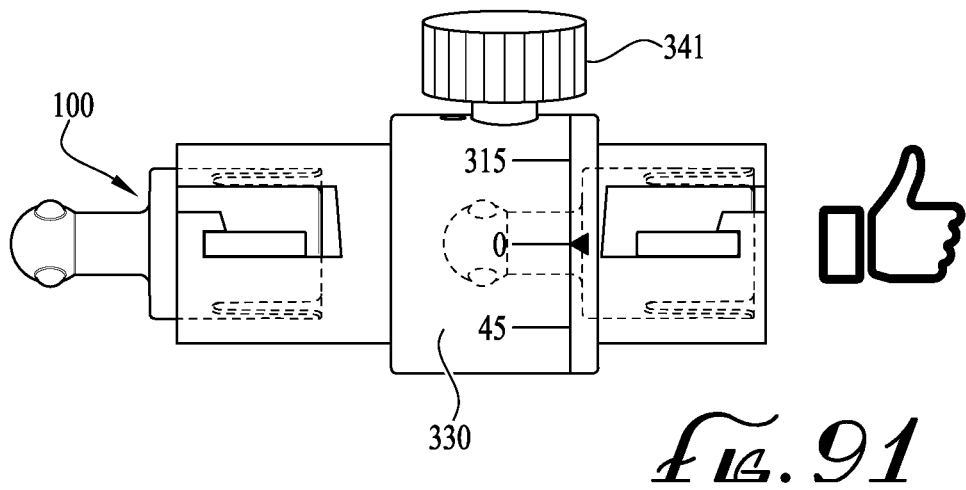
FIG. 91 is a side elevation view of an embodiment of the Mini Angle Dial, depicting orientation of the segments inserted into said fitting.
Figure 92:
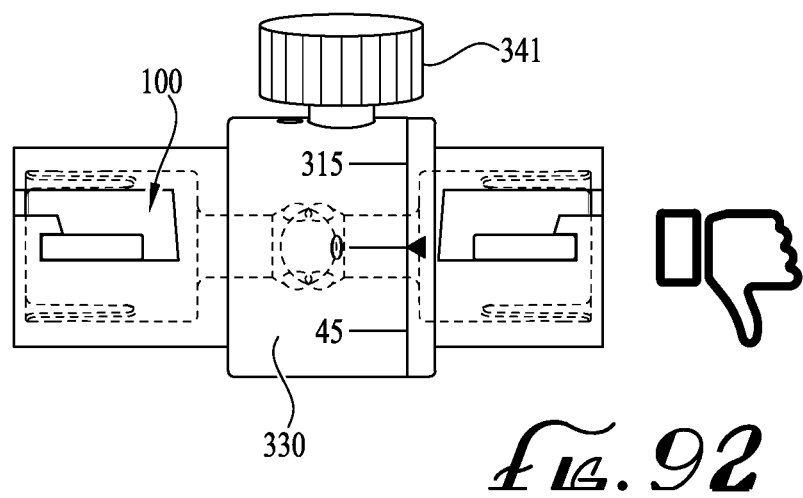
FIG. 92 is a side elevation view of an embodiment of the Mini Angle Dial, depicting an incompatible orientation of the segments to be inserted into said fitting.
Figure 93:
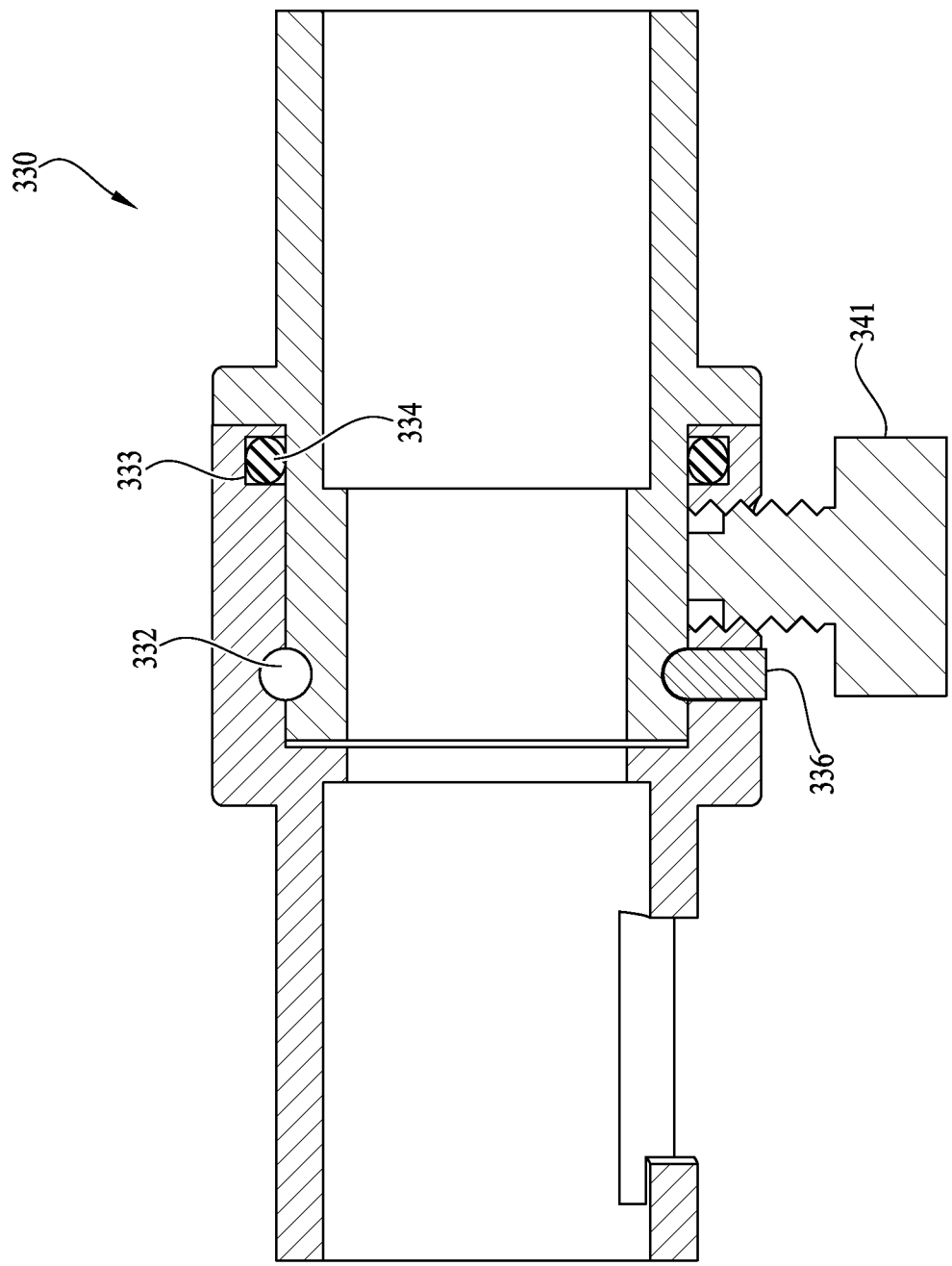
FIG. 93 is a cross-sectional view of the Mini Angle Dial depicted in FIG. 89, taken long line 93-93 in FIG. 89.
Figure 94:
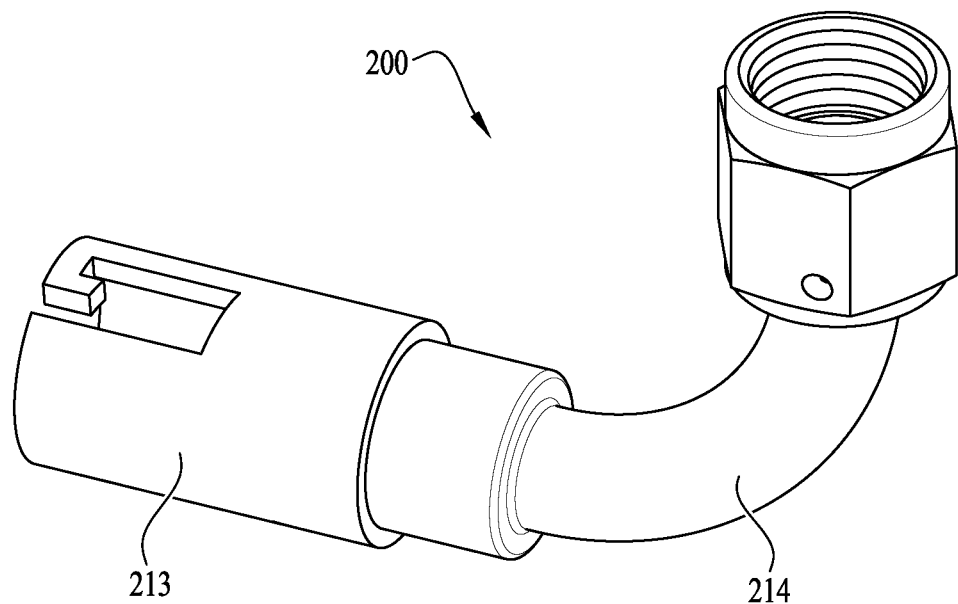
FIG. 94 is a perspective view of an embodiment of the fitting tool.
Figure 95:
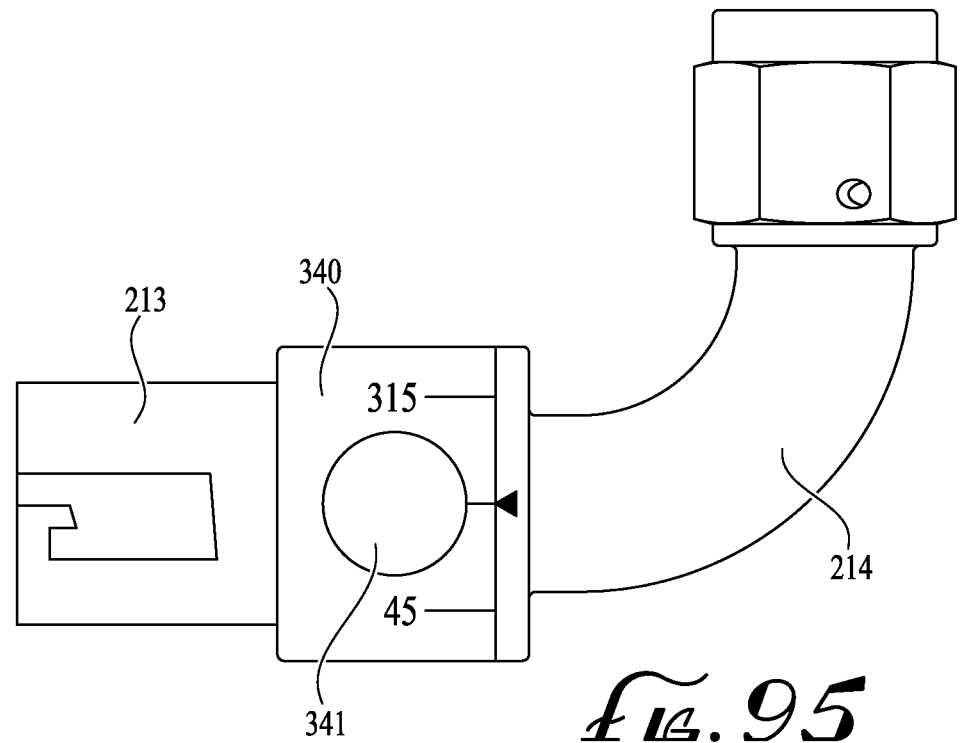
FIG. 95 is a side elevation view of an embodiment of the Angle Adjustment and Length Adjustment Dial in an alternate form factor.

FIGS. 86 through 99 depict exemplary embodiments of the Angle Adjustment and Length Adjustment Dial (300), including an embodiment of it in an alternate form factor referred to herein as the Mini Angle Dial (330). The Mini Angle Dial (330) can be used in alternative or specialized form factors such as those with reduced size, changed proportions, or adapted into embodiments of the fitting tools so that they can be used without obstruction in a user's specialized or compact work space. As shown in FIGS. 87 through 99, Mini Angle Dial (330) is comprised of the following features: Segment Receiver (313), angle marking hemisphere (335), selector hemisphere (337), lock pin hole (340), retention spring (331), lock channel (332), center mark (338), lock screw hole (342), lock screw (341), lock pin (336) angle graduations (339). FIGS. 90 through 92 depict an exemplary mode of connection of the segments (100) to the Mini Angle Dial (330), through the segment's male and female ends. FIG. 90 shows the female side-to-female side connection configuration to the segment receiver body. FIG. 91 shows the female side-to-male side connection configuration to the segment receiver body. FIG. 92 shows an attempted male side-to-male side connection configuration which, in the exemplary embodiments depicted herein, is not configurable in the shown manner.

Figure 98:
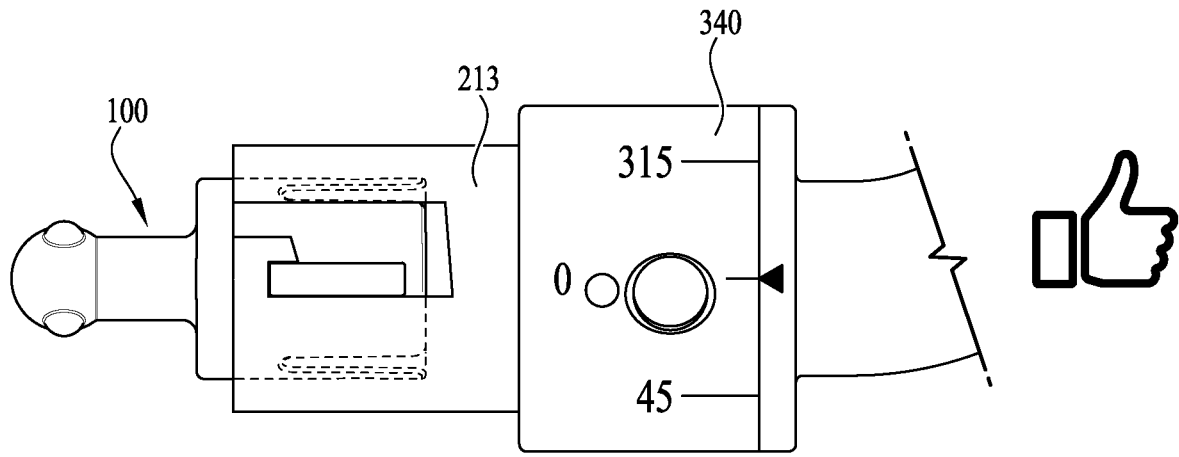
FIG. 98 is a side elevation view of an embodiment of the Angle Adjustment and Length Adjustment Dial in an alternate form factor, depicting orientation of the segment inserted into said fitting.
Figure 99:
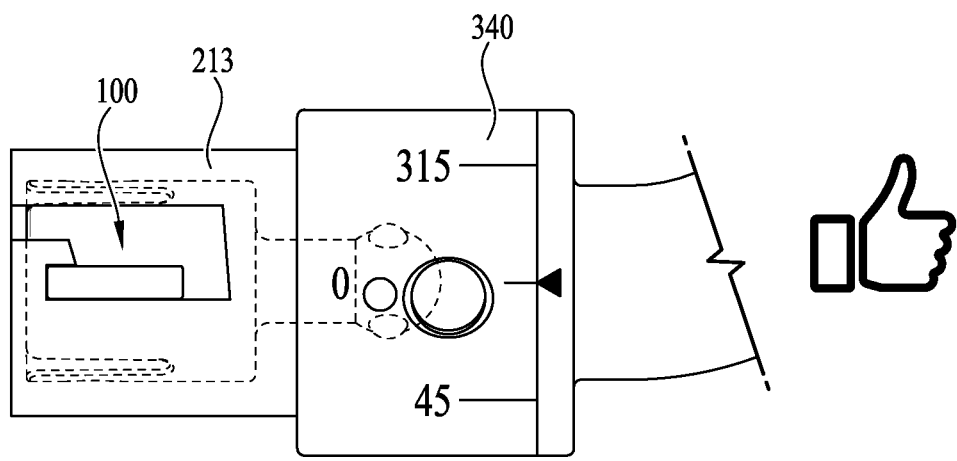
FIG. 99 is a side elevation view of an embodiment of the Angle Adjustment and Length Adjustment Dial in an alternate form factor, depicting orientation of the segment inserted into said fitting.
Figure 103:
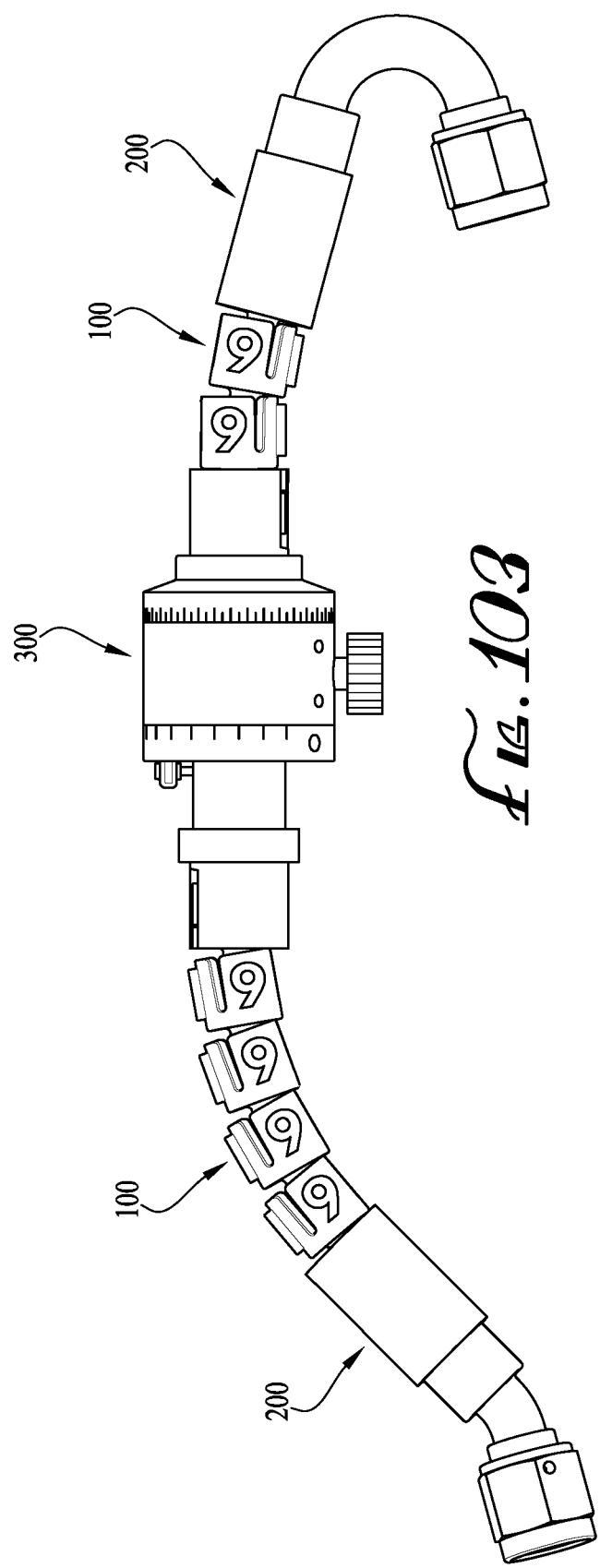
FIG. 103 is a side perspective view of an exemplary segment assembly incorporating an embodiment of an Angle Adjustment and Length Adjustment Dial and angled fitting tools.

FIGS. 95 through 99 depict exemplary embodiments of the Adjustment and Length Adjustment Dial in an alternate form factor integrated into a fitting tool (200) so as to maintain the compactness of the system and so as to not interfere with the construction of a prototype where there is not the space or routing to afford the use of either the full size Angle Adjustment and Length Adjustment Dial (300) or the compact version (Mini Angle Dial) (330). This alternative embodiment is comprised of the following features: Segment Receiver (313, angle marking hemisphere (335), selector hemisphere (337), lock pin hole (340), retention spring (331), lock channel (332), center mark (338), lock screw hole (342), lock screw (341), lock pin (336) angle graduations (339), mated to any form of fitting geometry analogue body (214) as previously shown in FIGS. 47 through 56, and used in the same way. FIGS. 98 and 99 show an exemplary mode of connection of a segment (100) to an embodiment of the Angle Adjustment and Length Adjustment Dial in an alternate form factor. FIG. 98 depicts a connection configuration wherein the female end of a segment is inserted into the segment receiver body. FIG. 99 depicts a connection configuration wherein the male end of a segment is inserted into the segment receiver body.

The principle of operation shown of the Angle Adjustment and Length Adjustment Dial (300) is of a preferred embodiment, not intended in a restrictive sense with there being the opportunity to enhance, remove or scale the features listed so to package the assembly into alternate sized embodiments, or embodiments with alternate or additional features offered.

In an alternate embodiment, the Angle Adjustment and Length Adjustment Dial (300) may be digital, wherein the setting(s) of the angle(s) described in the embodiments above would be identical, but with the added complications of electronic controls for power and for resetting the system.

Assembly of all jointed segment types (100, 1001, 1002) in the method shown in FIG. 100, which is an exemplary embodiment of the design, whereby each segment (100) male side of the component (114) is connected to the female side (115) of the subsequent component ensuring that the 0 degree alignment spine (106) on each segment is on the same side of alignment spine (106) of the adjacent components. This mode of assembly is applicable to 3 embodiments of the segment (100, 1001, 1002). Multiples of the same size and type segments (100, 1001, 1002) as described above, can be assembled end-to-end, in an unlimited length as required by the user to achieve their intended design.

For other segment embodiments, such as depicted in FIGS. 41 through 45, i.e., segment (1003), the segment is cut to the appropriate length based on the user's requirements.

FIGS. 101 and 102 each depict an exemplary segment assembly comprised of three components, with the last segment (100, 1001, 1002, 1003) in the chain at each terminating end, is inserted, pushed into, clipped into or otherwise attached to the segment receiver body (213) of the fitting tools (200), through either the male side (114) or the female side (115) of the segment. Additional segments (100, 1001, 1002) are added or removed in order to increase or decrease the length of the assembly and routing between the ends of the assembly.

Figure 104:
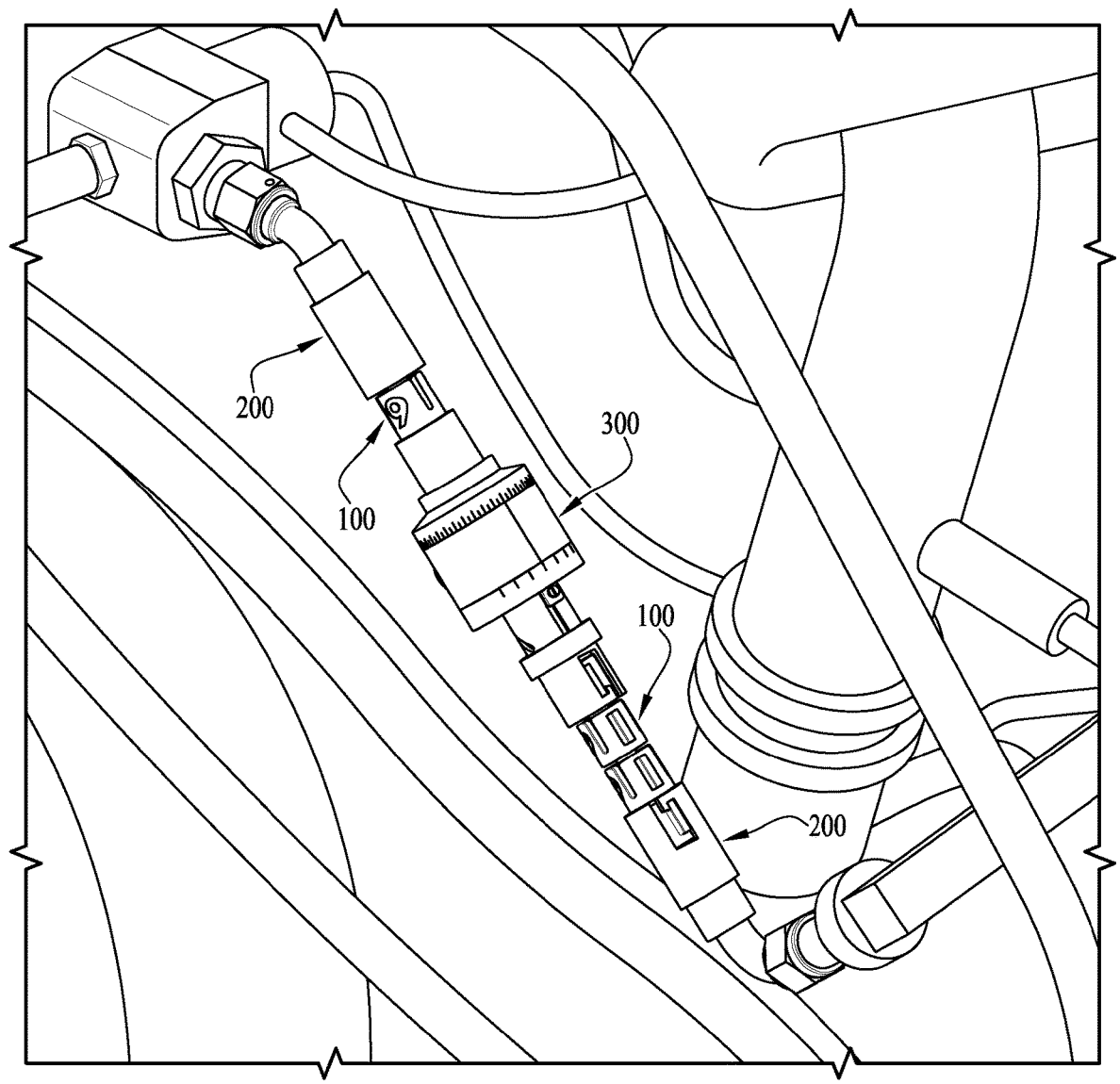
FIG. 104 is a perspective view of the exemplary segment assembly in an exemplary workspace.

FIGS. 103 through 106 depict exemplary segment assemblies incorporating an embodiment of an Angle Adjustment and Length Adjustment Dial and angled fitting tools. To add the ability to change the angle between the 2 fittings depicted herein, the male side (114) or female side (115) of a segment (100) in the chain is inserted into the Angle Adjustment and Length Adjustment Dial (300) where the angle as well as fine adjustment of the length of the chain can be set as has been previously described. The angle may be changed between two fittings, or at any position within the assembly. FIG. 104 is a perspective view of the exemplary segment assembly in an exemplary workspace.

Figure 105:
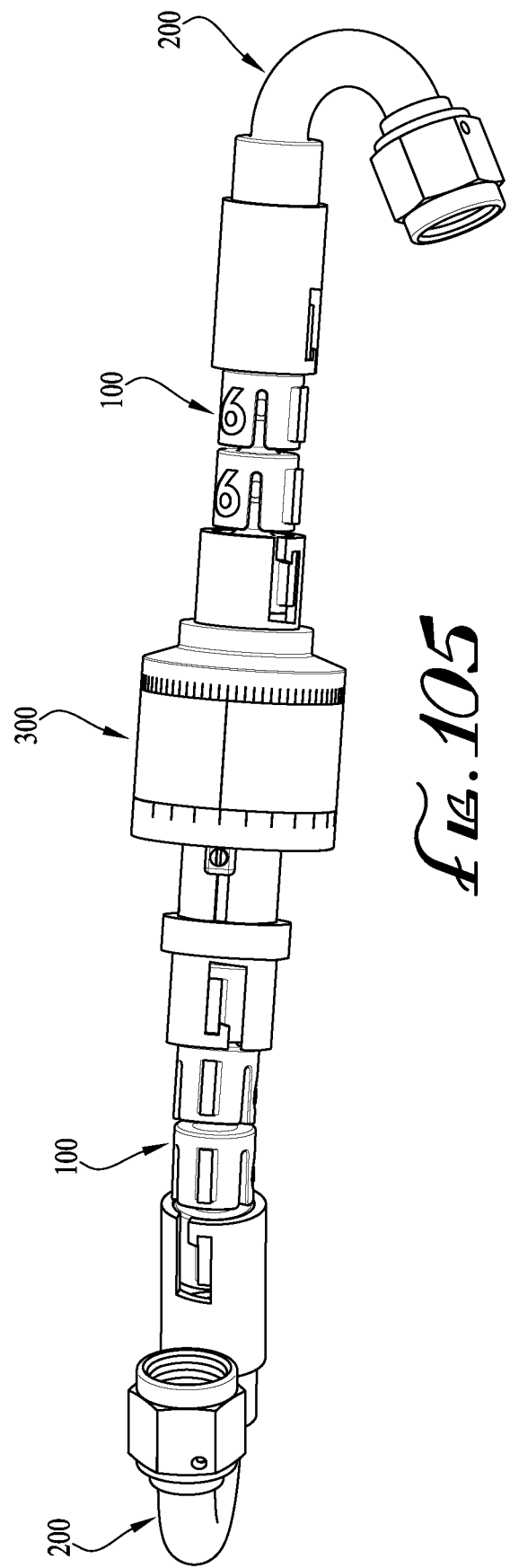
FIG. 105 is a perspective view of an exemplary segment assembly incorporating an embodiment of an Angle Adjustment and Length Adjustment Dial and angled fitting tools.
Figure 106:
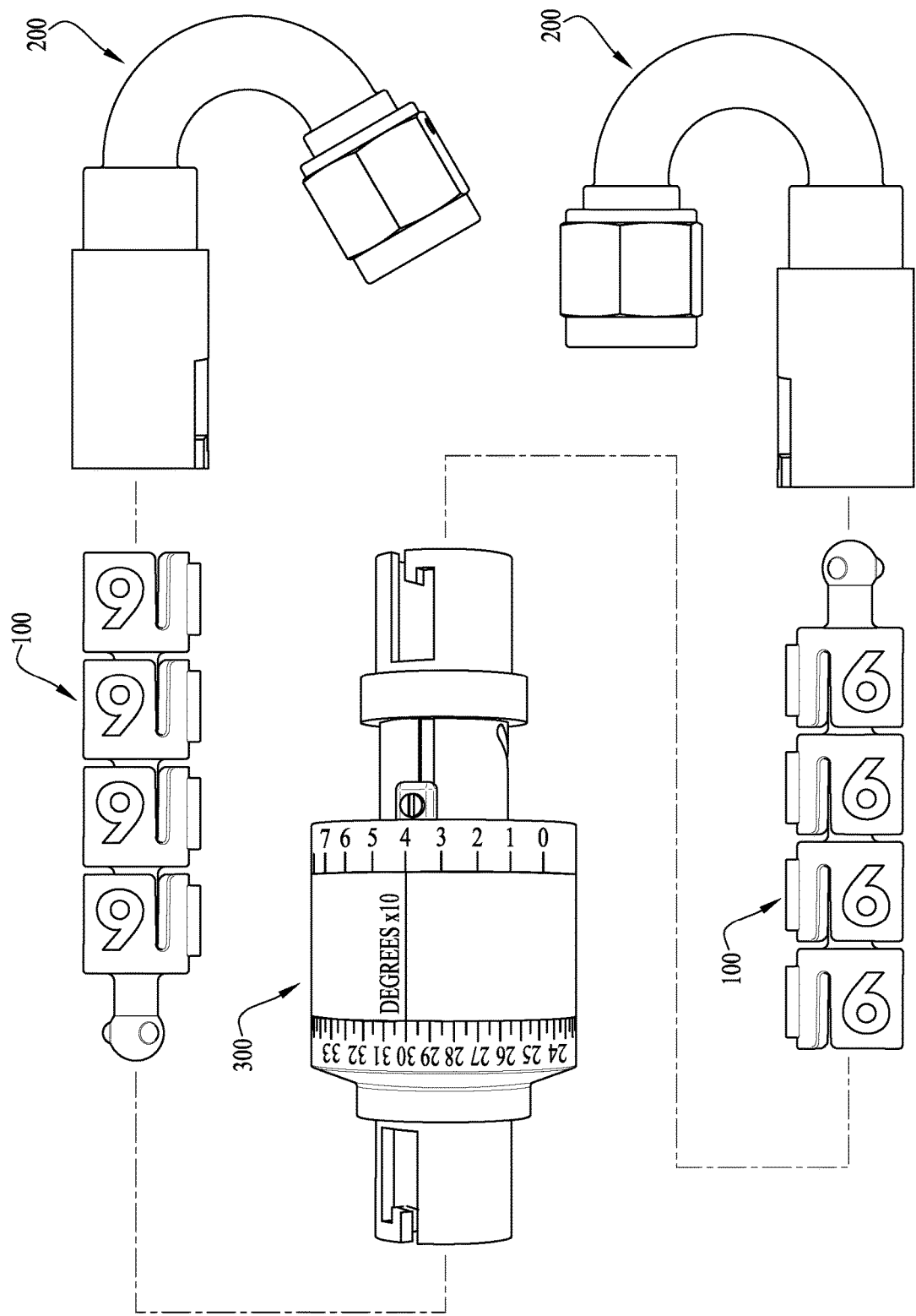
FIG. 106 is an exploded side elevation view of an exemplary segment assembly incorporating an embodiment of an Angle Adjustment and Length Adjustment Dial and angled fitting tools.

FIGS. 105 and 106 each depict a chain of segments (100) equipped with 2 fitting tools and an Angle Adjustment and Length Adjustment Dial (300), with angle(s) adjusted to the user's specification, with all components aligned to their respective mating features at 0 degrees, with only the Angle Adjustment and Length Adjustment Dial (300) modifying the relative angle between the 2 fitting tools (200), but with all datum points on all components preserved and readings measurable, any combination of number of segments (100) of the same size and type, the type of fitting tools (200) and angle or length input on the Angle Adjustment and Length Adjustment Dial (300).

Additional segments (100, 1001, 1002, or length of 1003) are added and removed in order to reach the correct length and routing on each side of the Angle Adjustment and Length Adjustment Dial (300) and fitting tools (200). Each segment (1000, 1001, 1002) adds a pre-determined and consistent amount of length to the assembly according to the design of the component, simulating the desired length of hose (segment (1003) is cut to length).

Figure 107:
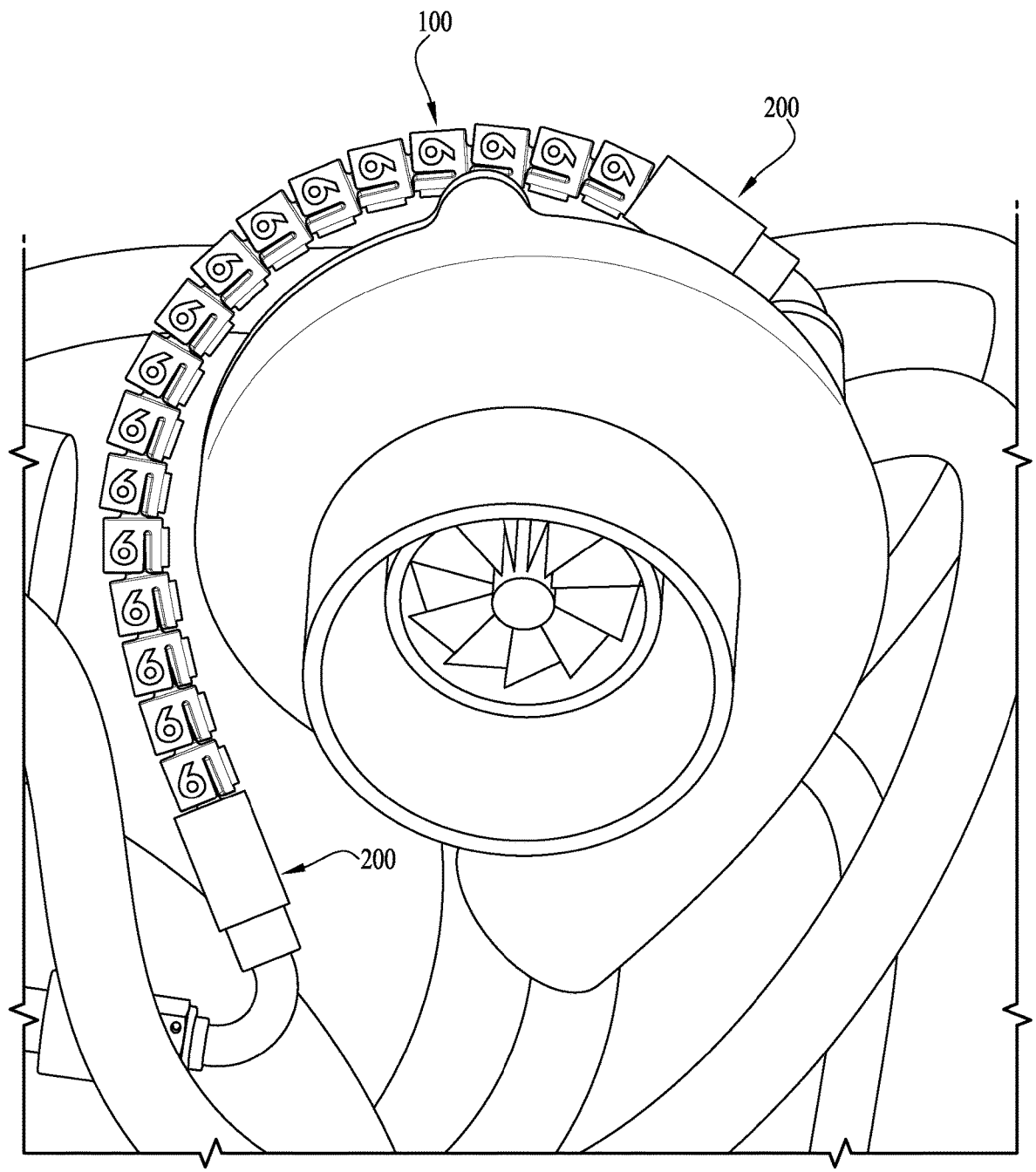
FIG. 107 is a perspective view of an embodiment of a segment assembly, depicting it in use within an exemplary application of the system of the present invention.
Figure 108:
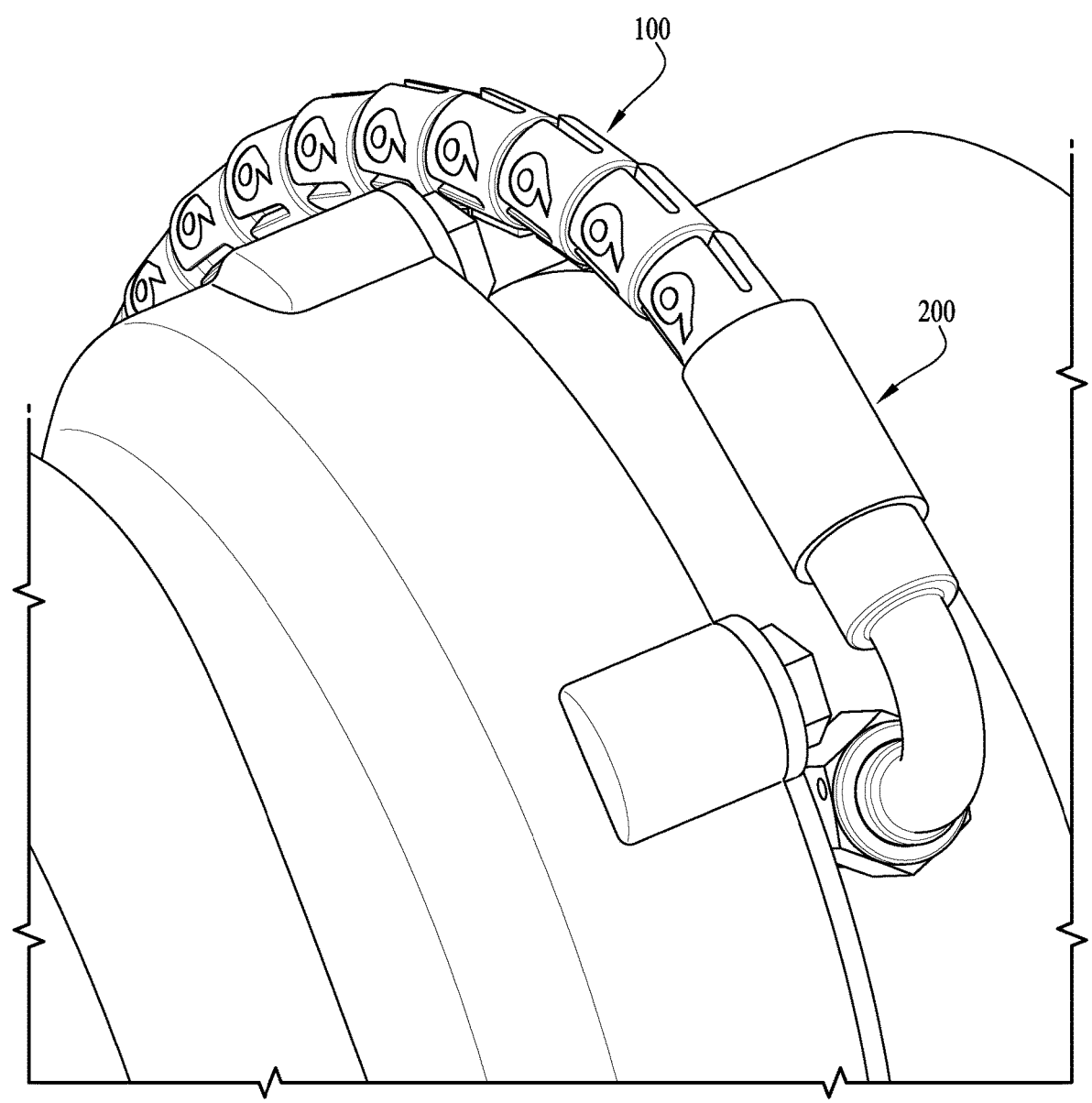
FIG. 108 is a perspective view of an embodiment of a segment assembly, depicting it in use within an exemplary application of the system of the present invention.

An exemplary application of the "Rattlesnake" assembly is depicted in FIGS. 107 and 108, showing the fitting tool (200) with a typical AN/JIC end connector type visible (207) attached to the "Rattlesnake" segments (100). The segments are connected from the female side (115), which is subsequently connected at the male side (114), and to the subsequent next segment (100) at the female side (115) and so on. The segments are held in place without twisting because of the interlocking anti-rotation geometry of the male control joint cluster (101) and female torsion control joint (107) built into the segment (100). This process is repeated indefinitely until an adequate or desired length is achieved. FIGS. 107 and 108 also show that all of the segments (100, 1001, 1002) are aligned by the integral alignment mark (106) which is aligned to the 0 degree alignment edge (203, 315) of the fitting tools (200) and the Angle Adjustment and Length Adjustment Dial (300). This alignment feature assures continuity of the angle at zero degrees along any assembled length of segments, and will line up to the zero marking (310) on the Angle Adjustment and Length Adjustment Dial (300).

Figure 112:
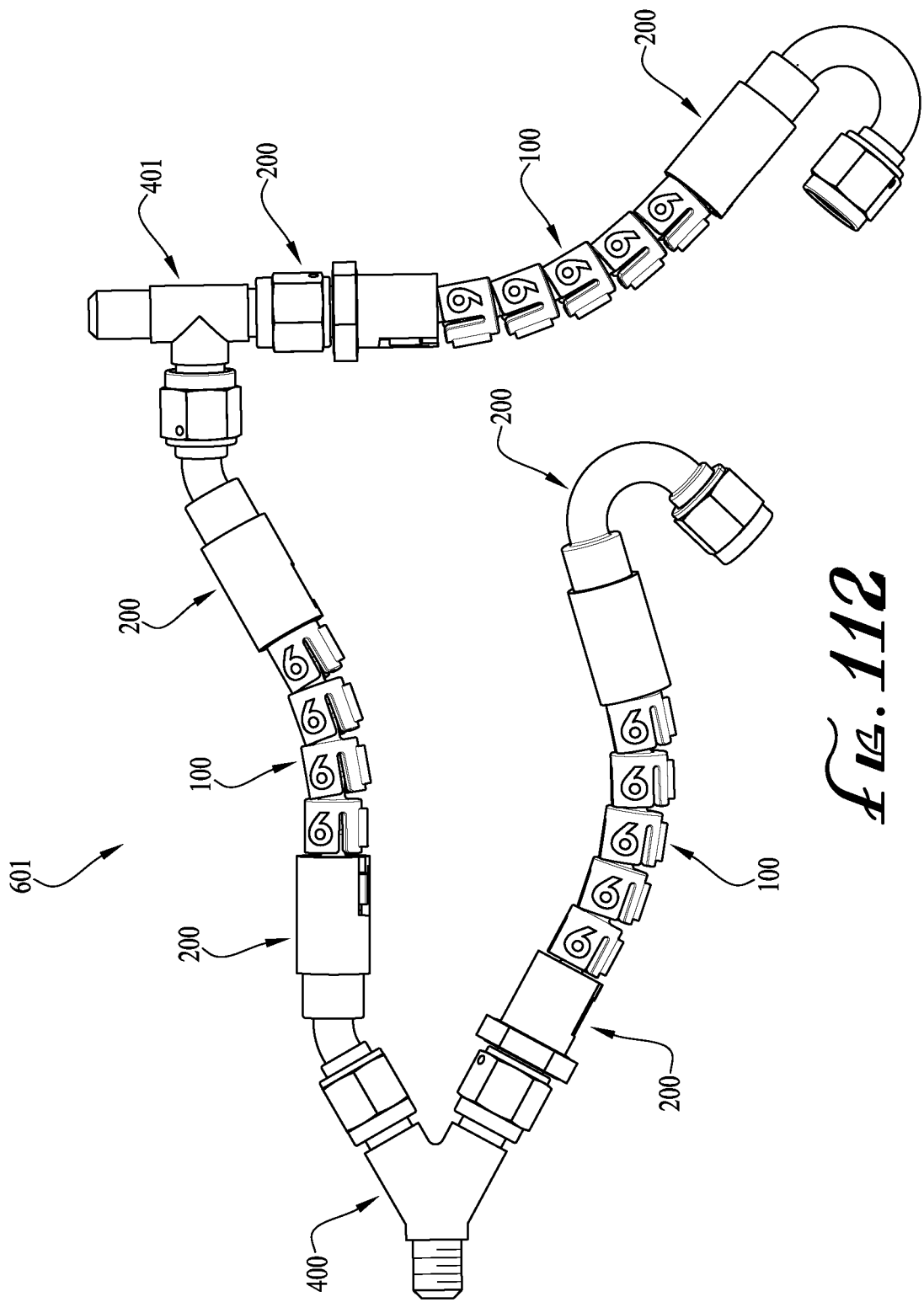
FIG. 112 is a side elevation view of an embodiment of a segment assembly incorporating a "Y" fitting, a "T" fitting, and angled fittings.

The overall result is that the user can construct an infinitely variable number of configurations and complexities of "Rattlesnake" assemblies, either independently or interconnected, examples of such are depicted in FIGS. 106 and 107, and FIG. 112. These assemblies represent a true analog of the production components, from which data can be extracted and communicated to a point of manufacture electronically, so as to replicate the assembly accurately from real components.

The system is intended to be as flexible as possible with regards to scope of materials, whilst constraining the user's specification to available sizes, types of, and performance specifications for commercially available hoses and fittings. The system can be developed to represent any type, performance or construction of automotive industrial or residential hose and is reflected in the physical dimensions and attributes of the segments (100, 1001, 1002, 1003) when used in a chain, for minimum bend radius replication, and connect to an unlimited amount of fitting tool designs to replicate commercially available or standard fitting types.

There is a level of compatibility between the shape and design of the segments (100, 1001, 1002, 1003) and the fitting tool (200) that they mate to, sharing a commonality for segment receivers (213, 313), the size of which scales common features and changes to suit the hose segment's (100, 1001, 1002, 1003) outside diameter and shape.

FIG. 109 is a table of specifications drawn from an exemplary segment assembly of the present invention which includes information provided by a user within a website or a portal. It demonstrates the relationship between components (such as those selected in FIGS. 106 through 108) and their relationship to actual production materials and quantities. FIG. 110 is a table depicting translation of the specifications from FIG. 109 into a usable output format in a work order that is used to initiate the manufacturing process.

There is no prescribed maximum length of segments (100, 1001, 1002, 1003) within any prototype assembly, and therefore the overall length in an assembly will vary from application to application and will also be determined by the manufacturing ability of the production facility to replicate the design in an actual hose and fitting assembly as intended.

The fitting tools (200) shown in the various figures can be modified into an infinitely variable and expansive range of connection types following industry standards, by customization of the fitting geometry analogue body (214), and attaching it to the established segment receiver body (213) for the desired size in order to offer common and valuable interface configurations. The examples shown are, accordingly, to be regarded in an illustrative rather than a restrictive sense. It will however, be evident that additions, subtractions, deletions, and other modifications and changes may be made thereunto without departing from the broader spirit and scope of the inventions as set forth in the claims.

FIGS. 111 and 112 shows several single line assemblies (two-line (600) and three-line (601)), which are joined by commercially-available adaptors and connectors (400, 401) in order to design complex assembly items with multiple legs or routings, utilizing a range of different fitting tools (200) and segment (100, 1001, 1002, 1003) types and sizes. The assembly may incorporate T fittings, Y fittings, valves, filters, adaptors, reducers, and/or various common or standard inline accessories.

Figure 113:
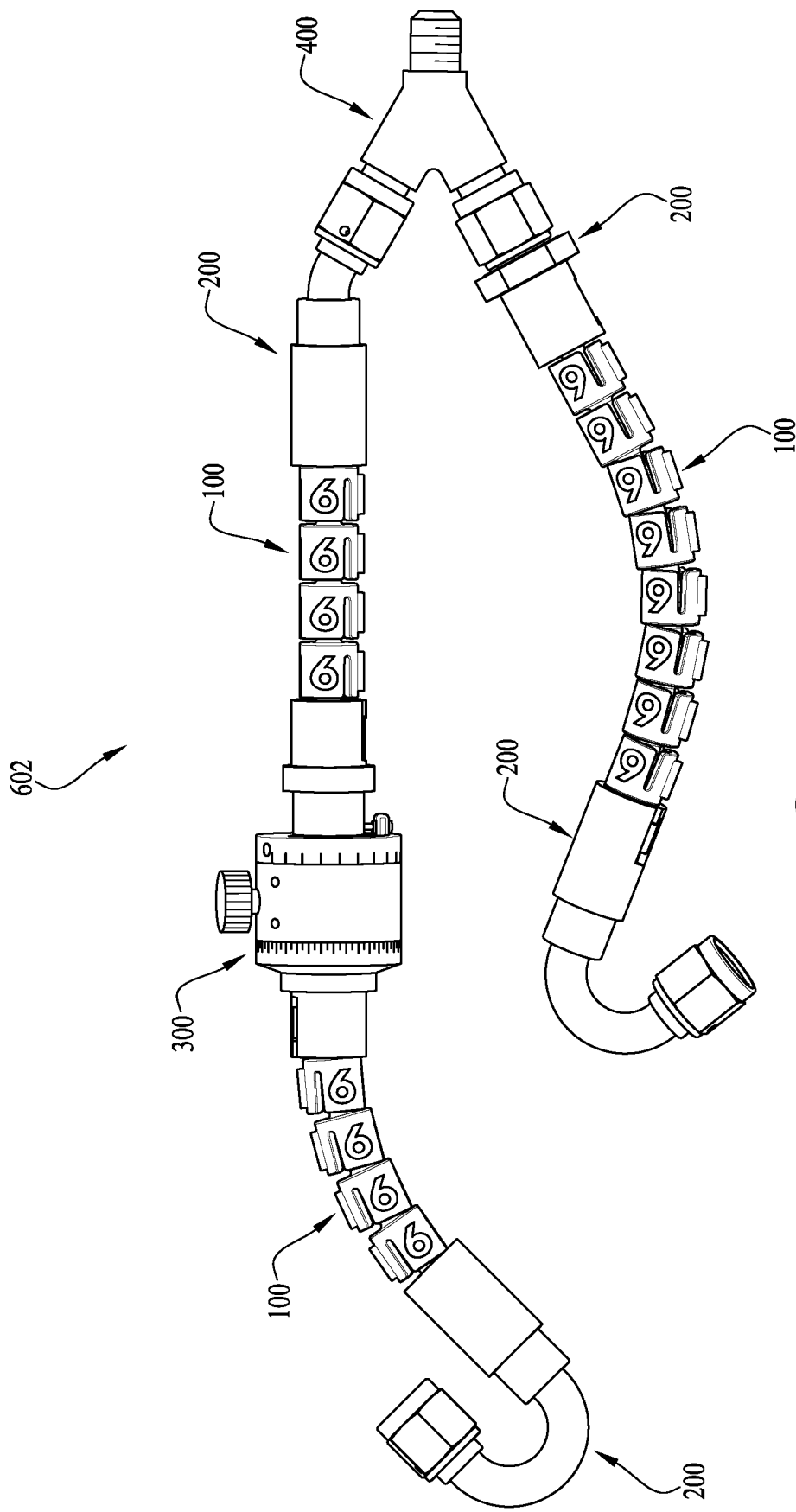
FIG. 113 is a side elevation view of an embodiment of a segment assembly, depicting complex, multi-line assembly incorporating a Angle Adjustment and Length Adjustment Dial and various embodiments of connectors.

The flexibility and features of an embodiment of the "Rattlesnake" system are shown in FIG. 113 where an assembled prototype (602) comprises two fitting tools (200), a quantity of segments (100), and an Angle Adjustment and Length Adjustment Dial (300), set to a desired angle, providing the parameters required to communicate the specification of the design. For example, referring to FIG. 113, from the assembly depicting a one-line assembly with orientation and a one-line assembly without orientation, the following data is communicated: segment (100) type, size identification and quantity which determines the production hose size, type and length desired; fitting tools (200) selected indicate the desired production fitting types; and Angle Adjustment and Length Adjustment Dial (300) angle and length readout (301, 302) provides the relative angle between the two fitting tools (200).

FIG. 114 is a table of specifications drawn from the exemplary assembly (602) shown in FIG. 113 based on the assembled "Rattlesnake" assembly. These specifications comprise the key data that allows for electronic translation of the specification into a production work order, production drawing and bill of materials through the use of a database, configuration software (configure, price, quote calculation) and programming of a website or application (or app), creating a replicable and repeatable assembly specification. The specification can be uploaded electronically to the system through an application (app), via photography and intelligent camera scanning, electronic tag or directly to a website.

This data is used for creation of a work order, instructions or machine specification for the following purposes: picking required components, picking and cutting required length of hose, picking assembly fixtures, picking any accessories.

The work order preferably contains a 1D or 2D barcode, or is RFID enhanced in order to capture the complete assembly specification of the part throughout the process. The raw hose length also receives a 1D or 2D barcode, or an RFID label so that the process is error-proofed and the assembly machines and equipment can be programmed according to the requirements of the assembly.

In exemplary embodiments, data from the assembly, including material and component types, length and orientation can be detected and translated by wireless means, including, Bluetooth, Near Field Communication (NFC), Radio Frequency Identification (RFID), 2D Barcodes (QR codes) or electrical conductivity where such features can be molded into or otherwise included in the flexible or fitting parts.

Figure 115:
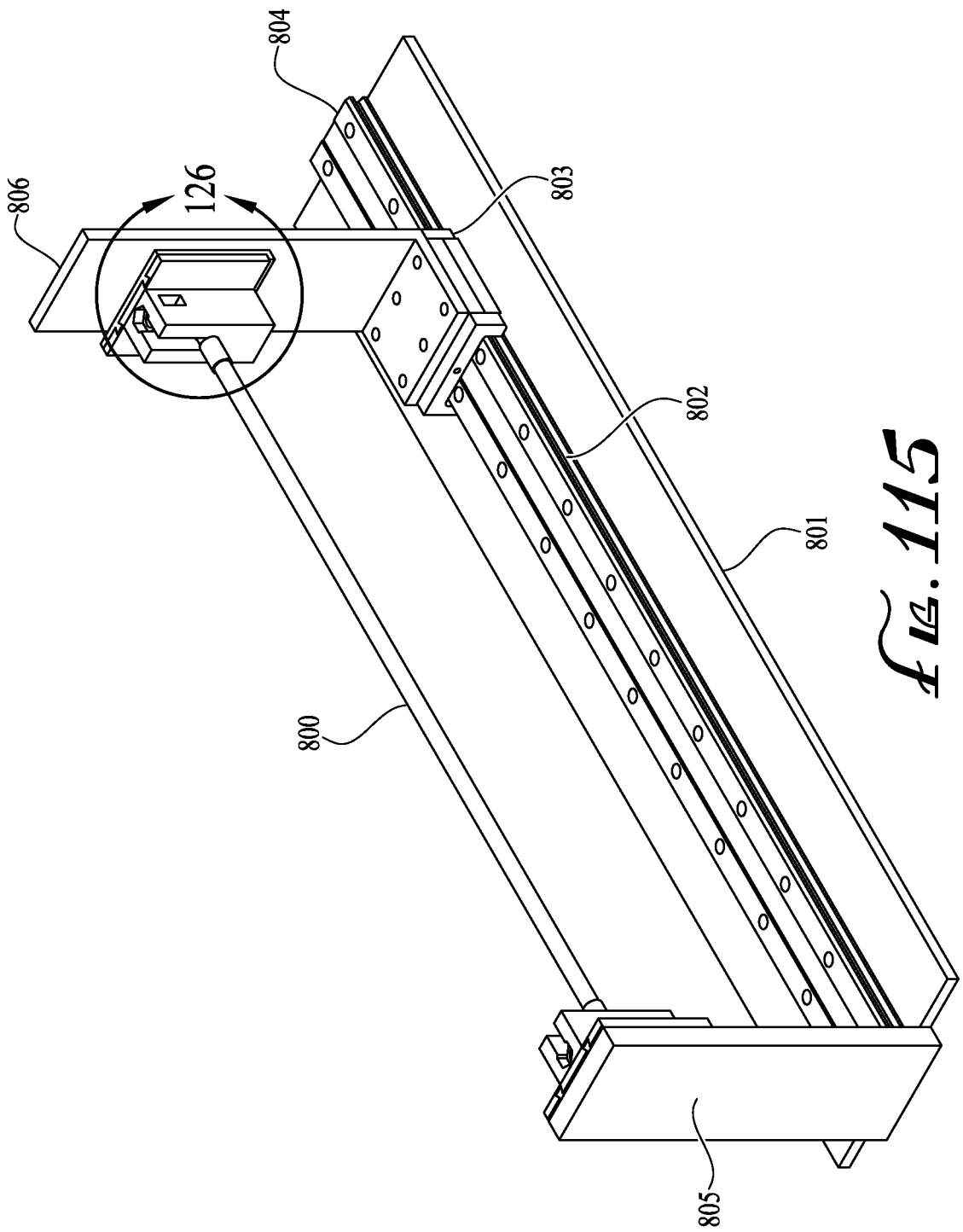
FIG. 115 is a perspective view of an embodiment of an alignment machine and its components, along with a reference part's requisite materials which replicate the customer's design and specifications.
Figure 116:
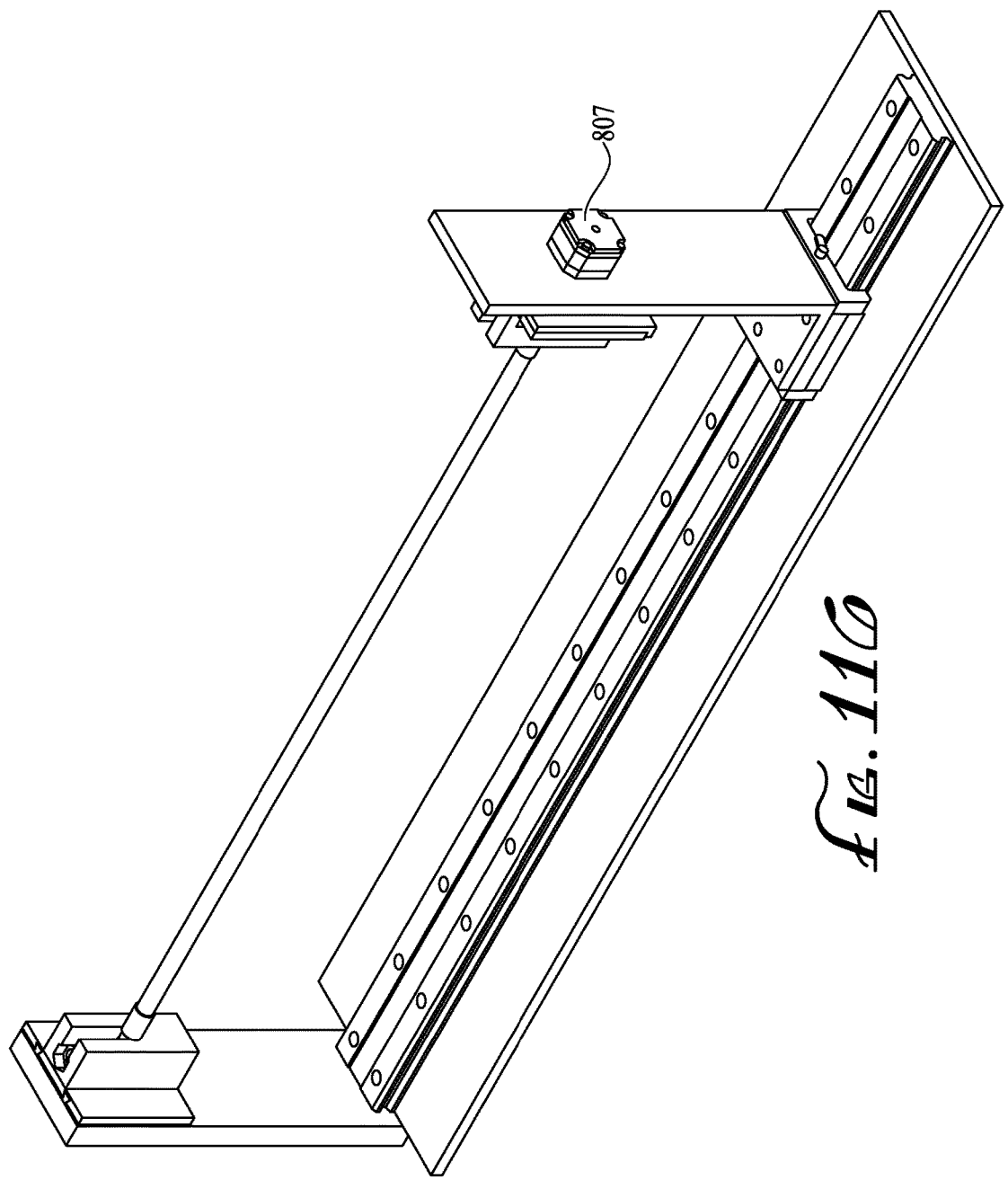
FIG. 116 is a perspective view of an embodiment of an alignment machine and its components, along with a reference part's requisite materials which replicate the customer's design and specifications.
Figure 117:
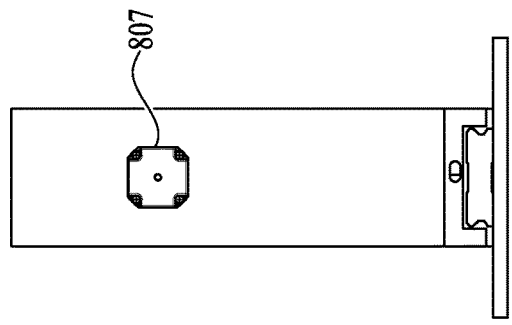
FIG. 117 is a side elevation view of an embodiment of an alignment machine which is used in replicating the customer's design and specifications.

FIGS. 115 and 116 depict an embodiment of an alignment machine and its components, along with a reference part's requisite materials which replicate the customer's design and specifications. This machine is used to translate the data from the work order into assembly instructions and to run automated quality checks on the part and components. As shown in FIGS. 116 through 120, the unit generally consists of the following key parts and components; (800) loose part assembly, (801) base plate, (802) linear bearing rail, (803) Linear bearing carrier, (804) linear motor, (805) fixed end, (806) moving end, (807) stepper motor and controls, (808) stepper motor mount, (809) angle plate, (810) locking keyway, (811) backstop, (812) fixture block, (813) positive locators in fixture block for specific type of fitting, (814) example fitting, (814a) datum point, (815) collar, (816) hose, (817) orifice to use read 2D barcode on fittings, (818) RFID tag on fixture, (819) RFID reader on angle plate or fixed end, (820) RFID Hose Label.

Figure 120:
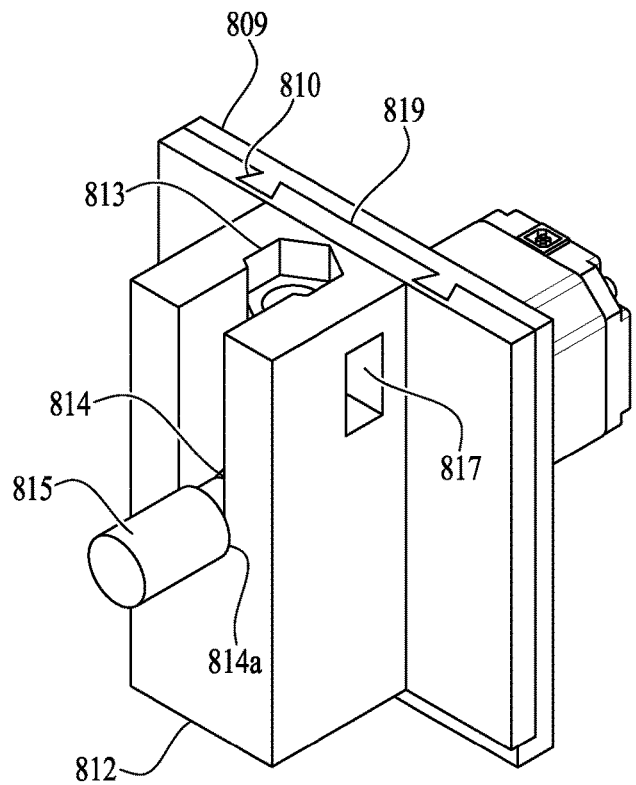
Figure 121:
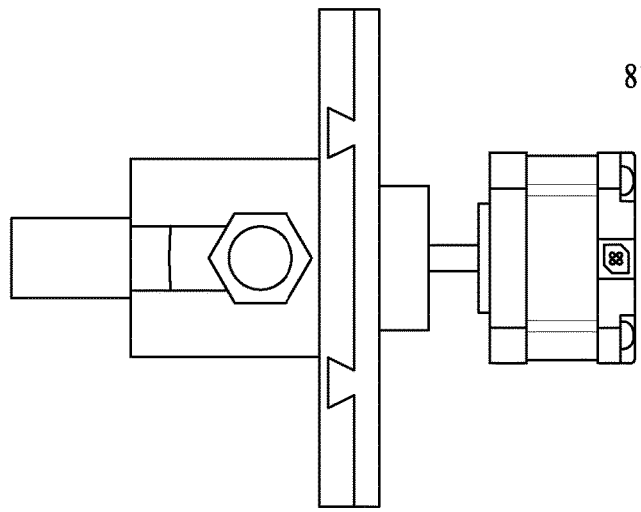
Figure 122:
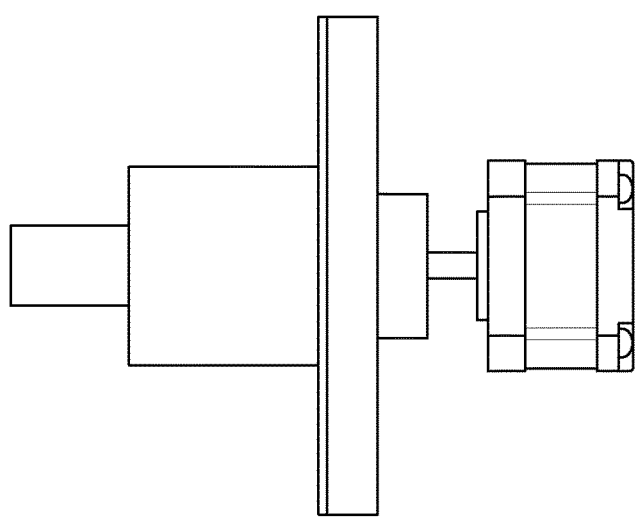
Figure 123:
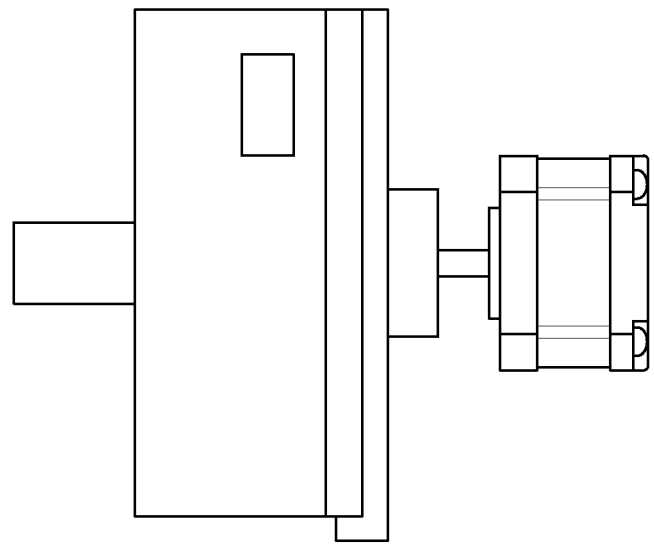
Figure 124:
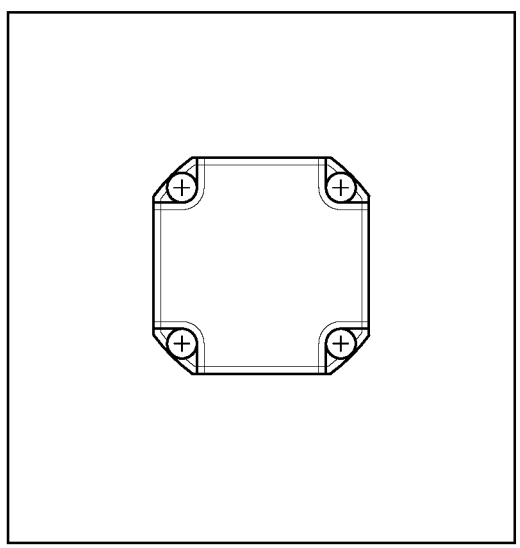
Figure 125:
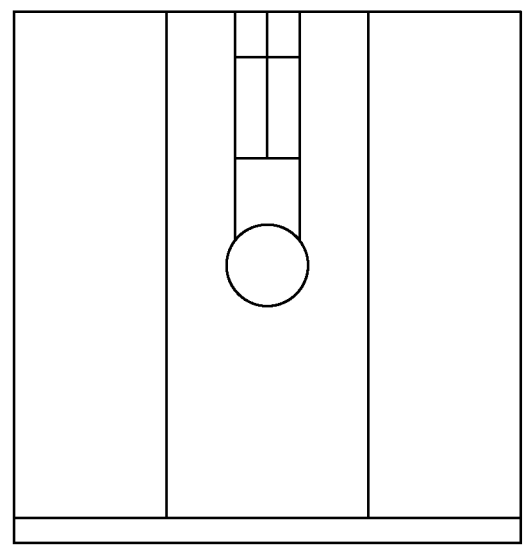

FIGS. 118 through 120 show the components (800) to be assembled held within the machine at a nominal angle, comprised of the two fittings (814) at the fixed end (805) and the matching fixture (812), the hose length with label, fitting at the moving end (806) and matching fixture block, and two identical collars.

FIGS. 118 through 120 also show the pre-assembled part aligned into the alignment machine, which has the ability to read the data on the hose label and adjust to the correct length and orientation per the customer's specification. The aligned loose assembly (800) is taken to the crimping stage, which may or may not be integrated into the alignment machine, and is crimped securely to the customer's specification.

FIGS. 120 through 125 depict detailed views of the adjustable angle end of the machine that controls the critical angle of the assembly.

Figure 126:
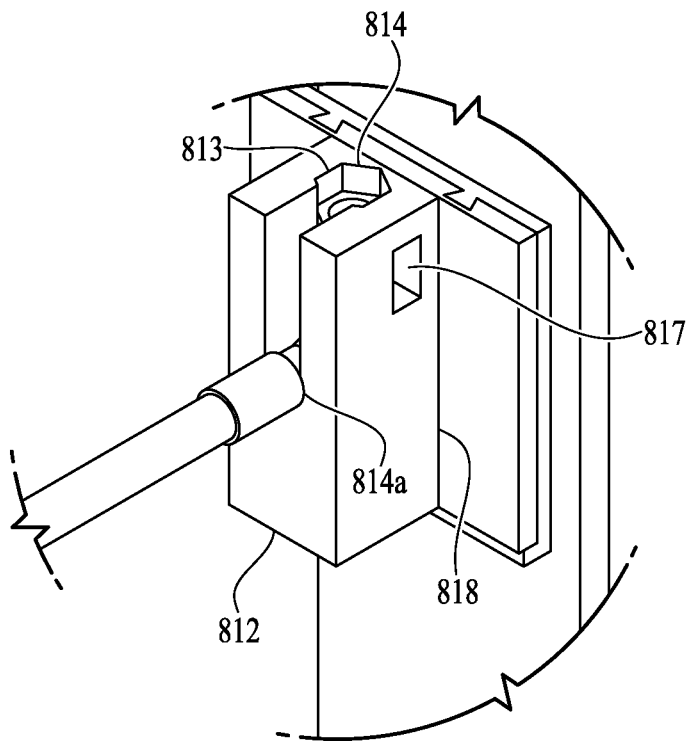
Figure 127:
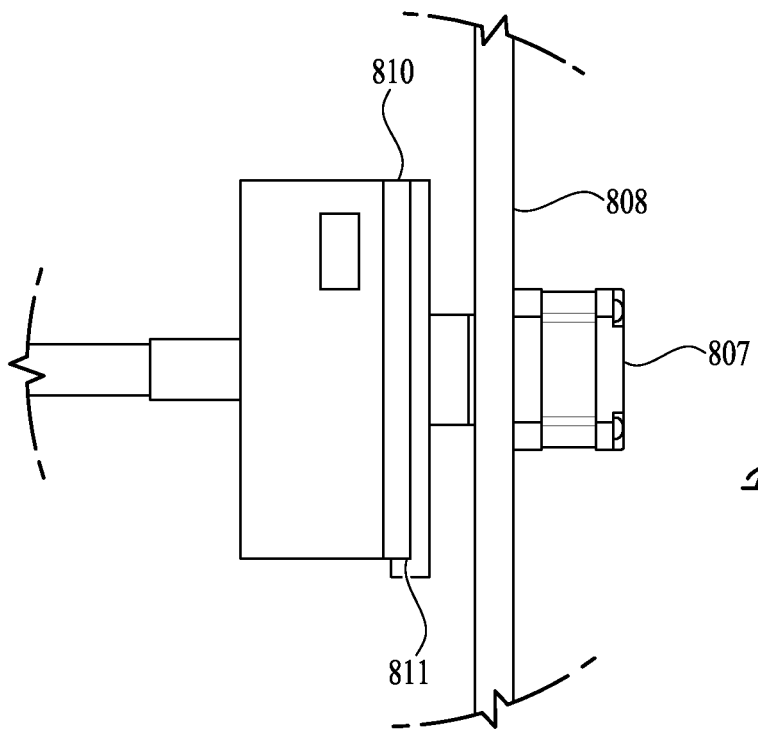

As shown in FIGS. 126 and 127, the machine has standard adaptors so that machined, rapid-prototyped or molded fixture blocks (812) can be fitted to the machine so that regardless of size, type or design of fitting, all the common geometry, like the hose tail of a fitting, represented by the segment receiver (213) on the fitting tools (200). These blocks (812) can be further identified and error-proofed by adapting RFID identification (820) onto them so that the machine can verify that the right blocks are being used for assembly. In an exemplary embodiment, the system has three parts: the "Rattlesnake" tool prototype to the customer specification, electronic method for specification communication (app or website/portal), and the production equipment (800-820) that reads and translates the specification into the production component parts.

The specification and figures are, accordingly, to be regarded in an illustrative rather than a restrictive sense. It will, however, be evident that additions, subtractions, deletions, and other modifications and changes may be made thereunto without departing from the broader spirit and scope of the inventions as set forth in the claims.

What is claimed are:

1. A fluid handling and prototyping system, comprising:
   an adjustable length of flexible or jointed material, with outside diameter and minimum bend radius characteristics of a particular type of hose, tube or flexible conduit;
   wherein a fitting, the fitting representing a physical analog of an actual production fitting, is placed at one end of the adjustable length of flexible or jointed material;
   wherein the adjustable length of flexible or jointed material and fitting, form a prototype assembly;
   wherein the prototype assembly represents an analog of actual components and from which data can be extracted and communicated as specifications for the manufacture of actual materials or assemblies.

2. The system of claim 1 wherein the adjustable length of flexible or jointed material comprises segments forming a series of segments.

3. The system of claim 1 wherein the adjustable length of flexible or jointed material comprises an extruded or molded flexible or elastomeric material.

4. The system of claim 2 wherein the segments are molded from an elastomeric material that creates an approximately similar stiffness and flexibility that replicates a minimum bend radius of a particular hose type when assembled in a chain.

5. The system of claim 2 wherein the segments are molded from a composite material that creates an approximately similar stiffness and flexibility that replicates a minimum bend radius of a particular hose type when assembled in a chain.

6. The system of claim 2 wherein the segments include features integrated into the segments that allow for a controlled degree of rotation, but preventing twisting along their connection axis.

7. The system of claim 2 further comprising an adjustment dial along the axis of or at the end of the adjustable length of flexible or jointed material, and wherein the adjustment dial facilitates the adjustment of an angle of orientation of the adjustable length of flexible or jointed material and preserves the relative angle of the fitting.

8. The system of claim 7 wherein data is built into the fitting, the adjustment dial, and the segments, that are relative to data of the production fitting, such that when the fitting, the adjustment dial, and the segments are assembled, repeatable and communicable data is derived from the prototype assembly.

9. The system of claim 7 wherein the prototype assembly incorporates angled fittings, T fittings, Y fittings, valves, filters, adaptors, reducers, and/or inline accessories.

10. The system of claim 8 wherein the prototype assembly further comprises a plurality of fittings, and wherein the prototype assembly replicates the design, length, routing and orientation permissible by the inherent specification and limitations of actual production components which the prototype assembly is designed to represent, forming an analogue between two or more fixed points in a desired application.

11. The system of claim 8 wherein the data from the prototype assembly includes material and component types, length and orientation, dimensions, which are detected and translated into an electronic format via photography or other electronic means with a web connected or smart phone device that detects, scans or electronically captures the data.

12. The system of claim 8 wherein the data is detected and translated into electronic format by wireless means, including, Bluetooth, Near Field Communication (NFC), Radio Frequency Identification (RFID), 2D Barcodes (QR codes) or electrical conductivity.

13. The system of claim 8 wherein the data is entered into an interface, uploaded into an ordering system, translated into a work order and into a bill of materials that initiates the manufacturing process.

14. A method of manufacturing a hose or conduit with a machine or device, wherein such method comprises the steps of:
accommodating a defined length of hose or conduit within the machine or device, wherein the machine or device has a universal assembly fixture;
identifying the components and materials for manufacturing a hose or conduit based on the specifications provided by a customer;
obtaining a plurality of hose or conduit components for assembly into the hose or conduit;
advancing the components and the hose or conduit to an assembly cell;
scanning or reading an identification tag on the hose or conduit to identify assembly instructions;
adjusting the universal assembly fixture to the length and angles based on the assembly instructions;
attaching fixture blocks to the universal assembly fixture based on the assembly instructions;
orienting the hose or conduit and the components into the universal assembly fixture;
assembling the hose or conduit based on the specifications provided by a customer;
checking the hose or conduit in the universal assembly fixture and verifying that it meets the specifications.

15. The method of claim 14 further comprising the step of advancing the hose or conduit to a pressure test and cleaning station and testing the hose or conduit.

16. The method of claim 14 further comprising the step of advancing to the hose or conduit for shipping and dispatch.

17. A prototyping system, comprising:
a fitting tool;
a first segment that is connected to the fitting tool;
a second segment that is connected to the first segment, with the first segment and the second segment form a part of a series of segments; and,
wherein the series of segments form a prototyping tool which is designed to simulate an actual hose material with a particular diameter, minimum bend radius, size, construction and type.

18. The prototyping system of claim 17 further comprising an angle adjustment and length adjustment dial that is connected to the series of segments, wherein the angle adjustment and length adjustment dial facilitates the adjustment of an angle of orientation of the series of segments.

19. The prototyping system of claim 18 wherein the angle adjustment and length adjustment dial facilitates the adjustment of length of the series of segments.

20. The prototyping system of claim 18, wherein a user identifies the following prototyping information: number of segments used in the prototyping tool, angle of orientation, type of fixed orientation fitting used, and the user's desired hose or tubing application; and wherein the prototyping information is entered into an interface; wherein a work order is created by a third party based on the information provided by the user; wherein the work order is used to create an actual hose.

21. The prototyping system of claim 20 wherein the interface is a website interface.

22. The prototyping system of claim 20 wherein the interface is a mobile application interface.

* * * * *